United States Patent
Young et al.

(10) Patent No.: US 12,167,606 B2
(45) Date of Patent: Dec. 10, 2024

(54) MEMORY DEVICE AND METHOD OF FORMING THEREOF

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Yu-Ming Lin, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 533 days.

(21) Appl. No.: 17/459,107

(22) Filed: Aug. 27, 2021

(65) Prior Publication Data

US 2023/0063038 A1   Mar. 2, 2023

(51) Int. Cl.
| | |
|---|---|
| *H10B 51/20* | (2023.01) |
| *H01L 29/786* | (2006.01) |
| *H10B 51/10* | (2023.01) |
| *H10B 53/20* | (2023.01) |

(52) U.S. Cl.
CPC ......... *H10B 51/20* (2023.02); *H01L 29/7869* (2013.01); *H10B 51/10* (2023.02); *H10B 53/20* (2023.02)

(58) Field of Classification Search
CPC ........ H10B 51/20; H10B 51/10; H10B 51/00; H10B 51/30; H10B 41/20; H10B 43/20; H01L 29/7869
See application file for complete search history.

(56) References Cited

U.S. PATENT DOCUMENTS

| | | |
|---|---|---|
| 2002/0028541 A1 | 3/2002 | Lee et al. |
| 2010/0140679 A1 | 6/2010 | Walker |
| 2015/0179577 A1 | 6/2015 | Tobitsuka et al. |
| 2020/0075609 A1* | 3/2020 | Morris ............... G11C 11/2275 |
| 2020/0075631 A1 | 3/2020 | Dong et al. |
| 2020/0185411 A1 | 6/2020 | Herner et al. |
| 2020/0303558 A1* | 9/2020 | Fujii ....................... H10B 43/27 |
| 2020/0365618 A1* | 11/2020 | Zhang ................... H10B 51/20 |
| 2021/0020659 A1* | 1/2021 | Chen ..................... G11C 11/223 |
| 2021/0175253 A1* | 6/2021 | Han ....................... H10B 51/10 |

* cited by examiner

*Primary Examiner* — Ratisha Mehta
*Assistant Examiner* — Brad A Knudson
(74) *Attorney, Agent, or Firm* — Slater Matsil, LLP

(57) ABSTRACT

A memory cell includes a thin film transistor over a semiconductor substrate. The thin film transistor includes a memory film contacting a word line, an oxide semiconductor (OS) layer contacting a source line and a bit line, and a conductive feature interposed between the memory film and the OS layer. The memory film is disposed between the OS layer and the word line. A dielectric material covers sidewalls of the source line, the memory film, and the OS layer.

20 Claims, 55 Drawing Sheets

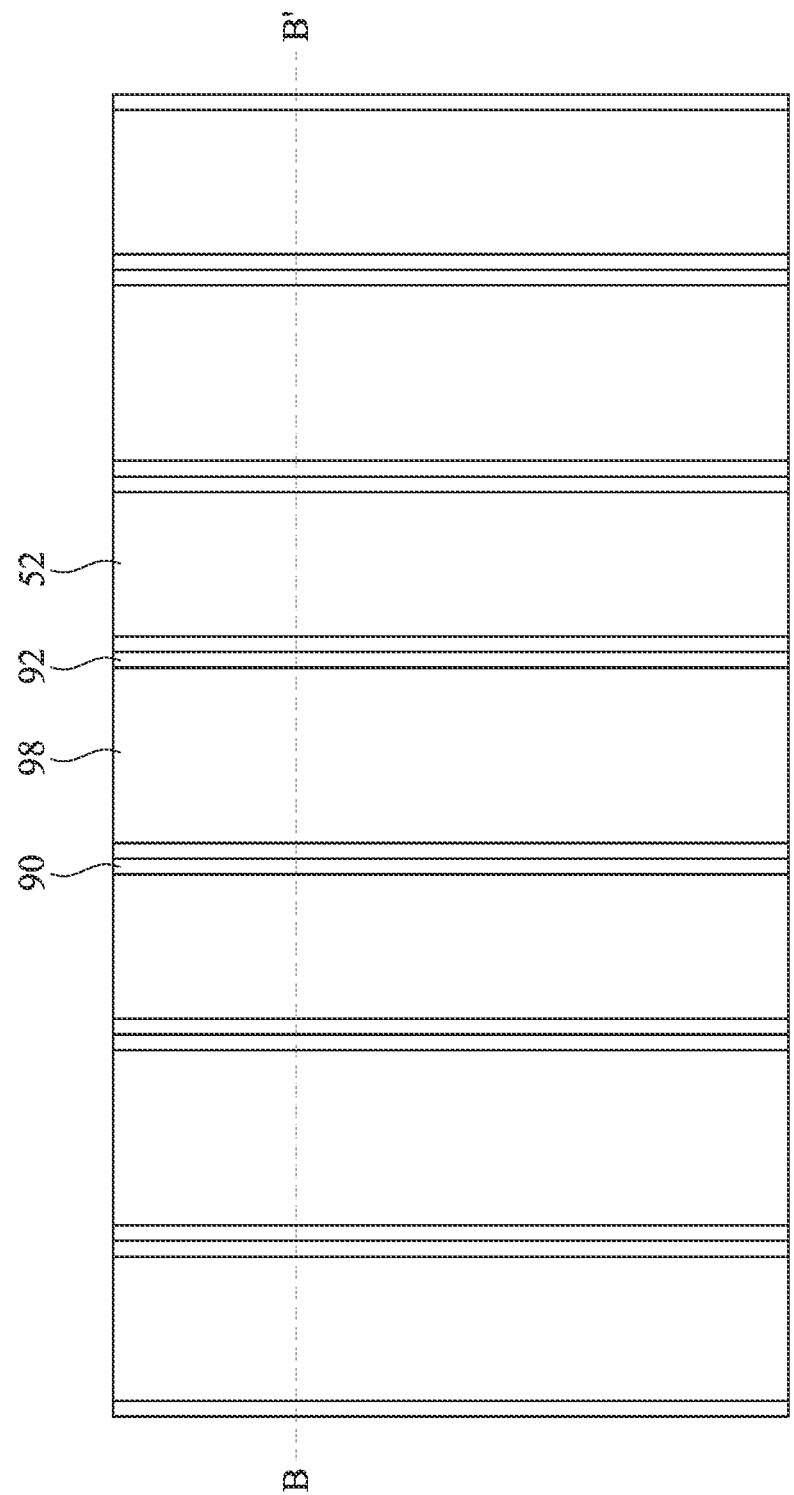

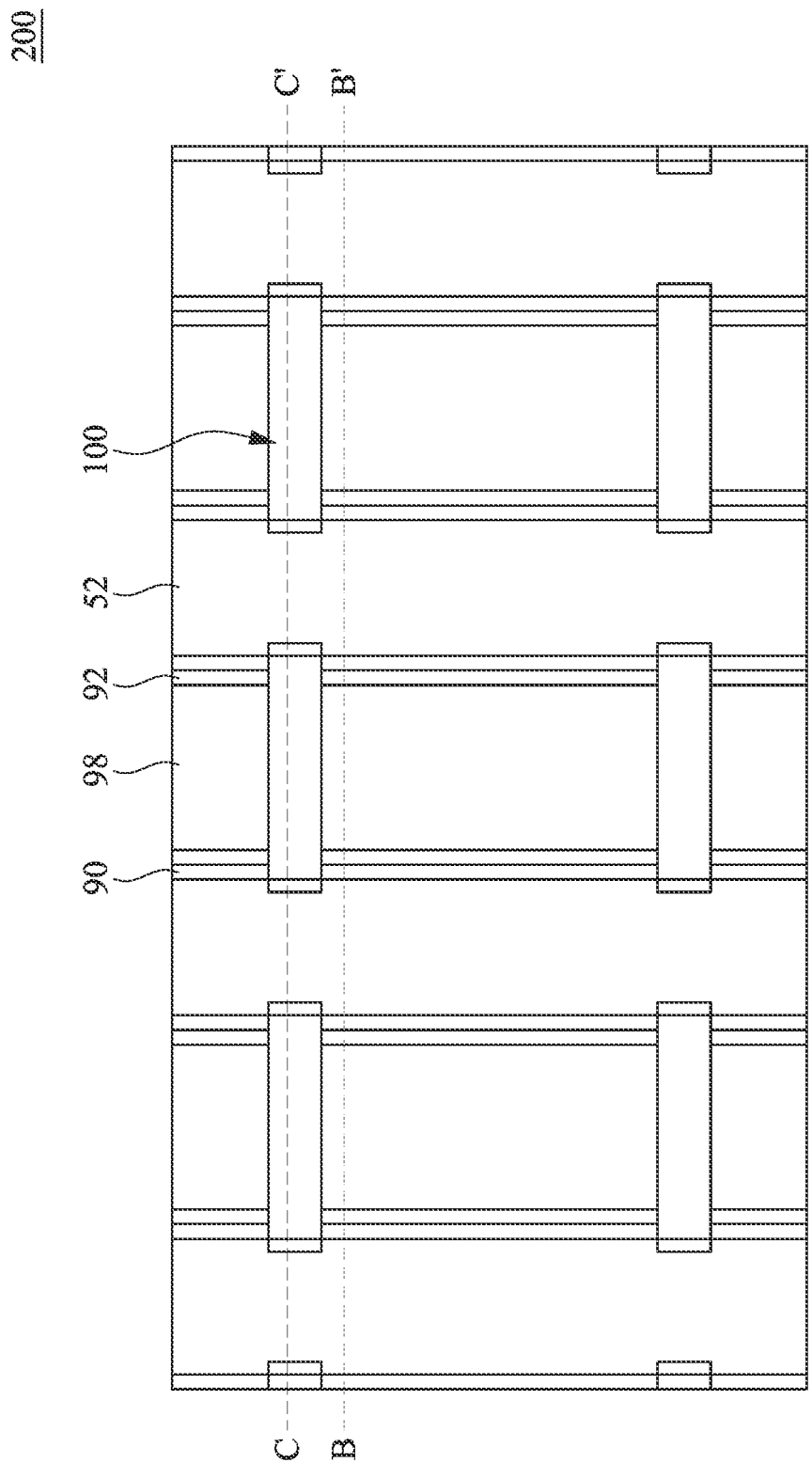

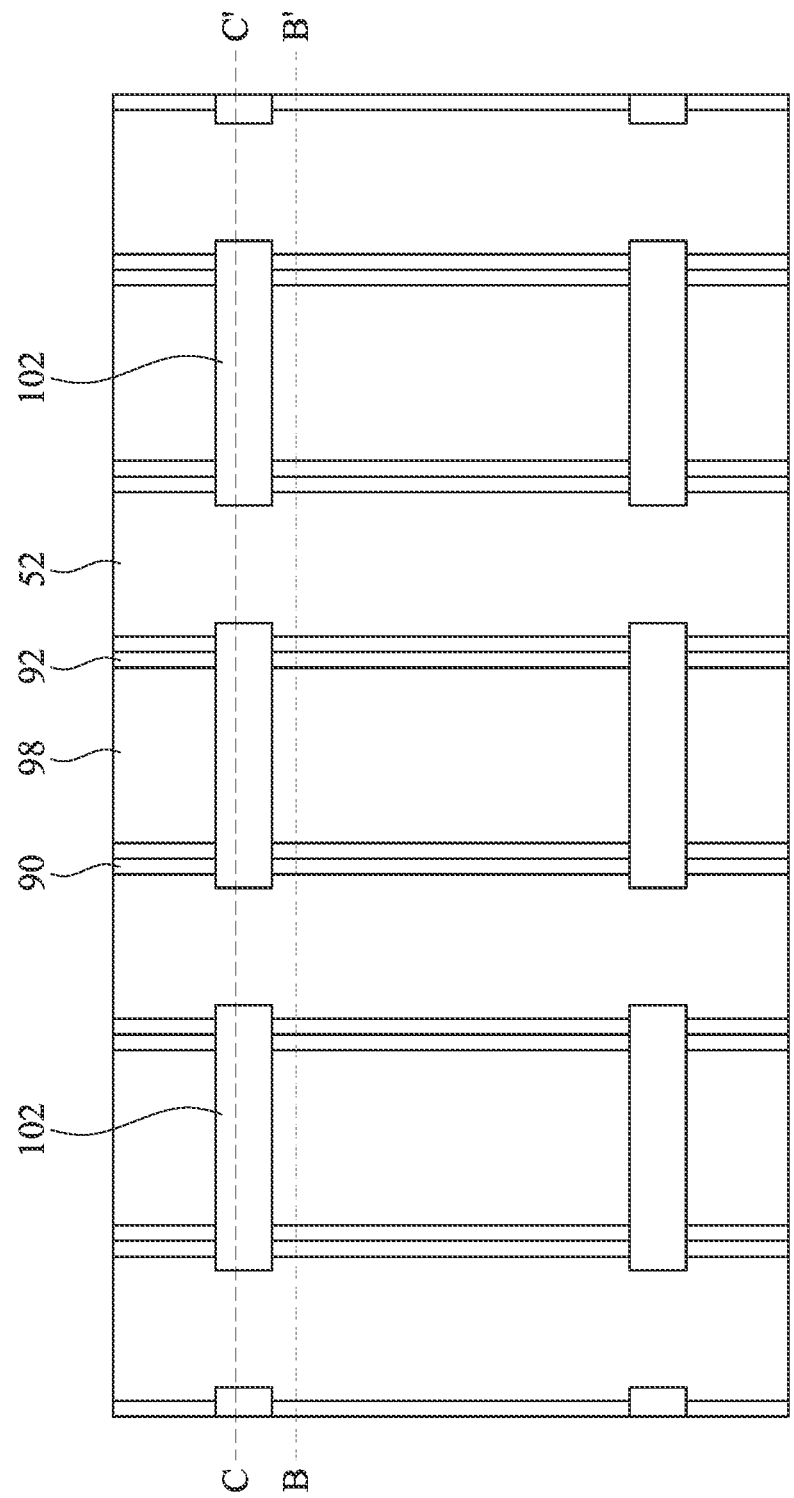

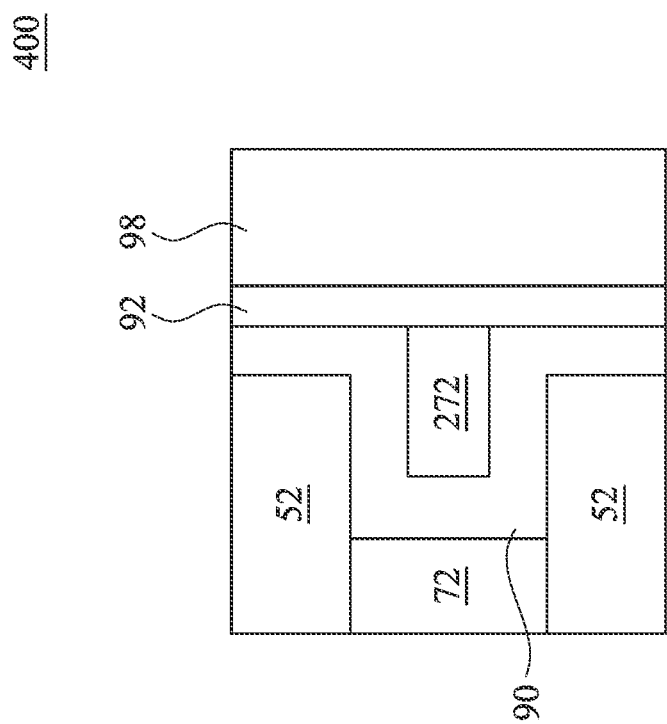

MEMORY DEVICE AND METHOD OF FORMING THEREOF

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 3C, 4, 5, 6, 7, 8, 9, 10, 11A, 11B, 12, 13, 14, 15, 16, 17A, 17B, 17C, 18A, 18B, 19A, 19B, 19C, 19D, 20, 21A, 21B, 21C, 21D, 21E, 21F, 21G, 21H, 22, 23, 24, 25, 26A, 26B, 27A, 27B, 27C, 28A, 28B, 28C, 29A, 29B, 29C, 30A, 30B, 30C, 30D, 30E, 30F, 30G, 30H, 30I, 31A, 31B, 31C, and 31D illustrate varying views of manufacturing a memory array in accordance with some embodiments.

DETAILED DESCRIPTION

Figure 1A:
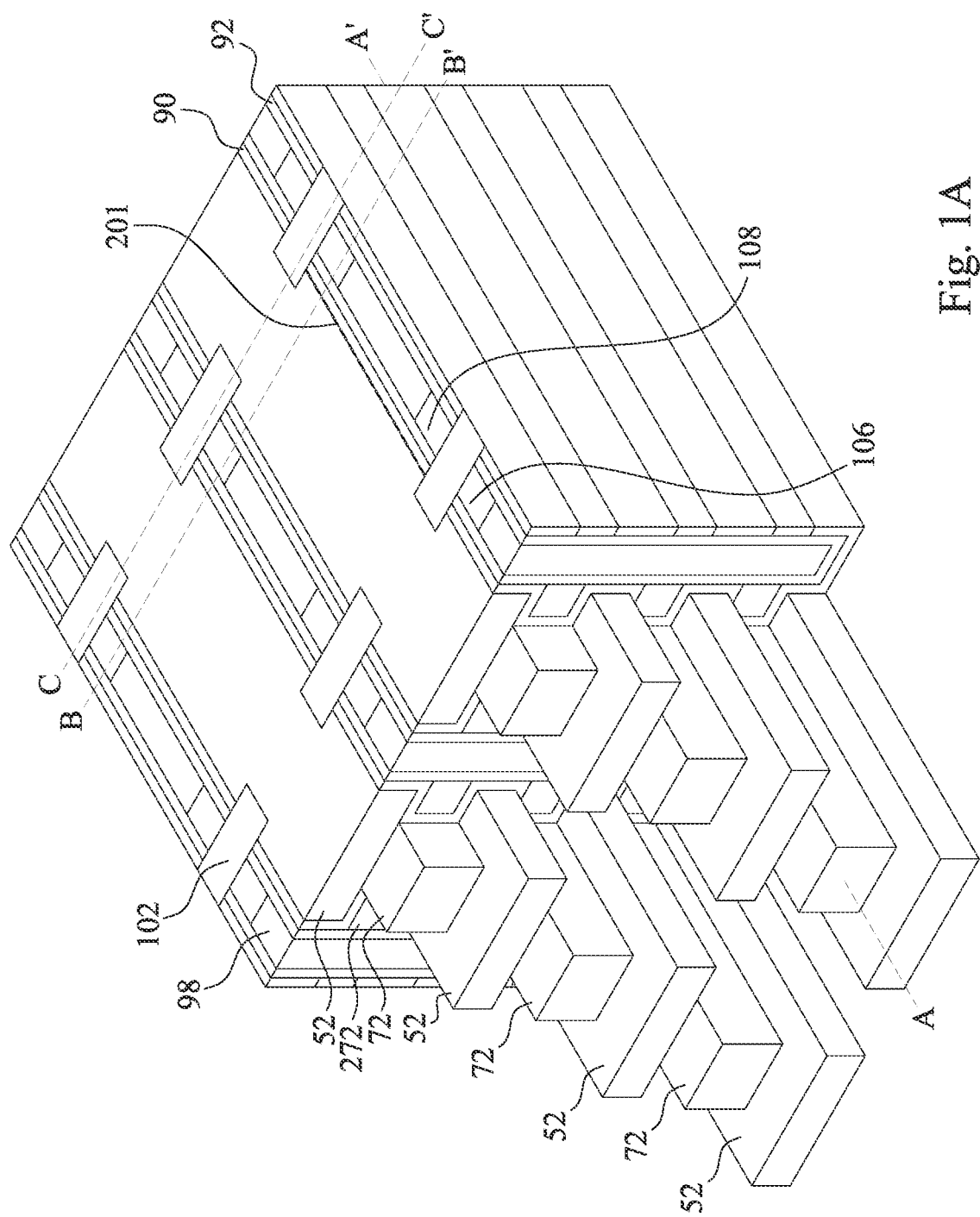
FIGS. 1A and 1B, and 1C illustrate perspective views and a circuit diagram of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes a memory film (e.g., as a gate dielectric), an oxide semiconductor (OS) channel region, and a conductive feature disposed between the memory film and the OS channel region.

Figure 1B:
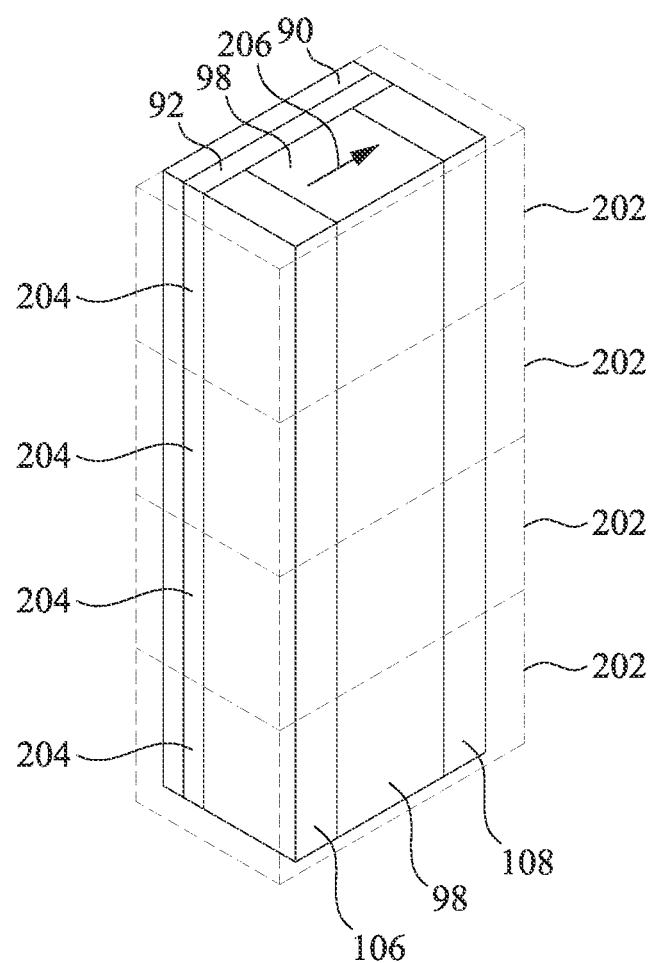
Figure 1C:
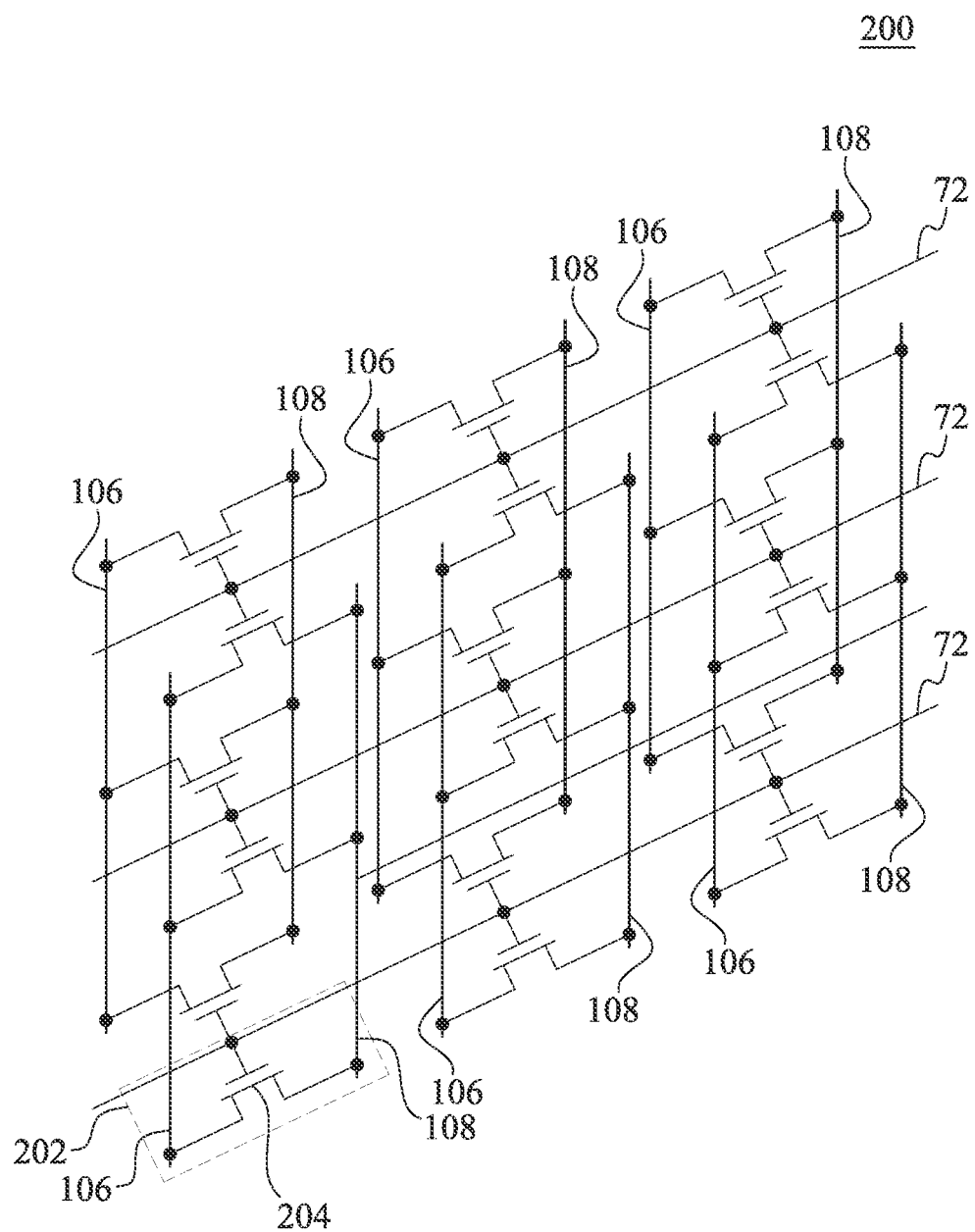

FIGS. 1A, 1B, and 1C illustrate examples of a memory array according to some embodiments. FIG. 1A illustrates an example of a portion of the memory array 200 in a three-dimensional view, FIG. 1B illustrates a detailed three-dimensional view of a region 201 illustrated in FIG. 1A, and FIG. 1C illustrates a circuit diagram of the memory array 200. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. Each memory cell 202 may include a thin film transistor (TFT) 204 with an insulating, memory film 90 as a gate dielectric. In some embodiments, a gate of each TFT 204 is electrically coupled to a respective word line (e.g., conductive line 72), a first source/drain region of each TFT 204 is electrically coupled to a respective bit line (e.g., conductive line 106), and a second source/drain region of each TFT 204 is electrically coupled to a respective source line (e.g., conductive line 108), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 206).

A memory film 90 and conductive features 272 are disposed between the conductive lines 72 and the OS layer 92, and the memory film 90 may provide gate dielectrics for the TFTs 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FE-RAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

The conductive features 272 are disposed between and electrically connect the memory film 90 and the OS layer 92. The conductive features 272 comprise a conductive material, such as e.g. a same material as the conductive lines 72. In embodiments where the memory film 90 comprises a ferroelectric material, the conductive features 272 may be useful in forming Metal-Ferro-Metal (MFM) capacitors in conjunction with the conductive lines 72 and the memory film 90. The interface between the memory film 90 and the conductive features 272 may have better quality due to containing fewer defects than an interface between a ferroelectric memory film and a semiconductor material such as an OS layer similar to the OS layer 92. The reduction of defects in the interface between the memory film 90 and the conductive features 272 may improve endurance of the TFTs 204. The conductive features 272 may provide better charge screening for the memory film 90, which may reduce the depolarization field and increase retention time of the TFTs 204.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding TFT 204 varies, and a digital value (e.g., 0 or 1) can be stored. For example, when a region of the memory film 90 has a first electrical polarization direction, the corresponding TFT 204 may have a relatively low threshold voltage, and when the region of the memory film 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the memory film 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section A-A' is along a longitudinal axis of conductive lines 72 and in a direction, for example, parallel to the direction of current flow of the TFTs 204. Cross-section B-B' is perpendicular to cross-section A-A' and is parallel to a longitudinal axis of the conductive lines 72. Cross-section B-B' extends through the conductive lines 106. Cross-section C-C' is parallel to cross-section B-B' and extends through the dielectric material 102. Subsequent figures refer to these reference cross-sections for clarity.

Figure 2:
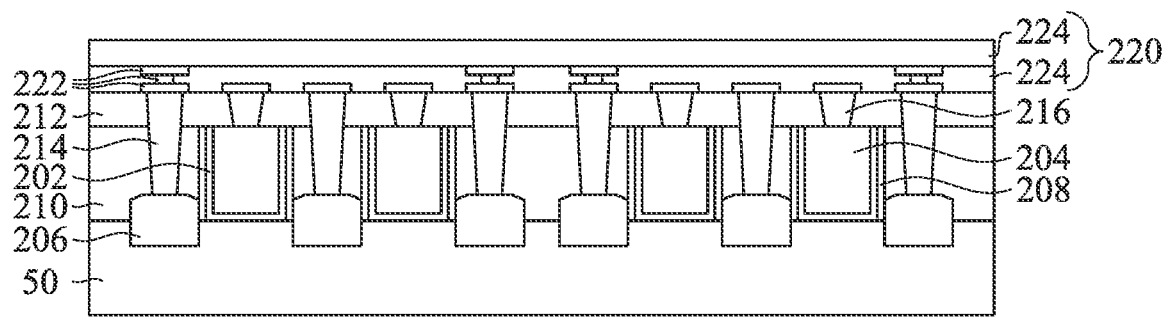

FIGS. 2 through 31D illustrate three-dimensional and cross-sectional views of intermediate steps of manufacturing the memory array of FIGS. 1A through 1C according to some embodiments. In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 202 over top surfaces of the substrate 50 and gate electrodes 204 over the gate dielectric layers 202. Source/drain regions 206 are disposed in the substrate 50 on opposite sides of the gate dielectric layers 202 and the gate electrodes 204. Gate spacers 208 are formed along sidewalls of the gate dielectric layers 202 and separate the source/drain regions 206 from the gate electrodes 204 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 206, the gate dielectric layers 202, and the gate electrodes 204 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 204. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
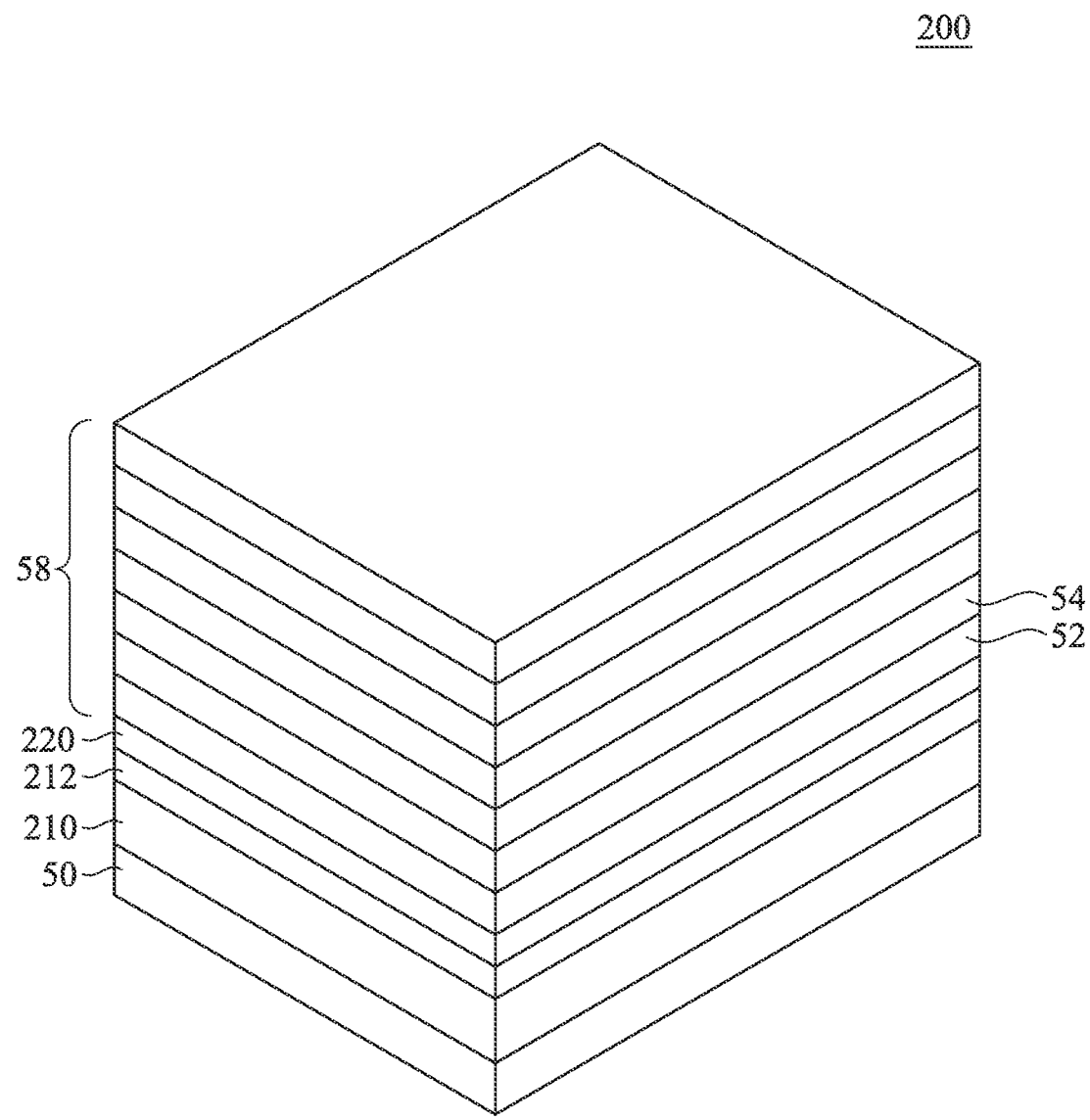
Figure 3B:
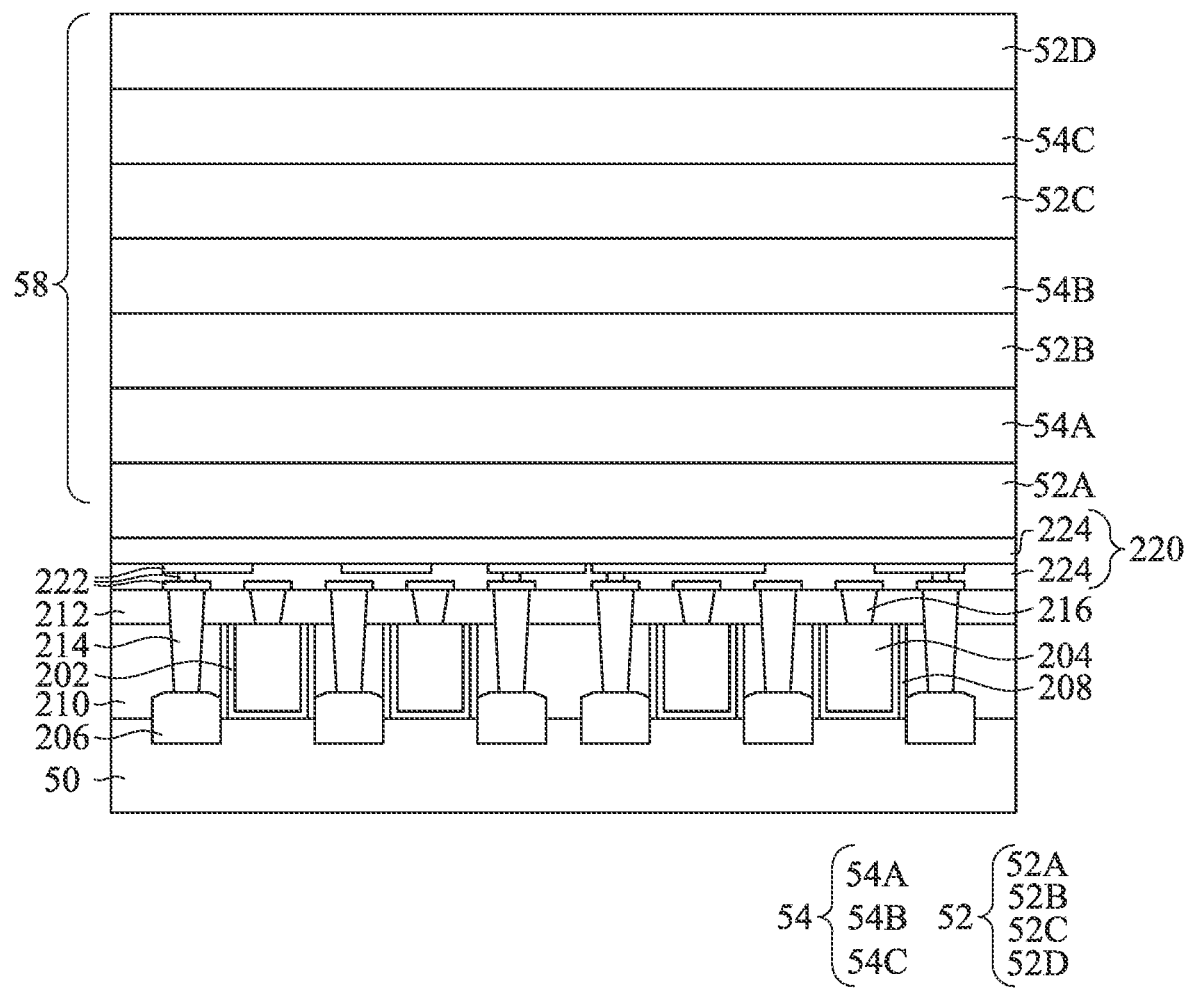

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A through 1C).

The multi-layer stack 58 includes alternating layers of dielectric layers 52A-D (collectively referred to as dielectric layers 52) and conductive lines 54A-C (collectively referred to as conductive layers 54). The conductive layers 54 may be patterned in subsequent steps to define the conductive lines 72 (e.g., word lines). The conductive layers 54 may comprise a conductive material, such as copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

Figure 3C:
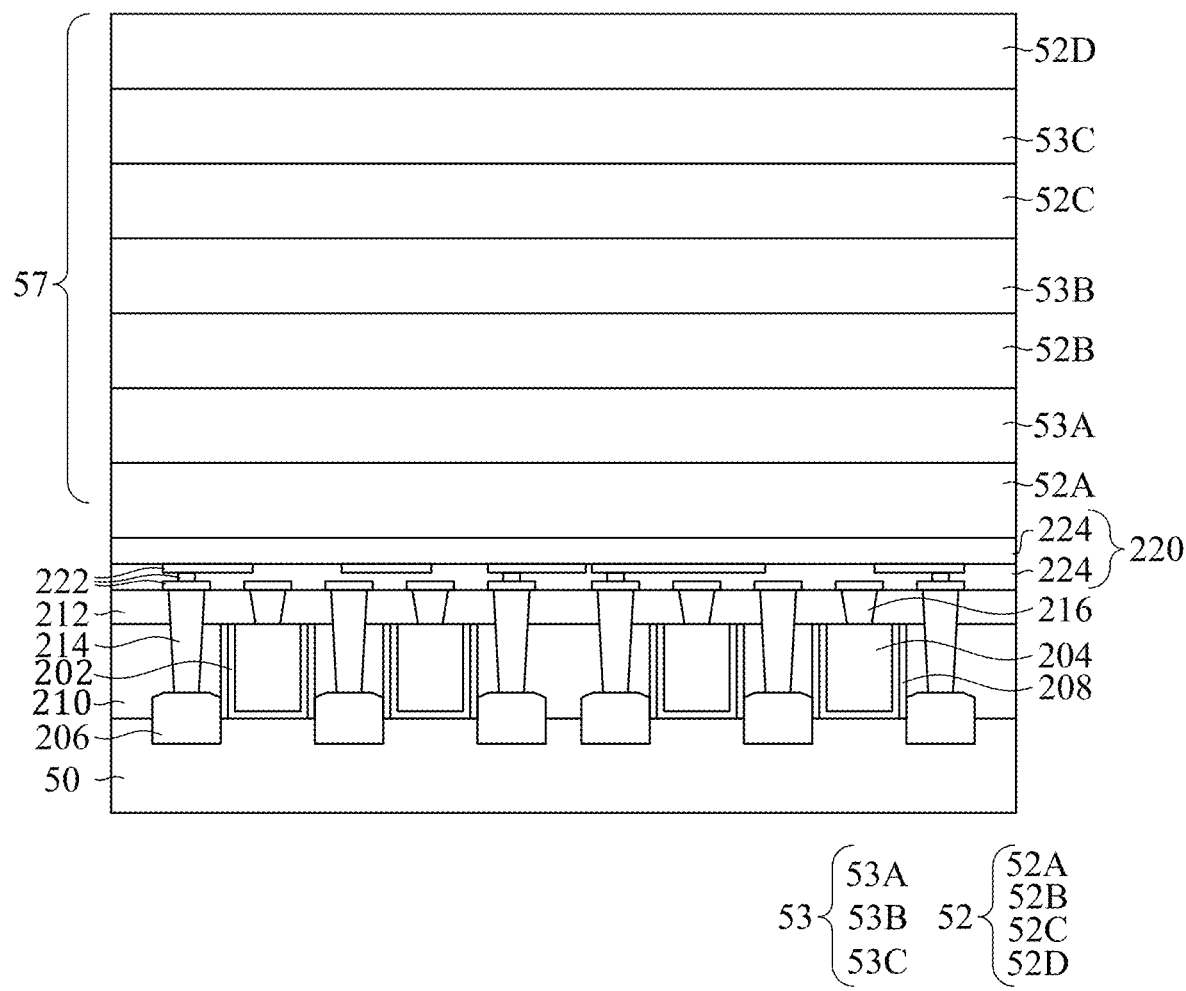

In some embodiments, as illustrated in accordance with FIG. 3C, a multi-layer stack 57 may be formed as alternating layers of dummy dielectric layers 53A-C (collectively referred to as dummy dielectric layers 53) and dielectric layers 52A-D (collectively referred to as dielectric layers 52). The dummy dielectric layers 53 or portions thereof may be subsequently removed and replaced with conductive layers (see below, FIG. 17C). The material of the dummy dielectric layers 53 may have a different etch selectivity from the material of the dielectric layers 52, which may be useful for the subsequent removal of the dummy dielectric layers 53 while leaving the dielectric layers 52. For example, in some embodiments, the dummy dielectric layers 53 may comprise a nitride while the dielectric layers 52 comprise an oxide.

FIGS. 4 through 12 are views of intermediate stages in the manufacturing a staircase structure of the memory array 200, in accordance with some embodiments. FIGS. 4 through 11 and 12 are illustrated along reference cross-section A-A' illustrated in FIG. 1A.

Figure 4:
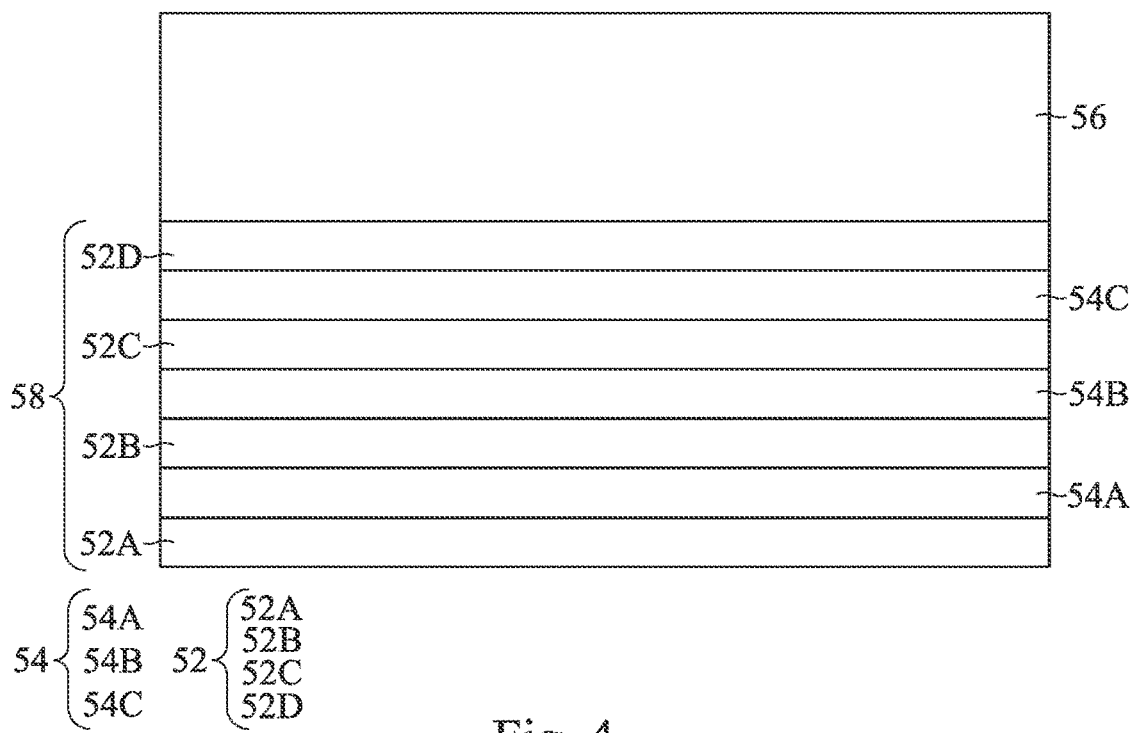

In FIG. 4 a photoresist 56 is formed over the multi-layer stack 58. As discussed above, the multi-layer stack 58 may comprise alternating layers of the dielectric layers 52 (labeled 52A, 52B, 52C, and 52D) and the conductive layers 54 (labeled 54A, 54B, and 54C). The photoresist 56 can be formed by using a spin-on technique.

Figure 5:
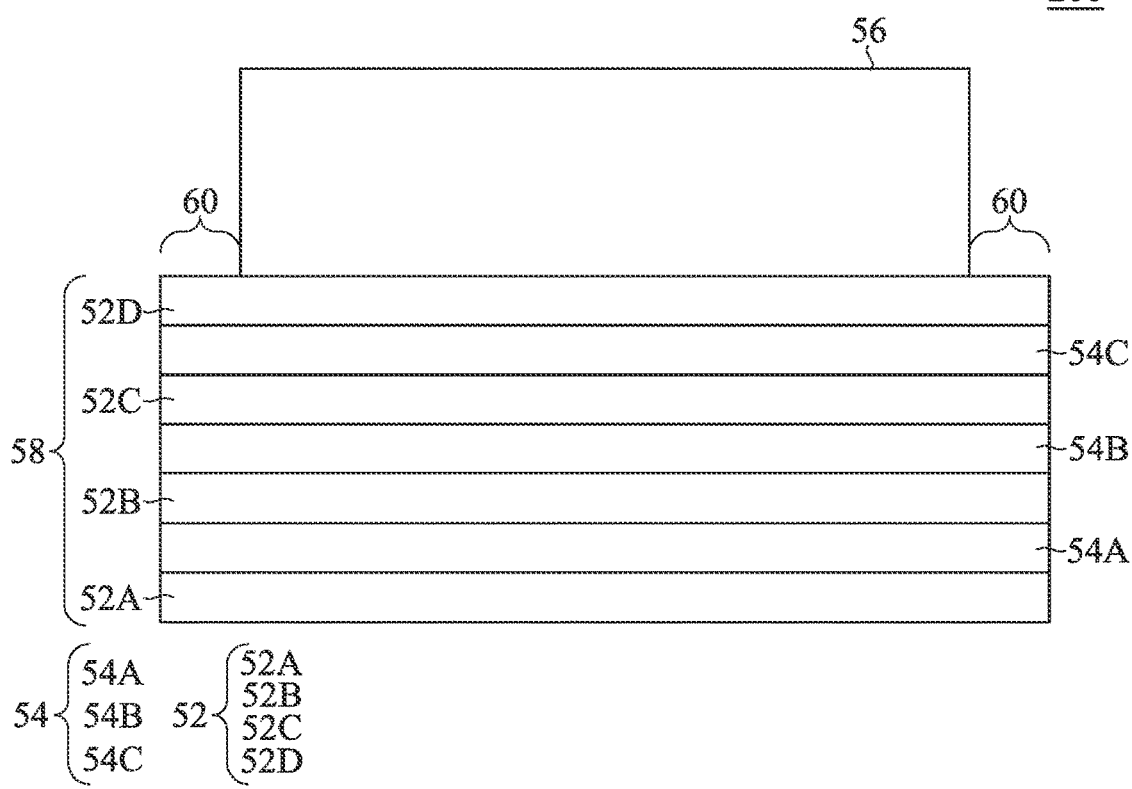
Figure 6:
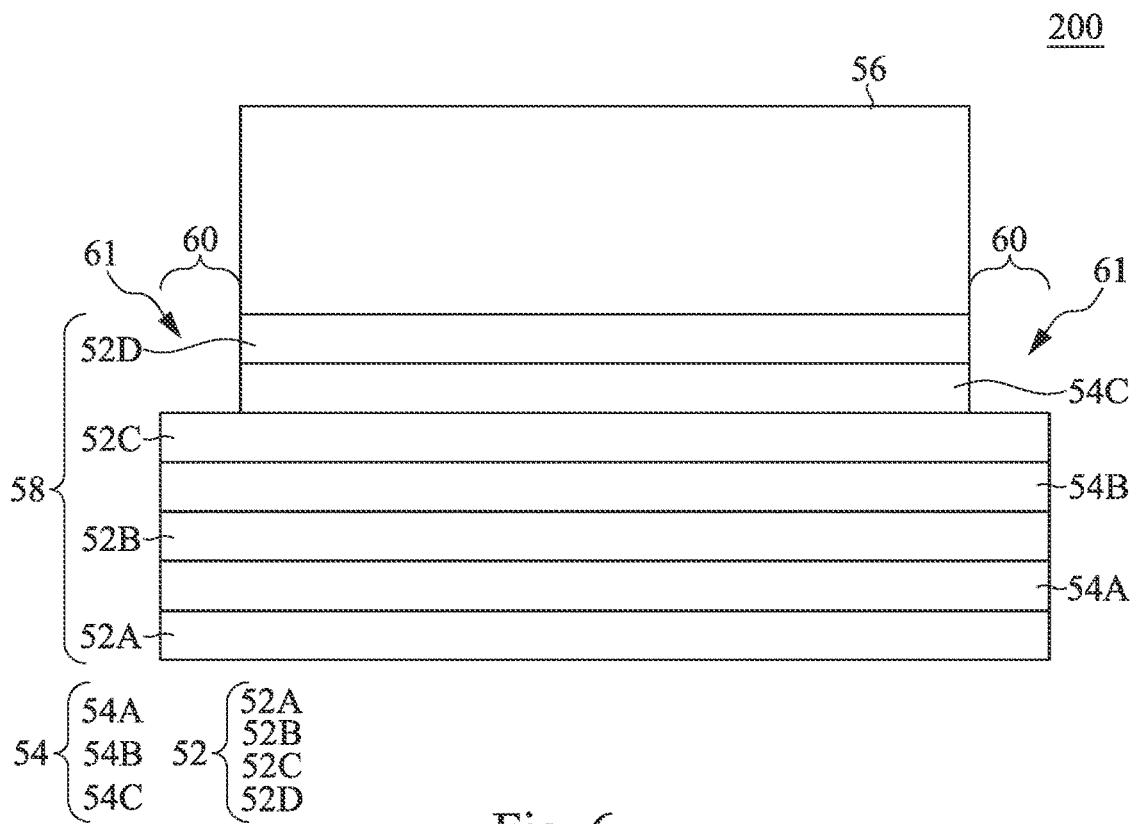

In FIG. 5, the photoresist 56 is patterned to expose the multi-layer stack 58 in regions 60 while masking remaining portions of the multi-layer stack 58. For example, a topmost layer of the multi-layer stack 58 (e.g., dielectric layer 52D) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the dielectric layer 52D and conductive layer 54C in the regions 60 and define openings 61. Because the dielectric layer 52D and the conductive layer 54C have different material compositions, etchants used to remove exposed portions of these layers may be different. In some embodiments, the conductive layer 54C acts as an etch stop layer while etching the dielectric layer 52D, and the dielectric layer 52C acts as an etch stop layer while etching the conductive layer 54C. As a result, the portions of the conductive layer 54C and the dielectric layer 52D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the dielectric layer 52C is exposed in the regions 60.

Figure 7:
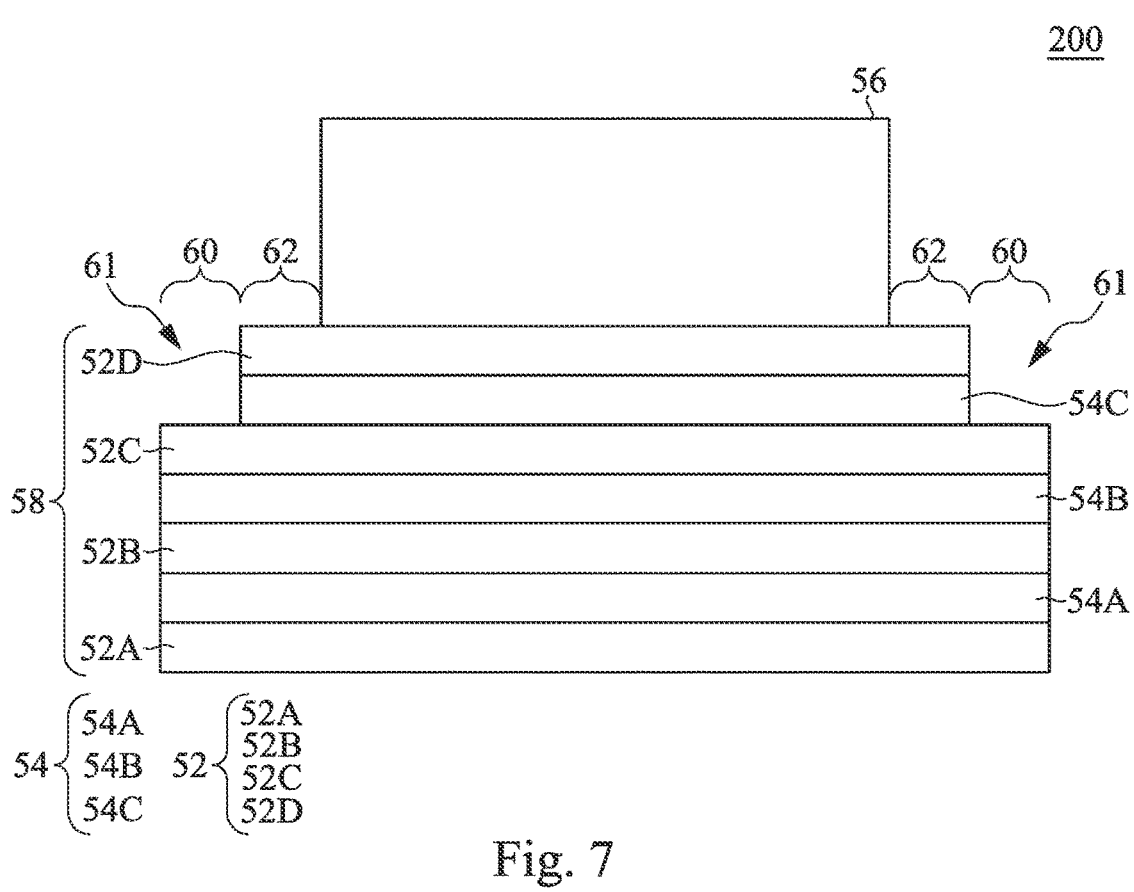

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the dielectric layer 52C may be exposed in the regions 60, and a top surface of the dielectric layer 52D may be exposed in the regions 62.

Figure 8:
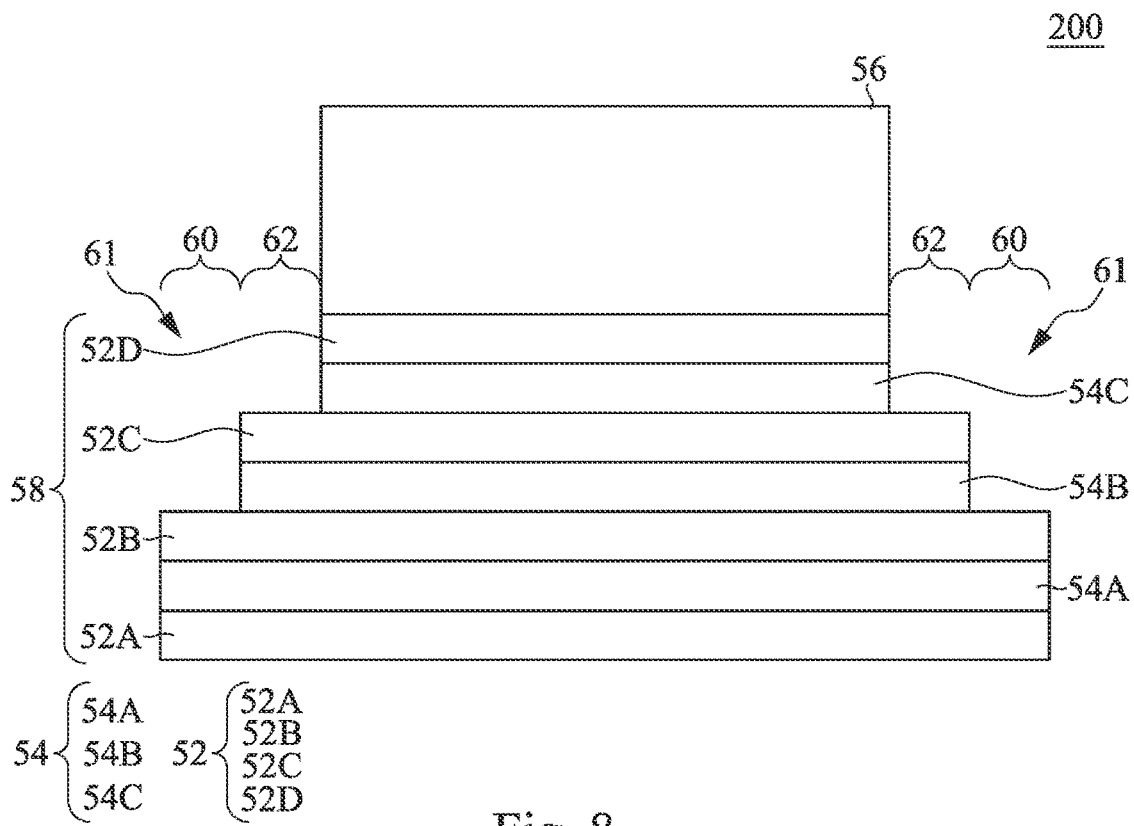

In FIG. 8, portions of the dielectric layer 52D, the conductive layer 54C, the dielectric layer 52C, and the conductive layer 54B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54C/54B and the dielectric layers 52D/52C have different material compositions, etchants used to remove exposed portions of these layers may be different. In some embodiments, the conductive layer 54C acts as an etch stop layer while etching the dielectric layer 52D; the dielectric layer 52C acts as an etch stop layer while etching conductive layer 54C; the conductive layer 54B acts as an etch stop layer while etching the dielectric layer 52C; and the dielectric layer 52B acts as an etch stop layer while etching the conductive layer 54B. As a result, portions of the conductive layers 54C/54B and the dielectric layers 52D/52C may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the dielectric layer 52D and conductive layer 54C (see FIG. 7) may be transferred to the underlying dielectric 52C and conductive layer 54B. In the resulting structure, the dielectric layer 52B is exposed in the regions 60, and the dielectric layer 52C is exposed in the regions 62.

Figure 9:
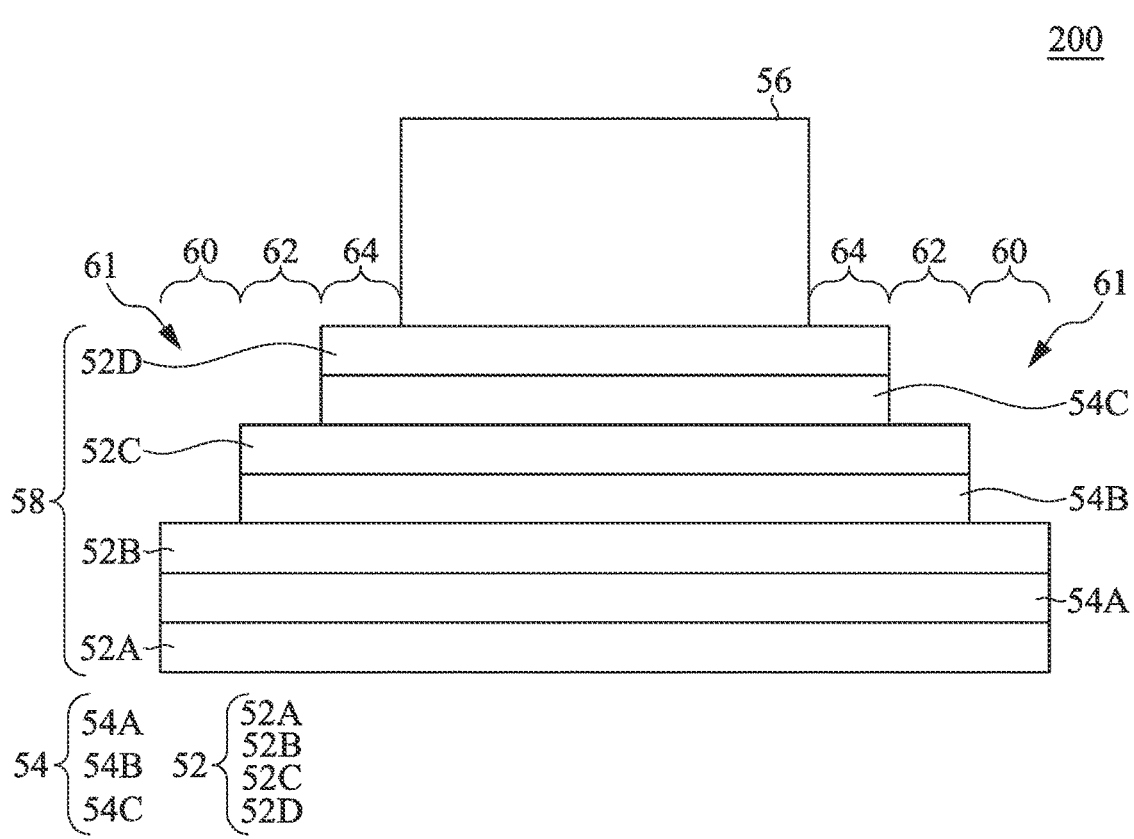

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the dielectric layer 52B may be exposed in the regions 60; a top surface of the dielectric layer 52C may be exposed in the regions 62; and a top surface of the dielectric layer 52D may be exposed in the regions 64.

Figure 10:
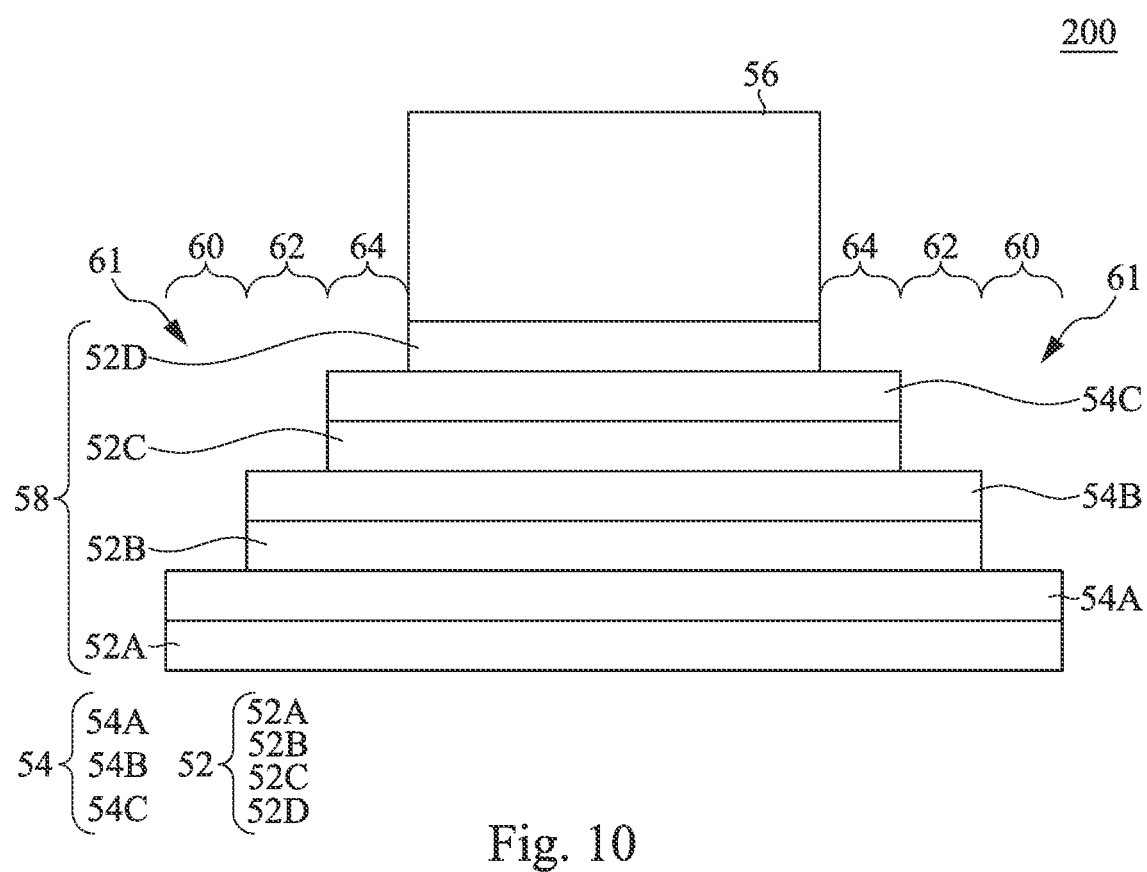

In FIG. 10, portions of the dielectric layers 52D, 52C, and 52B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the conductive layer 54C acts as an etch stop layer while etching the dielectric layer 52D; the conductive c layer 54B acts as an etch stop layer while etching the dielectric layer 52C; and the conductive layer 54A acts as an etch stop layer etching the dielectric layer 52B. As a result, portions of the dielectric layers 52D, 52C, and 52B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the conductive layers 54C/54B (see FIG. 9) may be transferred to the underlying dielectric layers 52C/52B. In the resulting structure, the conductive layer 54A is exposed in the regions 60; the conductive layer 54B is exposed in the regions 62; and the conductive layer 54C is exposed in the regions 64.

Figure 11A:
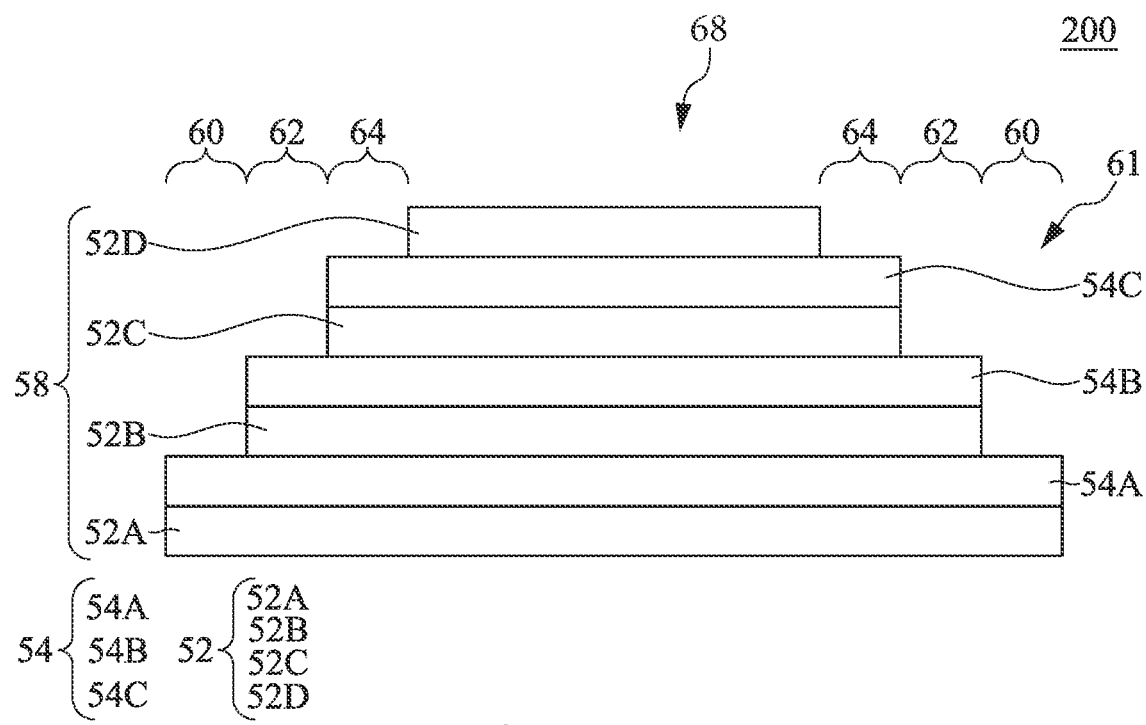

In FIG. 11A, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; and the conductive layer 54B may be longer than the conductive layer 54C. As a result, conductive contacts can be made from above the staircase structure 68 to each of the conductive layers 54 in subsequent processing steps.

Figure 11B:
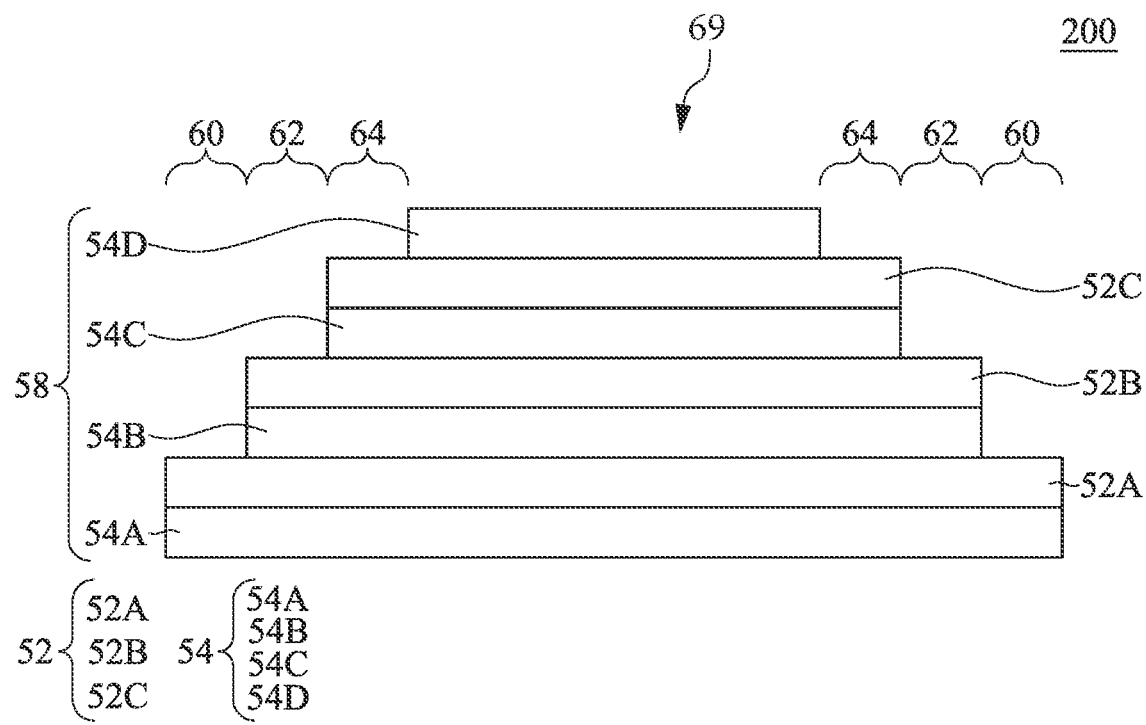

FIG. 11B illustrates a staircase structure 69 similar to the staircase structure 68 with dielectric layers 52 on top of conductive layers 54 in each step of the staircase, in accordance with some embodiments. The staircase structure 69 may be formed with similar methods and materials as the staircase 68 as described above in FIGS. 4 through 11A beginning with a multi-layer stack in which a conductive layer 54 is the top layer. All embodiments of the staircase structures 68 and 69 described above may be applied to the following processes and structures subsequently described in FIGS. 12 through 31D.

Figure 12:
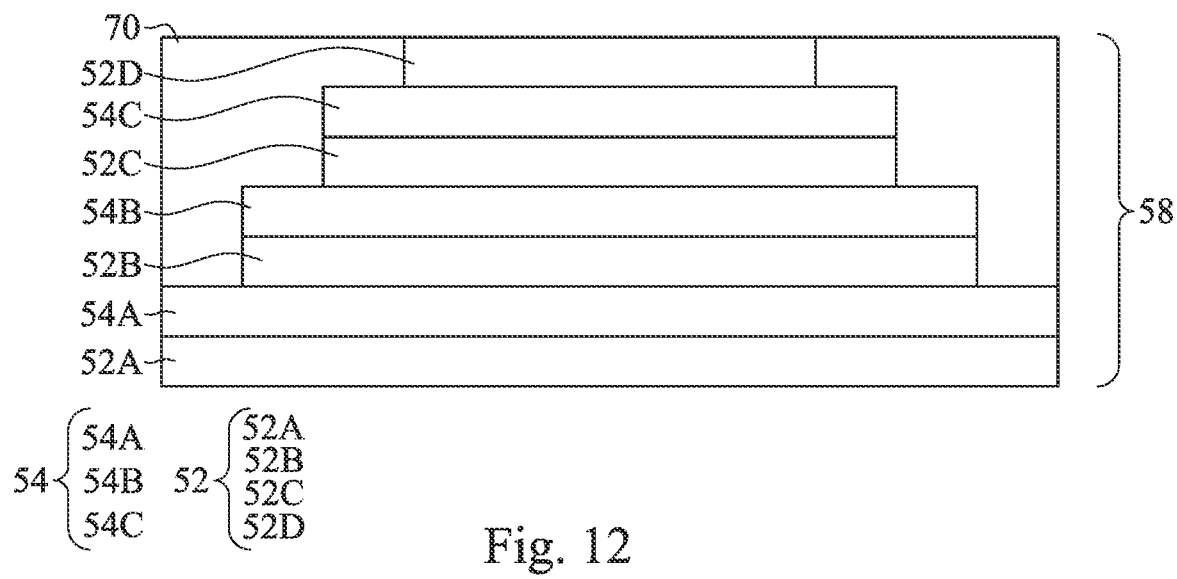

In FIG. 12, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the conductive layers 54.

As further illustrated in FIG. 12, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

FIGS. 13 through 17B are views of intermediate stages in the manufacturing of the memory array 200, in accordance with some embodiments. In FIGS. 13 through 17B the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting TFTs of the memory array 200. FIG. 17A is illustrated in a three-dimensional view. FIGS. 13 through 16 and 17B are illustrated along reference cross-section B-B' illustrated in FIG. 1A.

Figure 13:
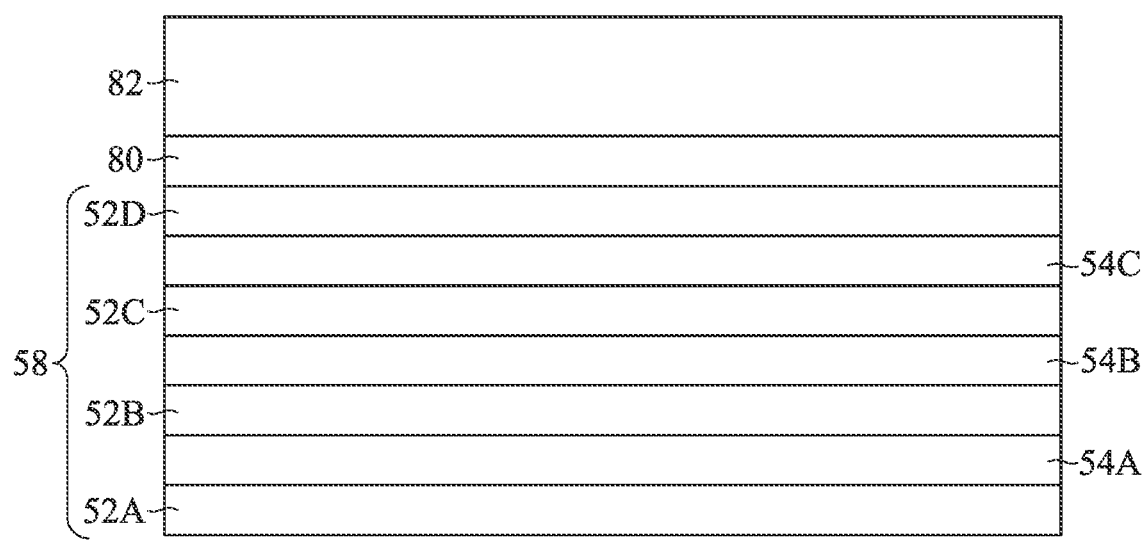

In FIG. 13, a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
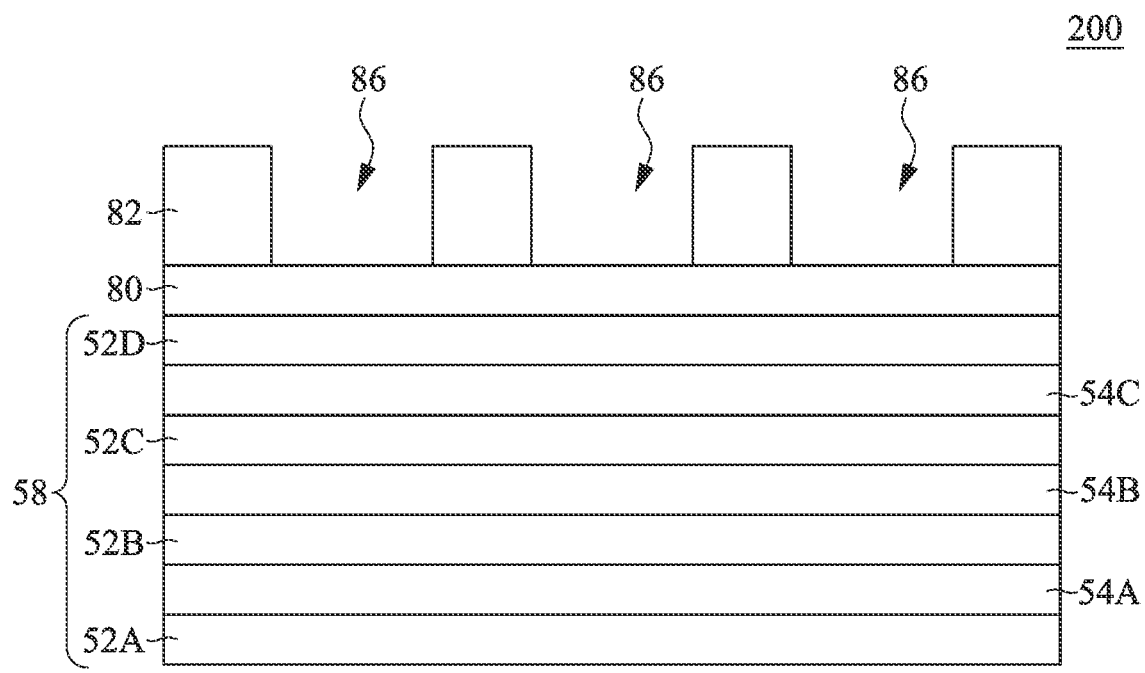

In FIG. 14, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

Figure 15:
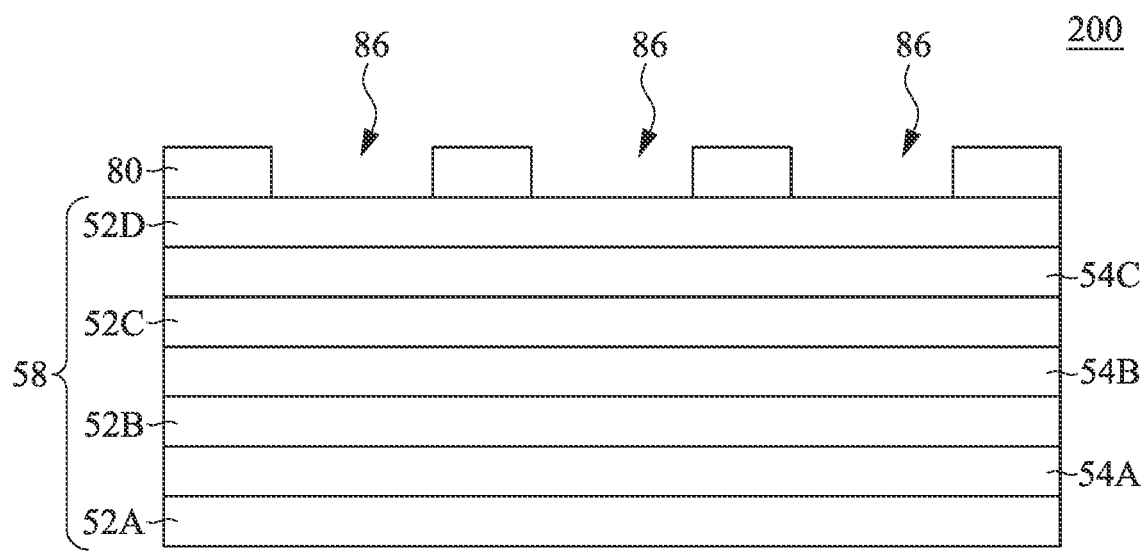

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
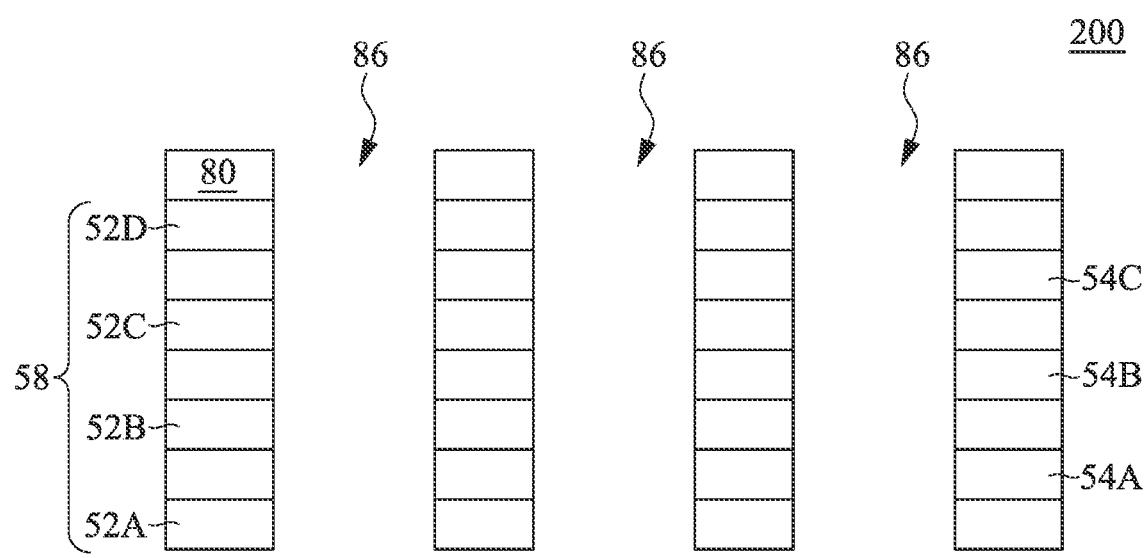

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other.

Figure 17A:
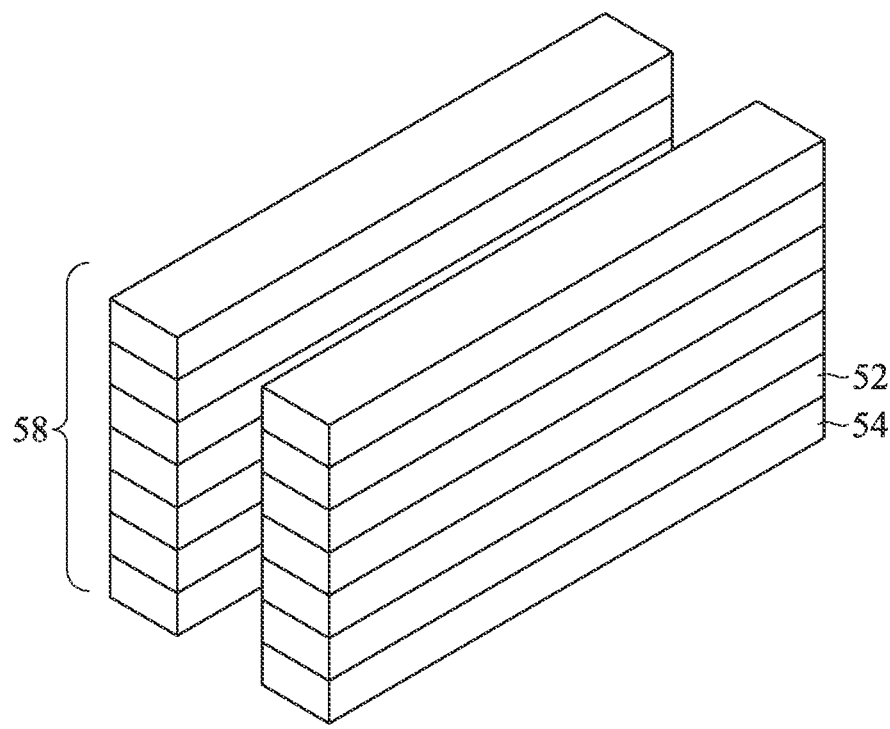
Figure 17B:
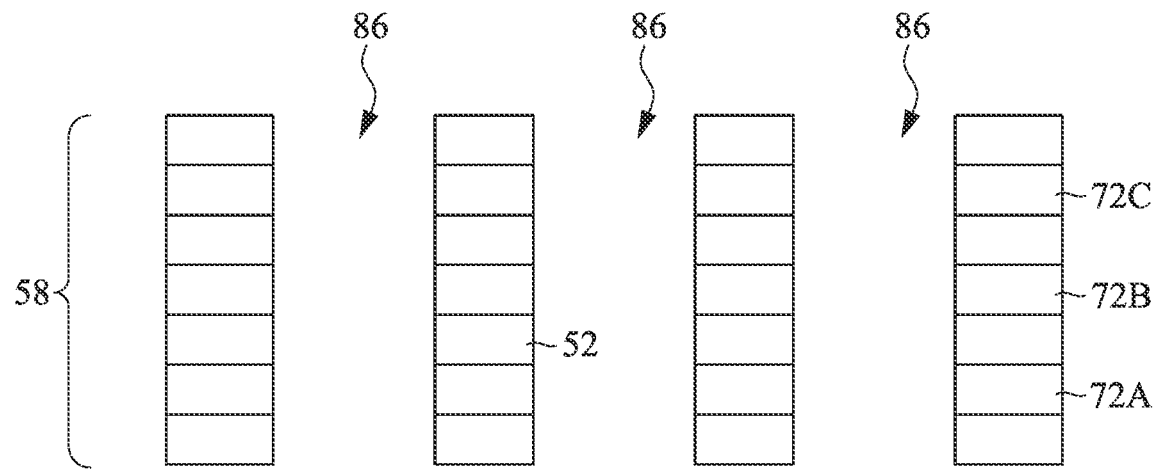

Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; and the conductive lines 72B may be longer than the conductive lines 72C.

Figure 17C:
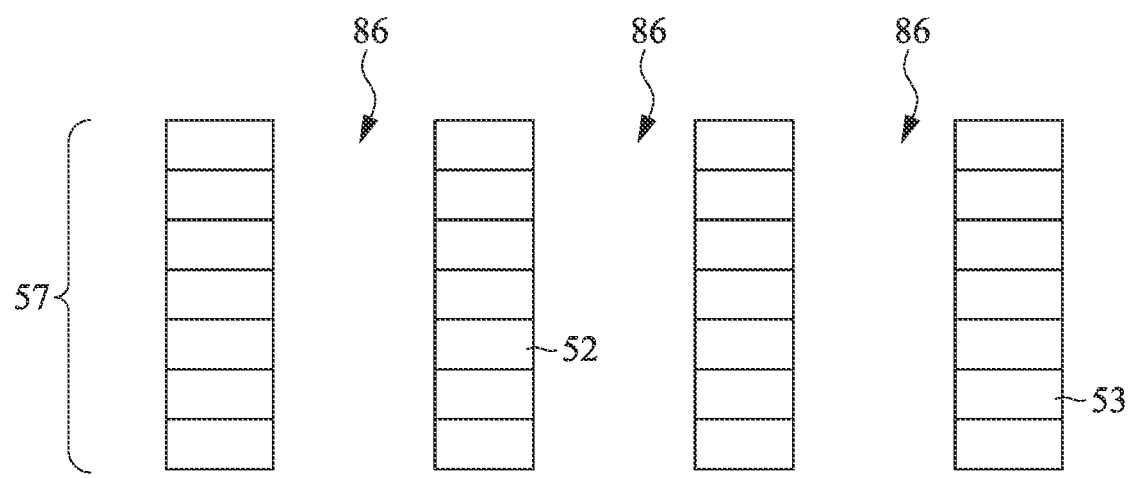

FIG. 17C follows from FIG. 3C in accordance with some embodiments, illustrating a multi-layer stack 57 with alternating layers of dummy dielectric layers 53 and dielectric layers 52 that is patterned by the same process as described above for the multi-layer stack 58 in FIGS. 4 through 17B. After patterning the multi-layer stack 57, portions of the dummy dielectric layers 53 are removed by an acceptable process such as a wet etching process or a dry etching process selective to the material of the dummy dielectric layers 53 over the material of the dielectric layers 52, leaving openings between the dielectric layers 52. Portions of the dummy dielectric layers 53 (e.g., at the periphery of the multi-layer stack 57) may remain between the dielectric layers 54 to provide physical support between the dielectric layers 52 and to define the openings. Subsequently, conductive lines 72 may be deposited in the openings using similar processes and materials as described for the conductive layers 54 (see above, FIGS. 3A and 3B). After the replacement of the dummy dielectric layers 53 with conductive lines 72, the multi-layer stack 57 will be similar to the multi-layer stack 58 as shown in FIGS. 17A and 17B, and subsequent processing of the multi-layer stack 57 may proceed the same as the processing of the multi-layer stack 58 as described below in FIGS. 18A through 31D.

Figure 18A:
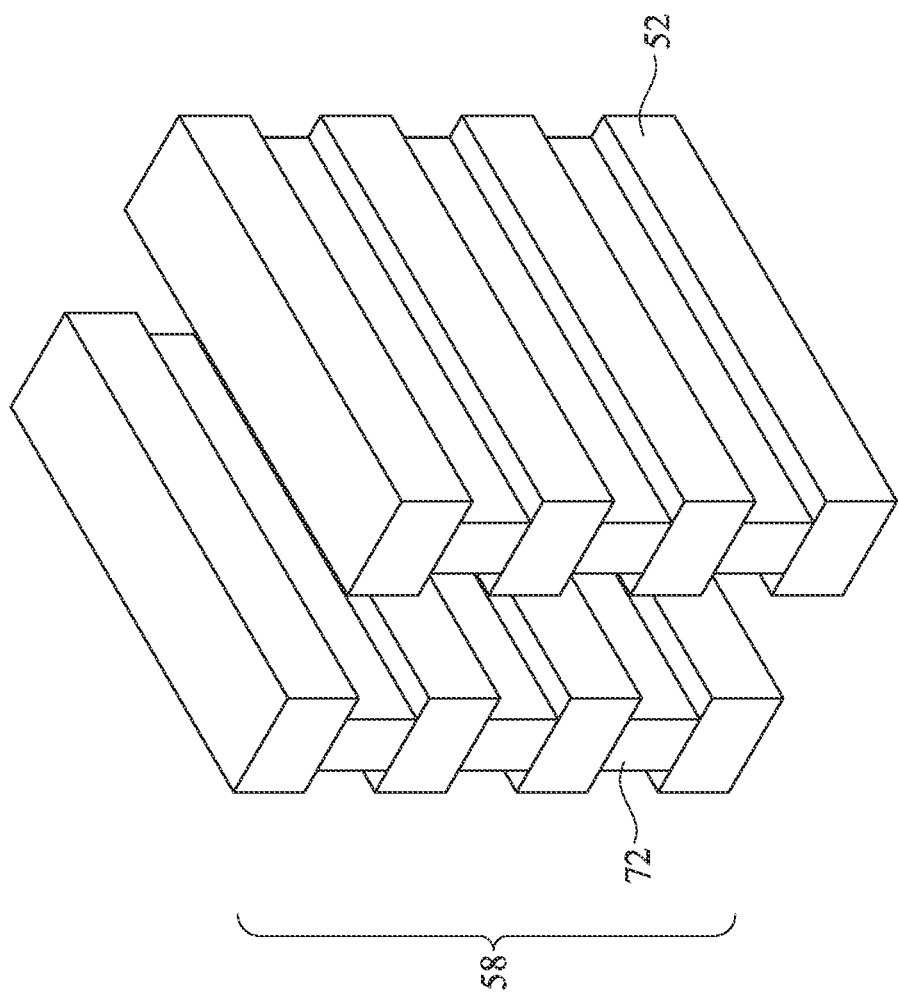
Figure 24:
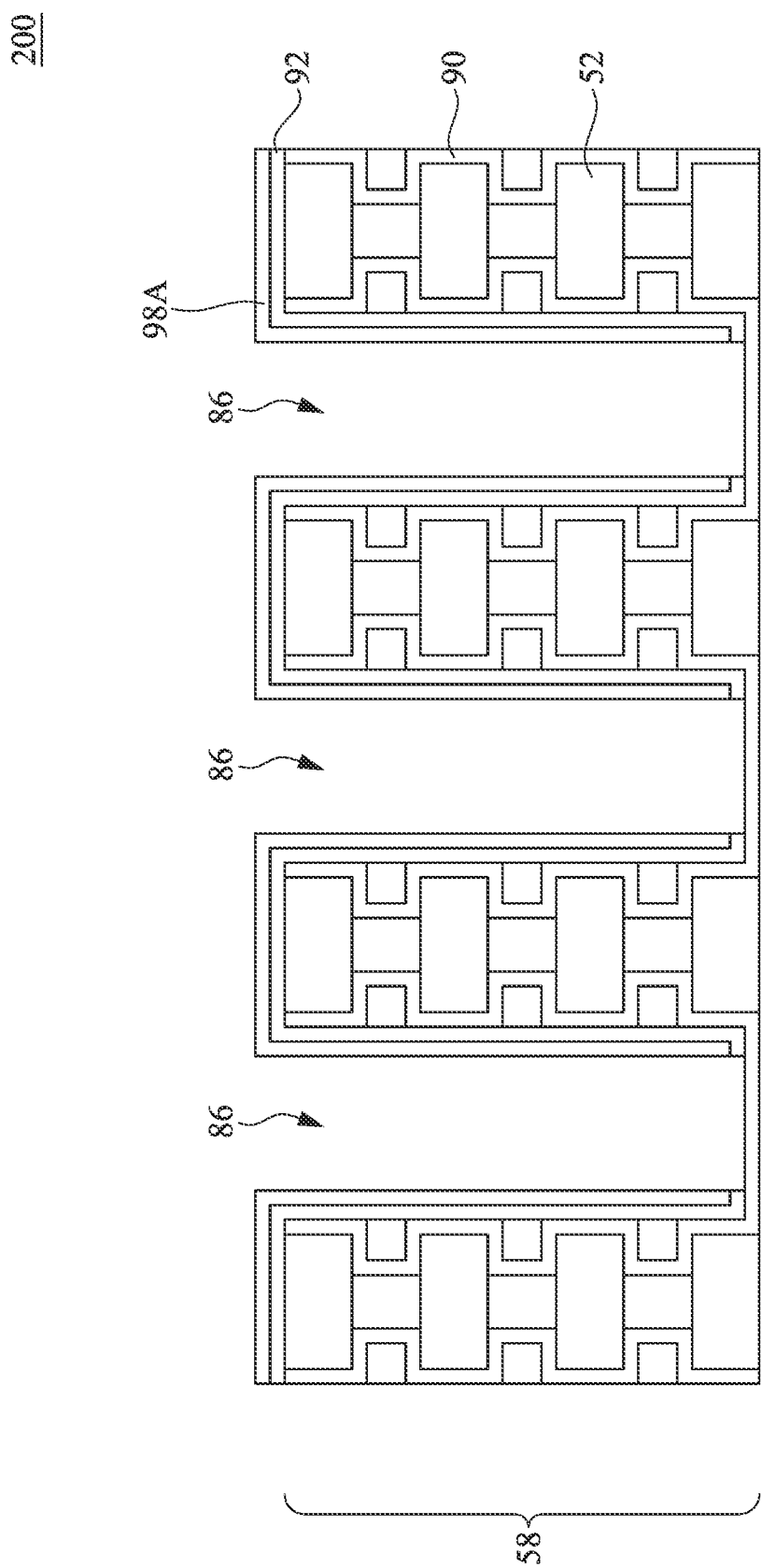
Figure 25:
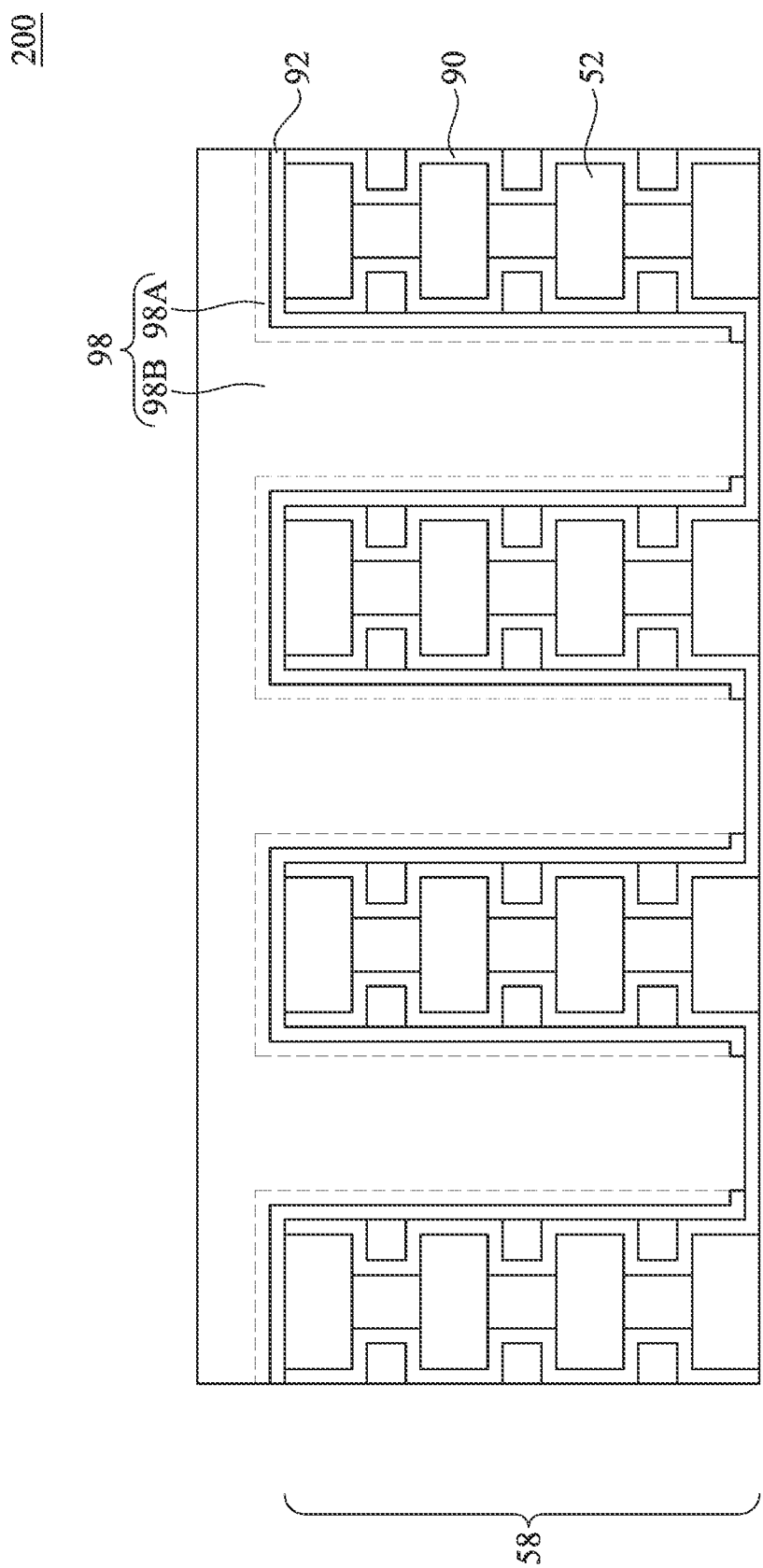
Figure 26A:
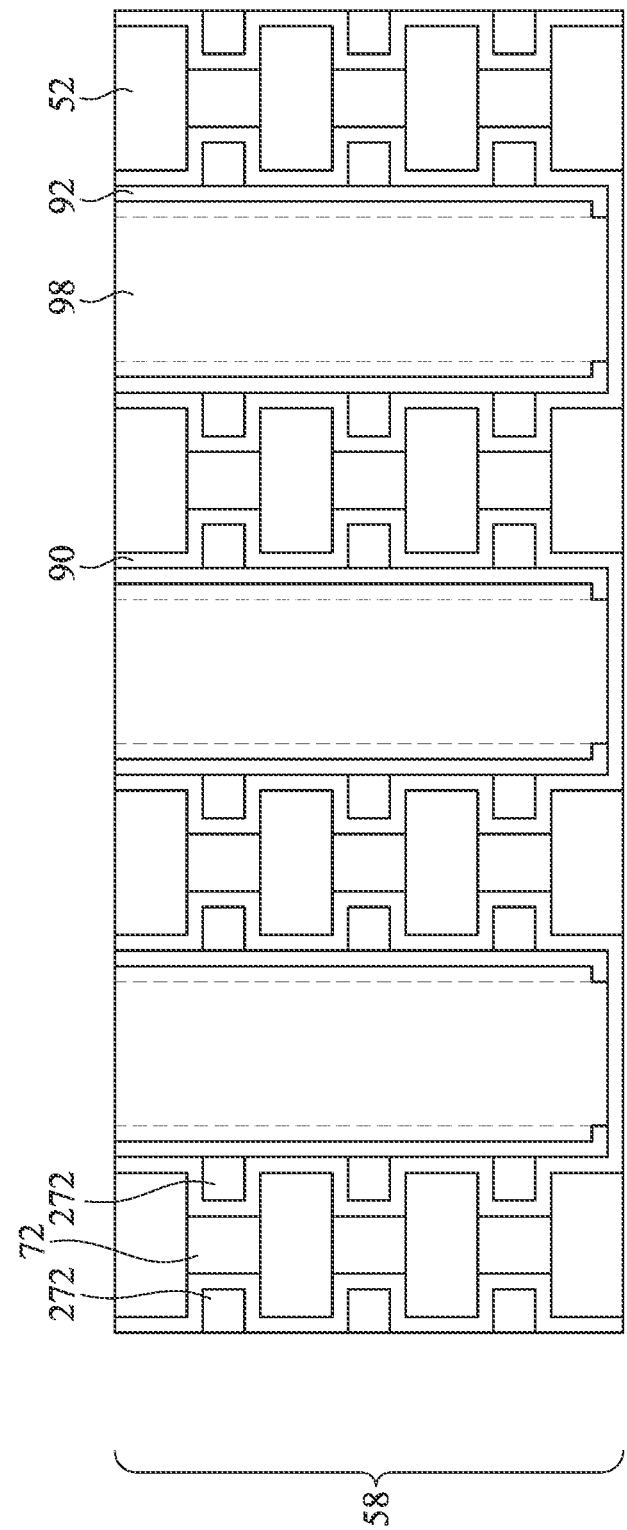

FIGS. 18A through 26B illustrate forming and patterning channel regions for the TFTs 204 (see FIG. 1A) in the trenches 86. FIG. 18A is illustrated in a three-dimensional view. In FIGS. 18B, 19A, 19B, 19C, 19D, 20, 21A, 21B, 21C, 21D, 21E, 21F, 21D, 21G, 21H, 22, 23, 24, 25, and 26A cross-sectional views are provided along line B-B' of FIG. 1A. FIG. 26B illustrates a corresponding top-down view of the TFT structure.

Figure 18B:
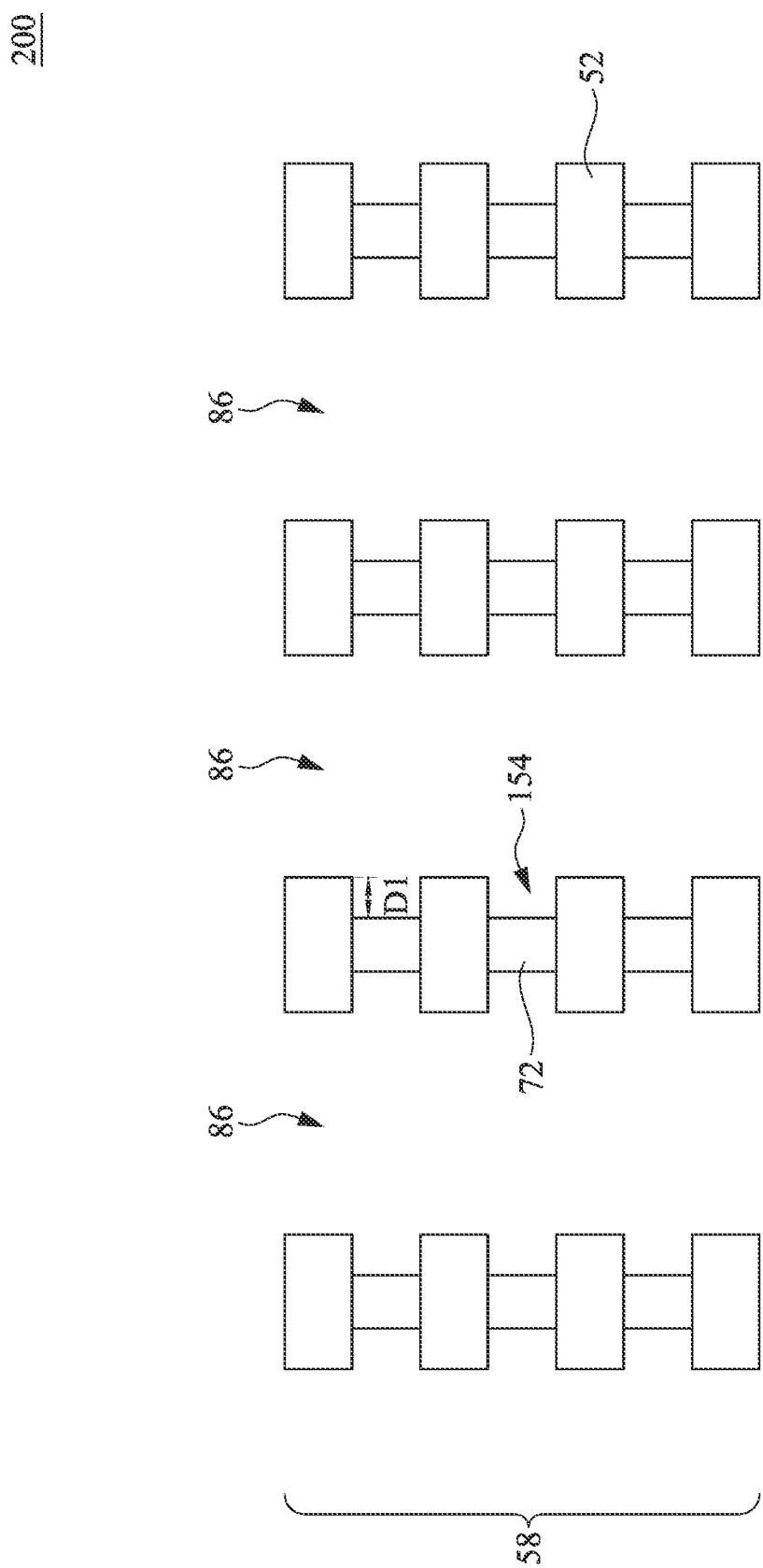

In FIGS. 18A and 18B, sidewalls of the conductive lines 72 are recessed by an acceptable process, such as a wet or dry etch, forming lateral recesses 154. The recessing of the conductive lines 72 may allow for the subsequent formation of a conductive material on both sides of a subsequently formed memory film (see below, FIGS. 19A-21B), which may be useful for improving properties (e.g. charge screening) of subsequently formed devices. In some embodiments, the sidewalls of the conductive lines 72 are recessed with a wet etch using KOH, $NH_4OH$, $H_2O_2$, the like, or a combination thereof. In some embodiments, the sidewalls of the conductive lines 72 are recessed with a dry etch using $NH_3$, $NF_3$, HF, the like, or a combination thereof. The lateral recesses 154 may be formed to a distance D1 from sidewalls of the dielectric layers 52 in a range of 10 nm to 100 nm.

Figure 19A:
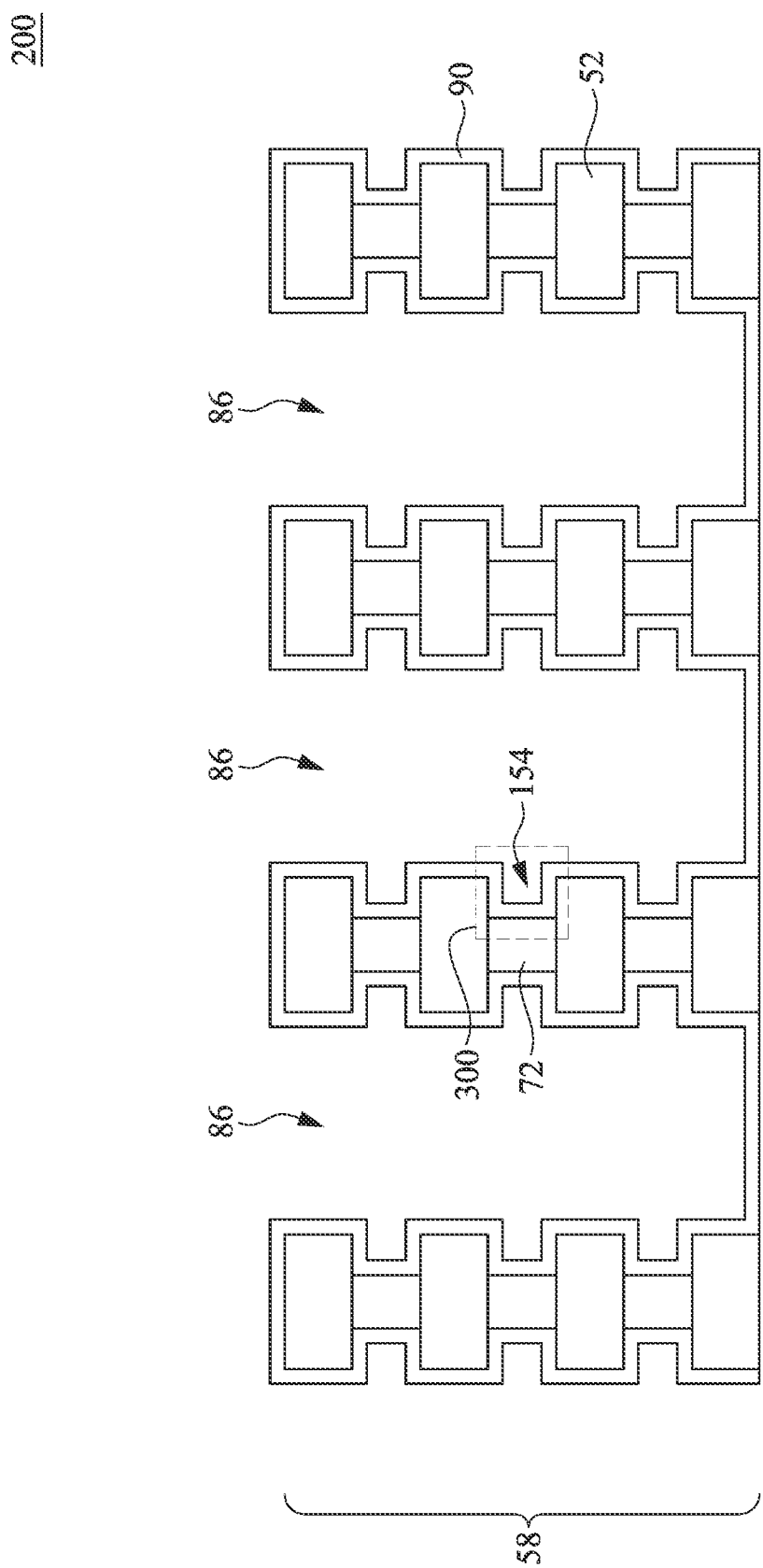
Figure 19D:
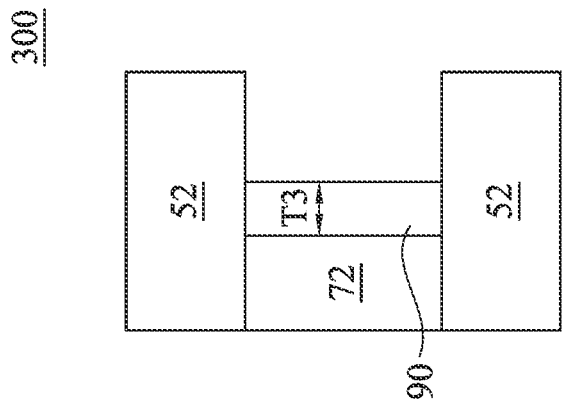

In FIG. 19A, a memory film 90 is conformally deposited in the trenches 86 over exposed surfaces of the dielectric layers 52 and the conductive lines 72. FIG. 19B illustrates a detailed view of region 300 as shown in FIG. 19A. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory 90 may be a multilayer structure comprising a layer of $SiN_X$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19C:
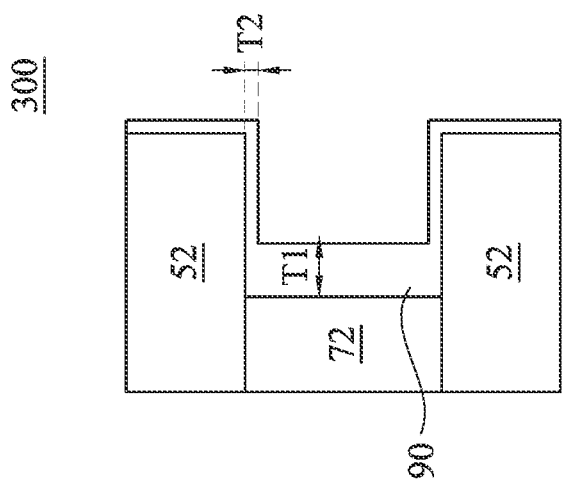
Figure 19B:
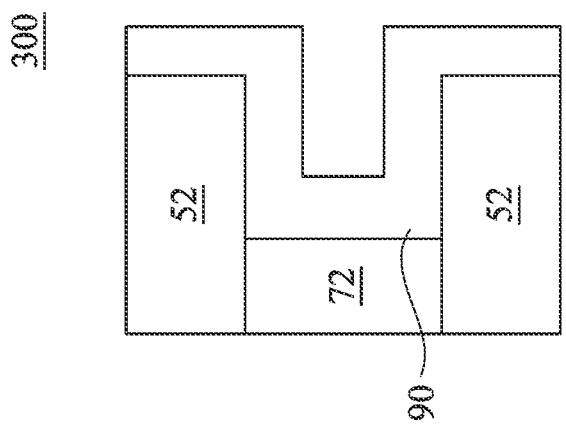

FIG. 19C illustrates a detailed view of region 300 in which the memory film 90 has a different thickness along a sidewall of the conductive lines 72 from a thickness of the memory film 90 along surfaces of the dielectric layers 52, in accordance with some embodiments. For example, FIG. 19C illustrates the memory film 90 having a first thickness T1 along the conductive lines 72 and a second thickness T2 along surfaces of the dielectric layers 52, the first thickness T1 being greater than the second thickness T2.

The memory film 90 may be formed to different thicknesses T1 and T2 by a selective deposition by a method such as ALD that forms a memory film 90 at a faster rate on a conductive material (of the conductive lines 72 than on a dielectric material such of the dielectric layers 52. In such embodiments, the memory film 90 may comprise $HfZrO_2$, $HfO_2$, $ZrO_2$, $SiO_2$, SiN, or the like; the conductive lines 72 may comprise TiN, W, TaN, Ru, or the like; and the dielectric layers 52 may comprise $SiO_2$, SiCN, SiOCN, or the like. For example, a memory film 90 may be formed to a first thickness T1 in a range of 5 nm to 20 nm on sidewalls of the conductive lines 72. The memory film 90 may be further formed to a second thickness T2 in a range of 3 nm to 10 nm on surfaces of the dielectric layers 52. A ratio of the first thickness T1 to the second thickness T2 may be in a range of 5 to 1.

FIG. 19D follows from FIG. 19C, in accordance with some embodiments, and illustrates the memory film 90 after portions of the memory film 90 along surfaces of the dielectric layers 52 are optionally removed by acceptable process. For example the removal process may include a wet etch or a dry etch using KOH, $NH_4OH$, $H_2O_2$, the like, or a combination thereof. Because the second thickness T2 of the memory film 90 along the surfaces of the dielectric layers 52 may be smaller than the first thickness T1 of the memory film on sidewalls of the conductive lines 72, an isotropic etch process may remove the portions of the memory film 90 along surfaces of the dielectric layers 52 while portions of the memory film on sidewalls of the conductive lines 72 remain. The remaining portions of the memory film 90 on sidewalls of the conductive lines 72 may have a third thickness T3 in a range of 3 nm to 15 nm.

Figure 20:
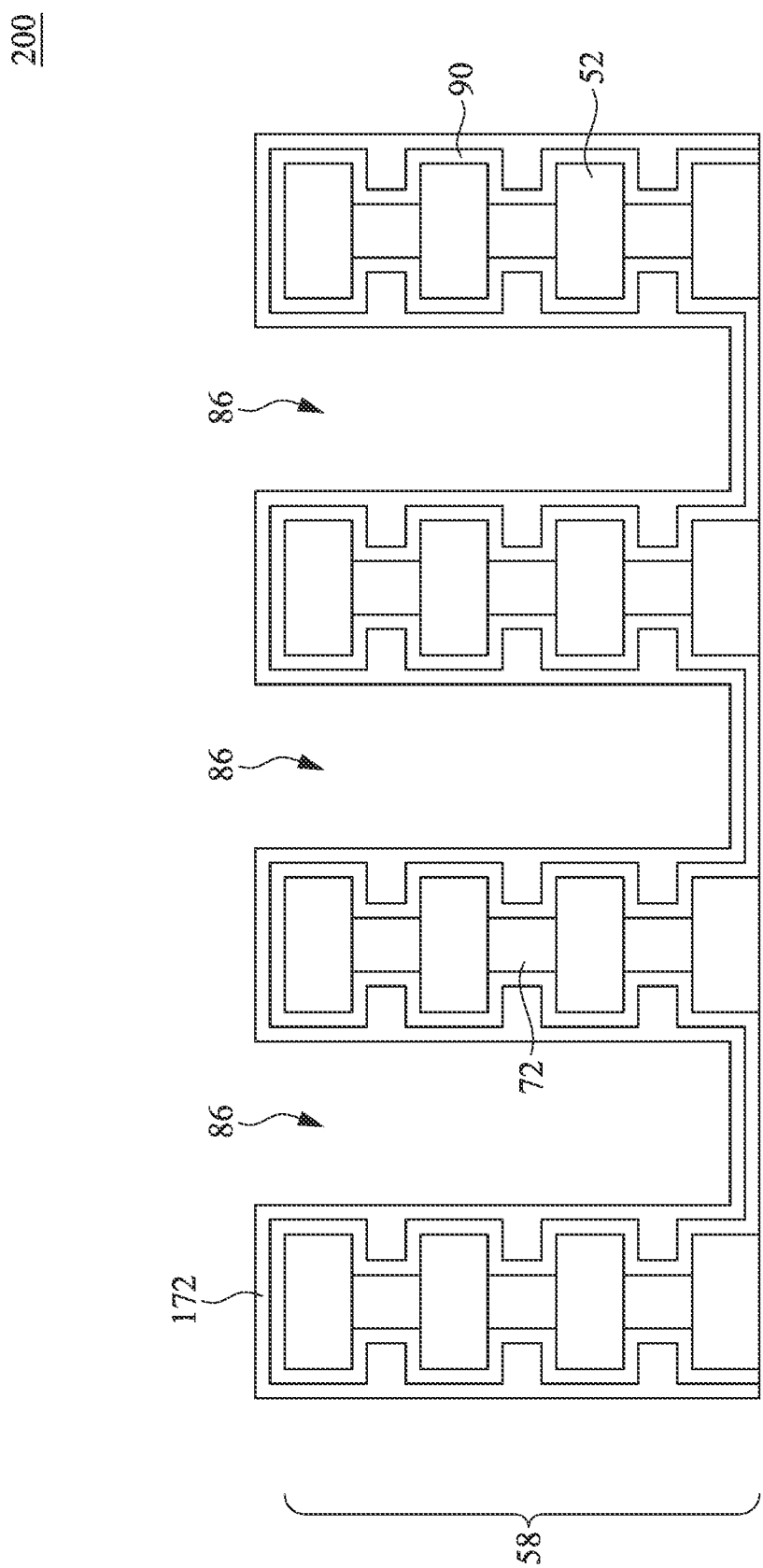

In FIG. 20, following from FIGS. 19A and 19B, conductive material 172 is conformally deposited over the memory film 90 and fills the lateral recesses 154. The conductive material 172 is used to subsequently form conductive features 272 (see below, FIG. 21A). The conductive material 172 may be formed using similar materials and methods as the conductive layers 54, as described above with respect to FIGS. 3A and 3B.

Figure 21A:
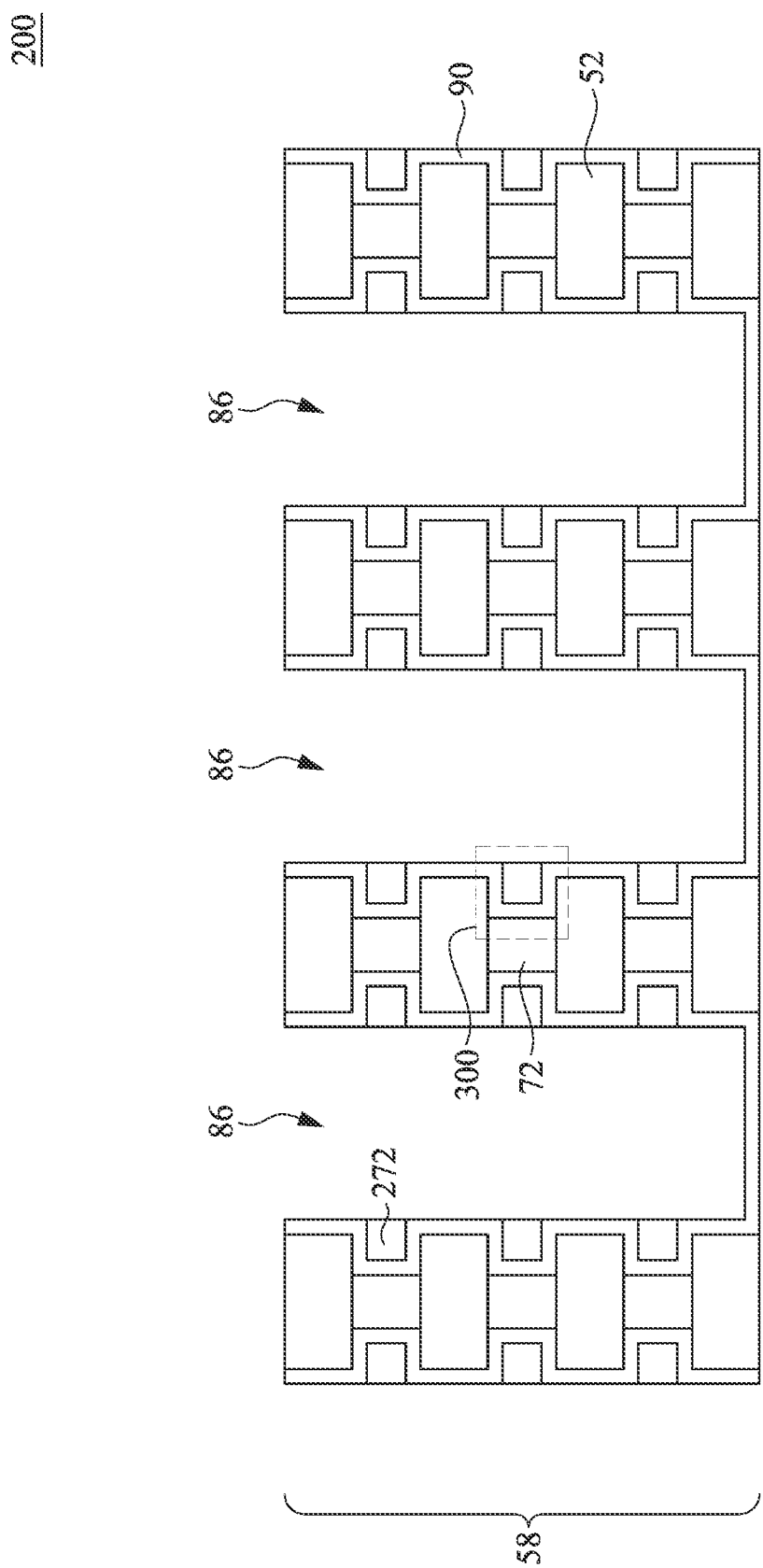
Figure 21B:
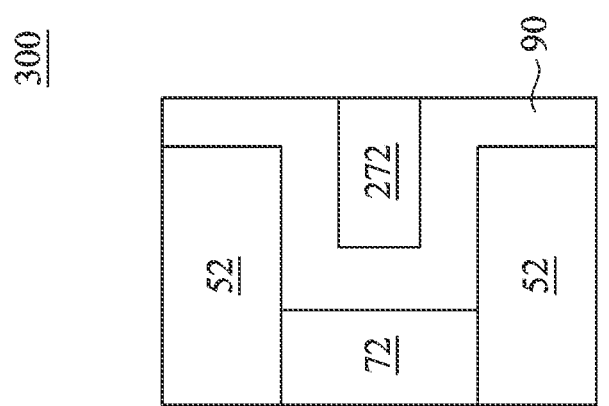

In FIG. 21A, conductive features 272 are formed by etching back the conductive material 172 to expose top surfaces and sidewalls of the memory film 90. FIG. 21B illustrates a detailed view of region 300 shown in FIG. 21A. The resulting conductive features 272 may be covered by sidewalls and top and/or bottom surfaces of the memory film 90. The conductive features 272 may be useful in forming Metal-Ferro-Metal (MFM) capacitors in conjunction with the conductive lines 72 and the memory film 90. The interface between the memory film 90 and the conductive features 272 may have better quality due to containing fewer defects than an interface between a ferroelectric memory film and a semiconductor material such as an OS layer similar to the OS layer 92 described below with respect to FIG. 22. The reduction of defects in the interface between the memory film 90 and the conductive features 272 may improve endurance of subsequently formed TFTs (e.g., TFTs 204, see FIG. 1A). The conductive features 272 may provide better charge screening for the memory film 90, which may reduce the depolarization field and increase retention time of the subsequently formed TFTs.

The etch back of the conductive material 172 to form the conductive features 272 may be performed with an acceptable process such as a wet etch or a dry etch. In some embodiments, the conductive material 172 is etched back with a wet etch using KOH, $NH_4OH$, $H_2O_2$, the like, or a combination thereof. In some embodiments, the conductive material 172 is etched back with a dry etch using $NH_3$, $NF_3$, HF, the like, or a combination thereof. In some embodiments, a planarization such as a CMP is performed to remove excess portions of the conductive material 172 remaining over top surfaces of the memory film 90.

After the etch back, sidewalls of the trenches 86 comprise sidewalls of conductive features 272 and sidewalls of the memory film 90. Sidewalls of the conductive features 272 opposite the trenches 86 and bottom surfaces of the conductive features 272 may be covered by the memory film 90. Top surfaces of the conductive features 272 may also be covered by the memory film 90. In some embodiments, top surfaces of conductive features 272 located at the top of multi-layer stacks 58 are level with top surfaces of the memory film 90.

Figure 21C:
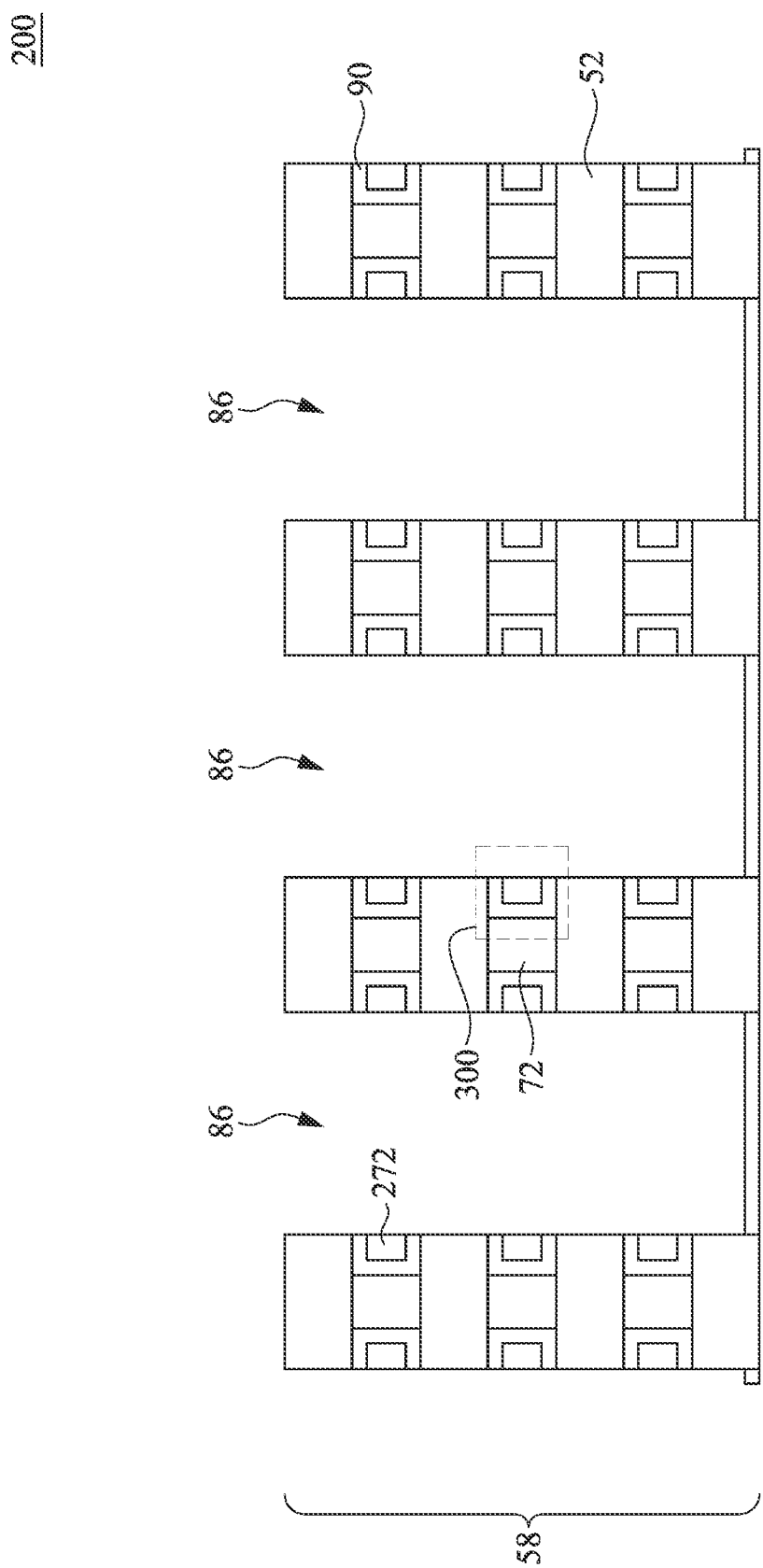
Figure 21F:
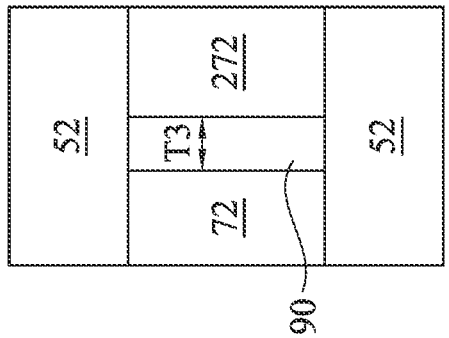
Figure 21E:
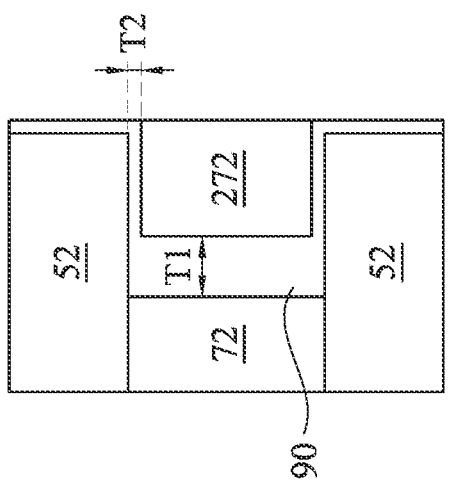
Figure 21D:
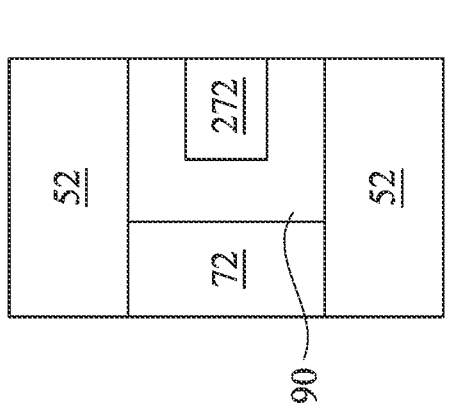

FIGS. 21C and 21D illustrate embodiments in which portions of the memory film 90 along sidewalls of the dielectric layers 52 are removed. The portions of the memory film 90 along sidewalls of the dielectric layers 52 may also be referred to dummy areas. The removal of the dummy areas of the memory film 90 may decrease interference between TFTs (e.g., TFTs 204, see FIG. 1A) in adjacent layers. In some embodiments, the dummy areas of the memory film 90 are removed in the same process as the etch back of the conductive material 172 described above with respect to FIGS. 21A-B. In some embodiments, the dummy areas of the memory film 90 are removed by another acceptable process, such as an anisotropic dry etch using $Cl_2$, $CF_4$, $CH_3F$, $CH_2F_2$, the like, or a combination thereof.

FIGS. 21E and 21F illustrate embodiments in which the memory film 90 has different thicknesses between the conductive lines 72 and the conductive features 272 and between the dielectric layers 52 and the conductive features 272. For example, FIG. 21E follows from FIG. 19C above and illustrates the memory film 90 having a first thickness T1 between the conductive lines 72 and the conductive features 272 and a second thickness T2 between the dielectric layers 52 and the conductive features 272, the first thickness T1 being greater than the second thickness T2. FIG. 21F follows from FIG. 19D above and illustrates the memory film 90 having a third thickness T3 between the conductive lines 72 and the conductive features 272. In some embodiments in accordance with FIG. 21F, the conductive features 272 may physically contact the dielectric layers 52.

Figure 21H:
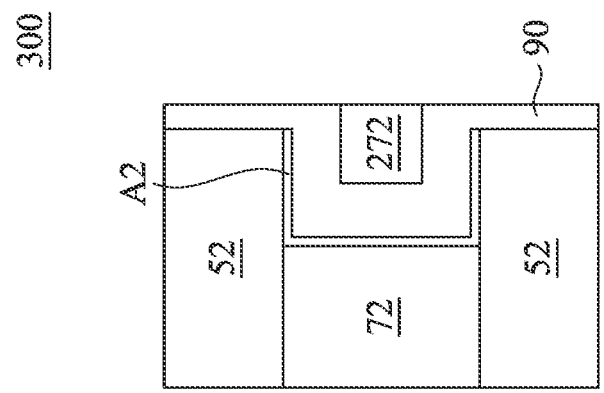
Figure 21G:
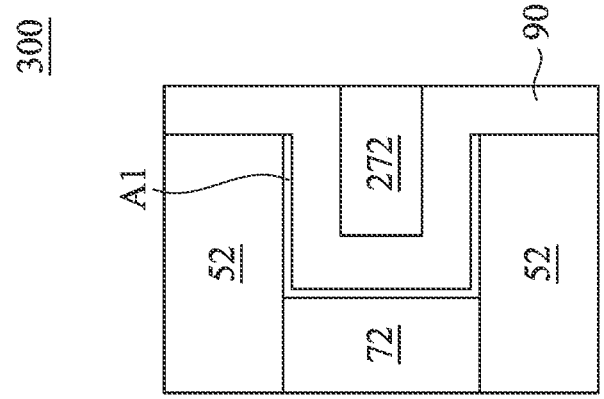

FIGS. 21G and 21H illustrate embodiments in which the memory film 90 has different outer surface areas (represented by regions A1 and A2 of FIGS. 21G and 21H). For example, the outer surface area may refer to a surface area of a surface of the memory film 90 between the dielectric layers 52 and opposite the conductive features 272. In some embodiments, controlling the size of the outer surface area of the memory film 90 relative to the area of a subsequently formed OS layer 92 (see below, FIG. 22) contacting the conductive features 272 may be useful for controlling memory properties such as memory window and operational voltage. For example, the ratio of the outer surface area of the memory film 90 to the area of the OS layer 92 in subsequently formed TFTs 204 (see FIG. 1A) may be in accordance with the windows between different states of memory of the TFTs 204. The ratio of the outer surface area of the memory film 90 to the area of the OS layer 92 may also be in accordance with the operational voltages of the TFTs 204.

The outer surface area of the memory film 90 may be formed to be relatively larger or smaller by recessing the conductive lines 72 to a specific depth (see above, FIGS. 18A-B) and by controlling the thickness of the memory film 90 (see above, FIGS. 19A-D). For example, FIG. 21G illustrates the memory film 90 having a first outer surface area A1 in a range of 1500 nm times a channel length L to 300 nm times the channel length L and FIG. 21H illustrates the memory film 90 having a second outer surface area A2 in a range of 30 nm times the channel length L to 150 nm times the channel length L. The memory film 90 having a first outer surface area A1 may be useful for having better uniformity. The memory film 90 having a second outer surface area A2 may be useful for imposing higher voltage on the memory film, which may improve efficiency of writing processes to the memory film.

Figure 22:
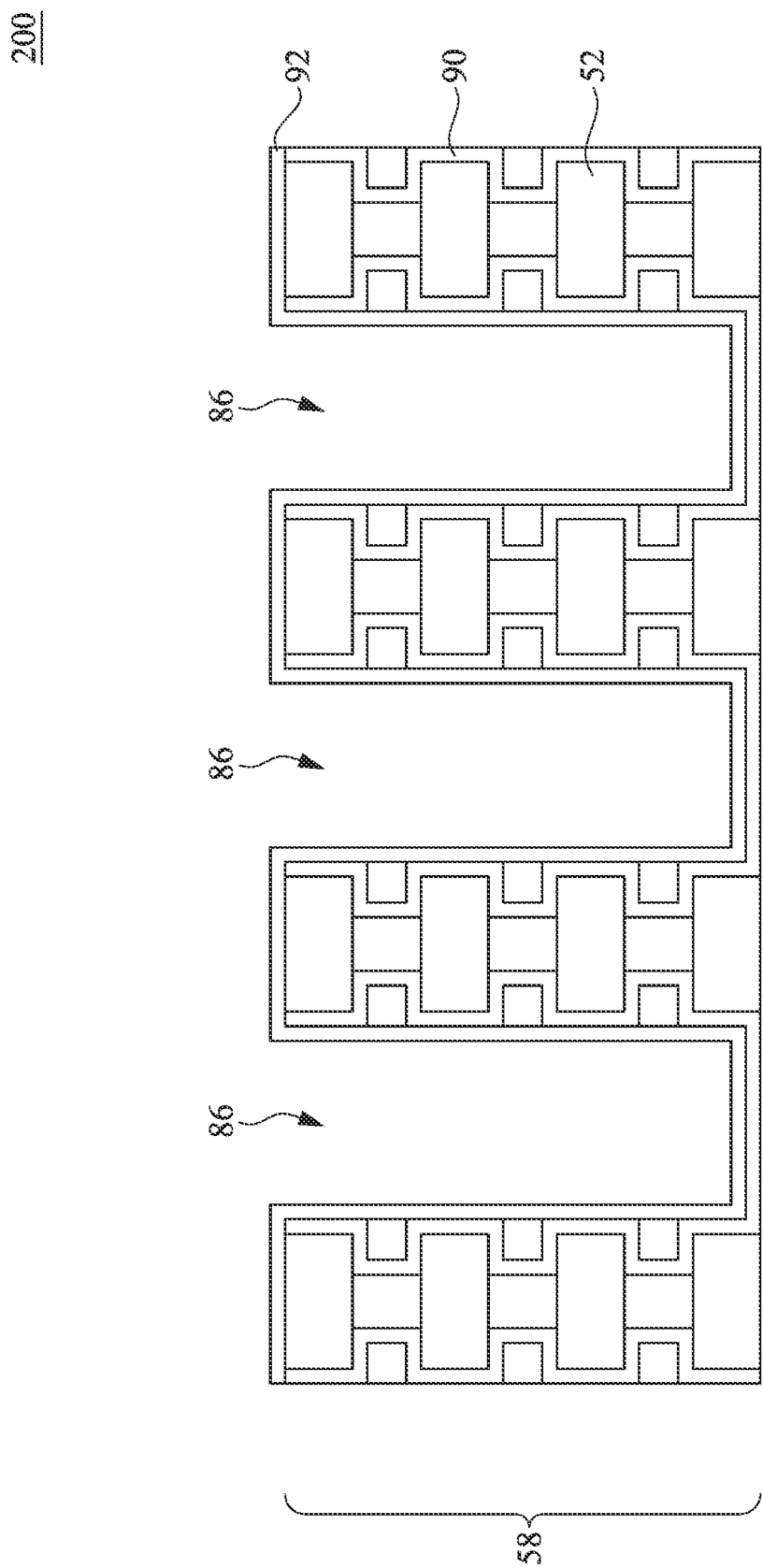

In FIG. 22, which follows from FIGS. 21A-B, the OS layer 92 is conformally deposited in the trenches 86 over the memory film 90. The OS layer 92 may cover top surfaces of the multi-layer stacks 58, such as e.g. top surfaces of the dielectric layers 52. The OS layer 92 comprises a material suitable for providing a channel region for a TFT (e.g., TFTs 204, see FIG. 1A). In some embodiments, the OS layer 92 comprises an indium-comprising material, such as $In_x Ga_y Zn_z MO$, where M may be Ti, Al, Ag, Si, Sn, or the like. X, Y, and Z may each be any value between 0 and 1. In other embodiments, a different semiconductor material may be used for the OS layer 92. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C. or in a range of about 300° C. to about 400° C.) in oxygen-related ambient may be performed to activate the charge carriers of the OS layer 92. All embodiments of the OS layer 92 described above may be applied to the following processes and structures subsequently described in FIGS. 23 through 31D.

Figure 23:
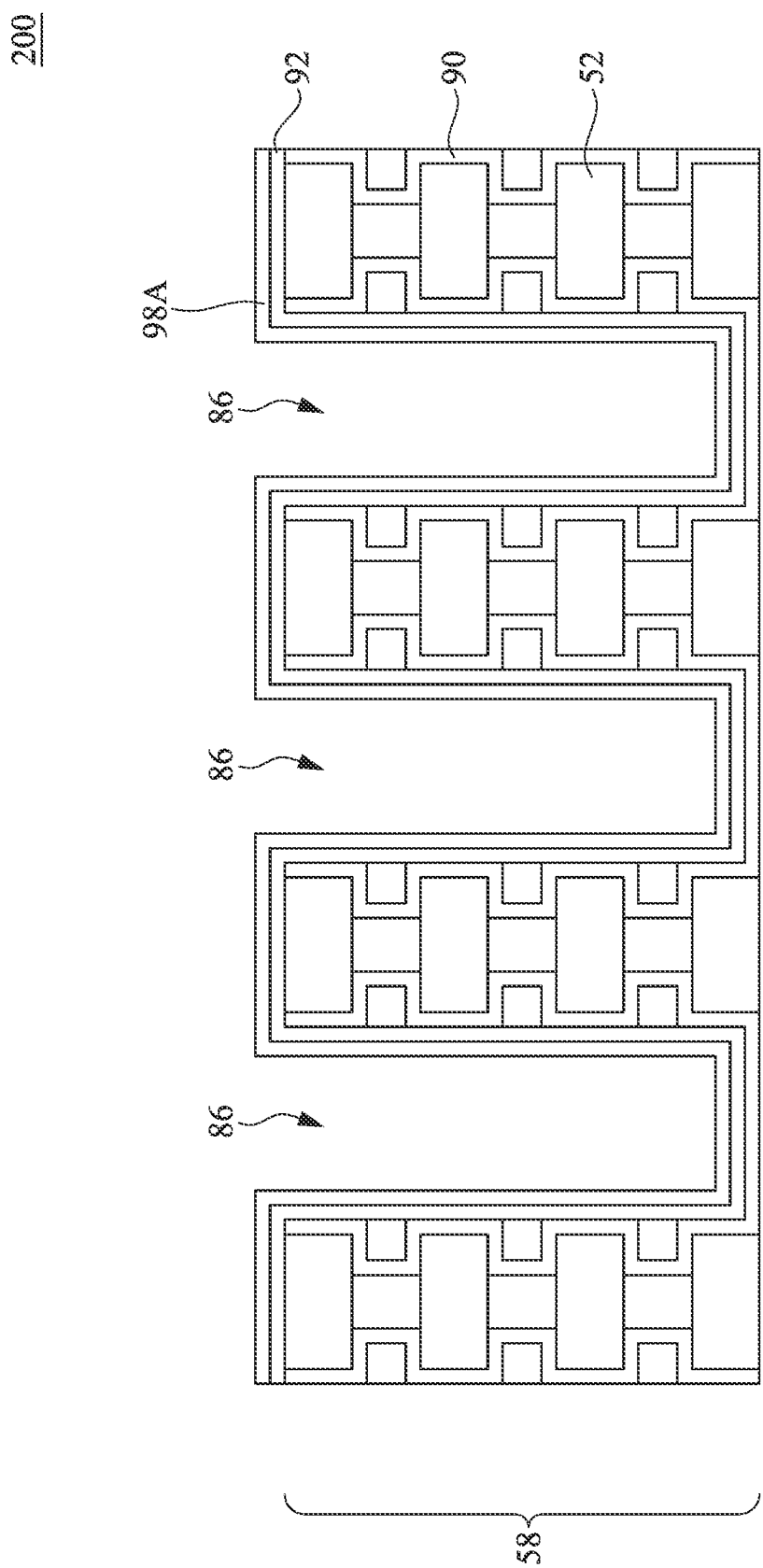

In FIG. 23, a dielectric layer 98A is deposited in the trenches 86 over the OS layer 92. The dielectric layer 98A may include, for example, silicon oxide, silicon nitride, silicon oxynitride, or the like, which may be deposited by CVD, PVD, ALD, PECVD, or the like. The dielectric layer 98A may extend along sidewalls and a bottom surface of the trenches 86 over the OS layer 92.

In FIG. 24, bottom portions of the dielectric layer 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 24, the dielectric layer 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the FE material 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIG. 25, an additional dielectric material 98B may be deposited to fill remaining portions of the trenches 86. The dielectric material 98B may have a same material composition and be formed using a like process as the dielectric layer 98A. The dielectric material 98B and the dielectric layer 98A may be referred to collectively as the dielectric material 98 herein after.

In FIGS. 26A and 26B, a removal process is then applied to the dielectric material 98, the OS layer 92, and the memory film 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that the top surface of the multi-layer stack 58 is level after the planarization process is complete. FIG. 26B illustrates a corresponding top-down view of the structure illustrated in FIG. 26A.

FIGS. 27A through 29C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. In FIGS. 27A through 29C, figures ending in "A" illustrate a top down view, figures ending in "B" illustrate a corresponding cross-sectional view parallel to line B-B' of FIGS. 1A and 27A, and figures ending in "C" illustrate a corresponding cross-sectional view parallel to line C-C' of FIGS. 1A and 27A.

Figure 27B:
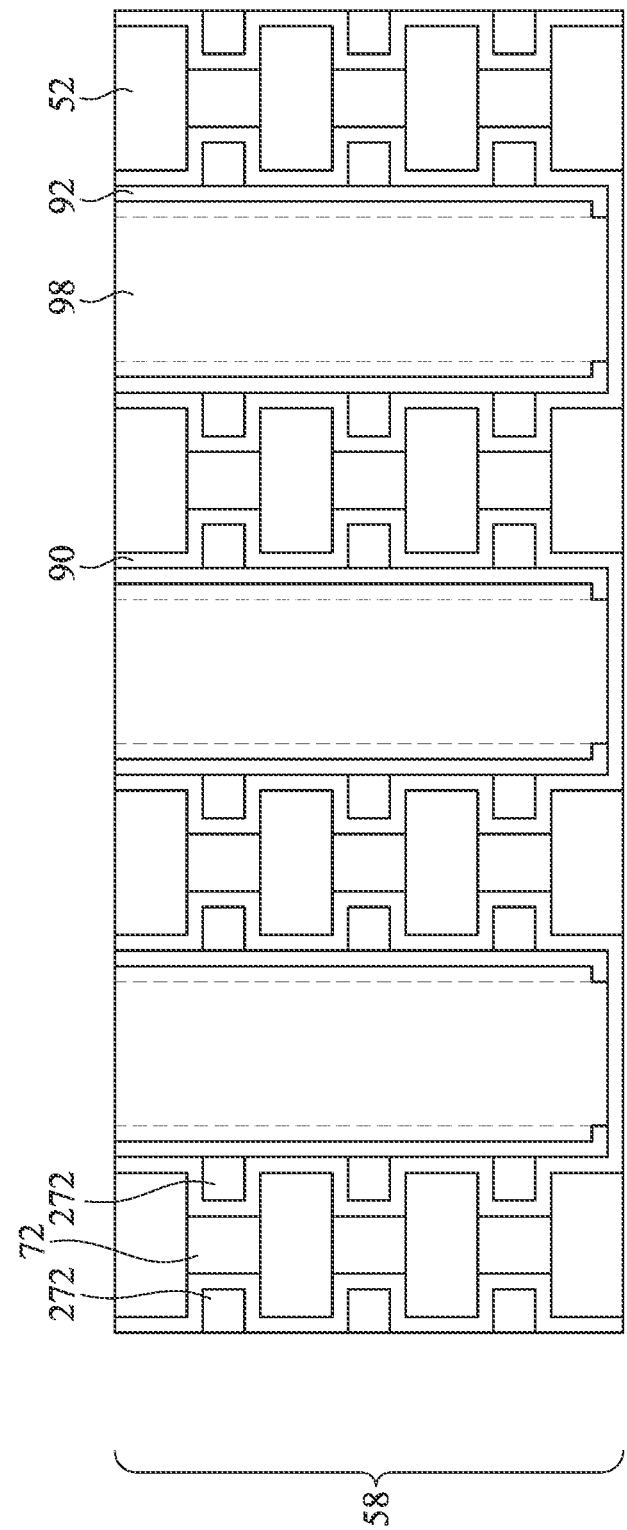
Figure 27C:
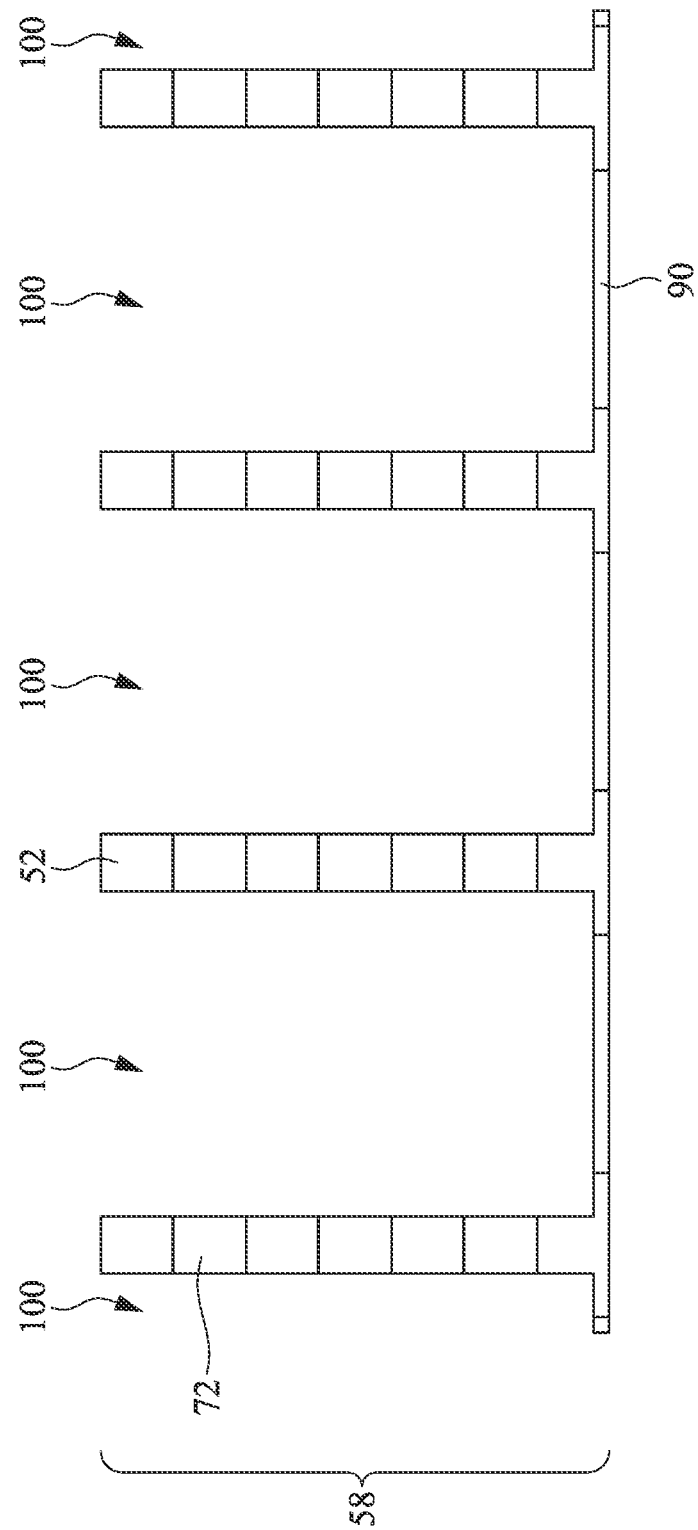

In FIGS. 27A, 27B, and 27C, trenches 100 are patterned through the OS layer 92 and the dielectric material 98 (including the dielectric material 98A and the dielectric material 98B). FIG. 27B illustrates a cross-section view of line B-B' in FIG. 27A, and FIG. 27C illustrates a cross-section view of line C-C' in FIG. 27A. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A). In some embodiments, the trenches 100 are patterned through the conductive features 272, the memory film 90, and portions of the dielectric layers 52 so that subsequently formed dielectric material 102 (see below, FIGS. 28A-C) electrically isolates subsequently formed conductive lines 106 and 108 (see below, FIGS. 29A-C). The trenches 100 are patterned to further remove portions of the memory film 90 and the conductive features 272, so that the conductive features 272 in different memory array stacks are physically separated and isolated from each other. In some embodiments, the trenches 100 are further patterned through the memory film 90 such that the trenches 100 are disposed between opposing sidewalls of the conductive lines 72.

Figure 28B:
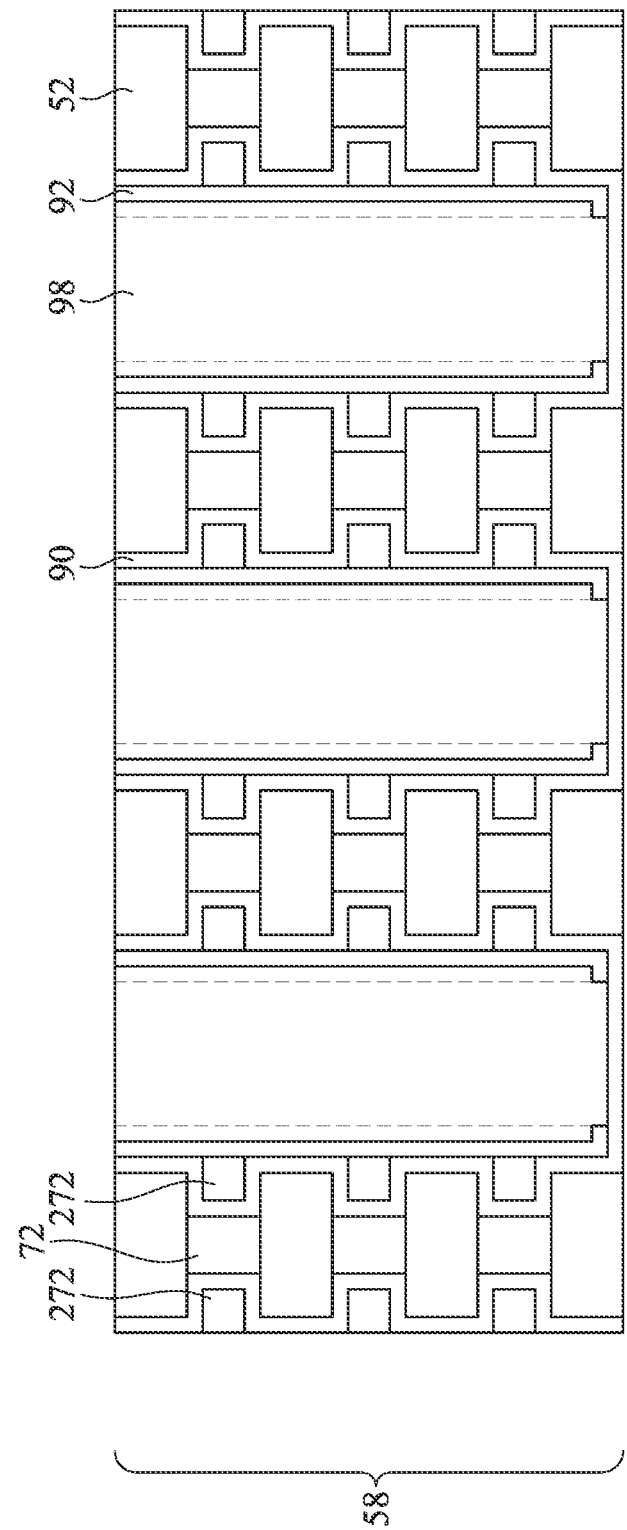
Figure 28C:
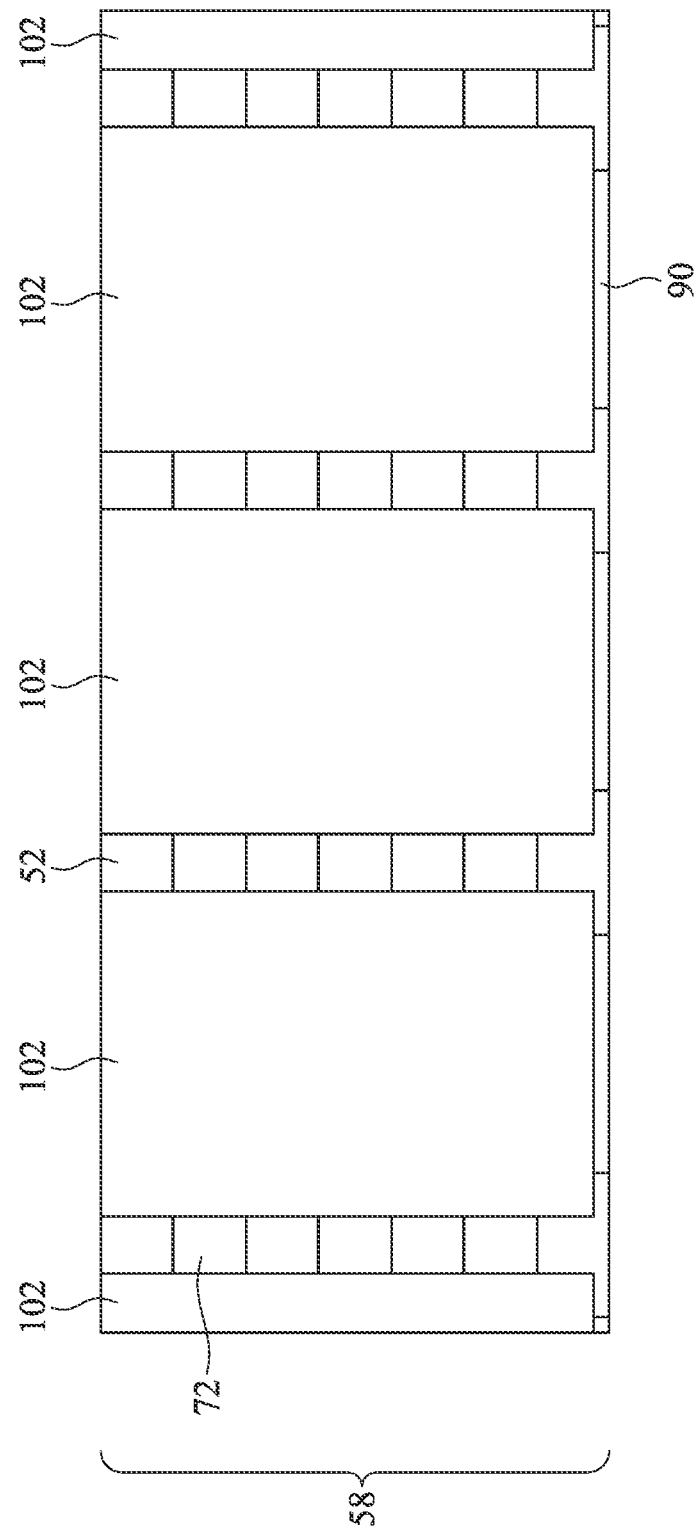

In FIGS. 28A, 28B, and 28C, a dielectric material 102 is deposited in and fills the trenches 100. FIG. 28B illustrates a cross-sectional view of line B-B' in FIG. 28A, and FIG. 28C illustrates a cross-sectional view of line C-C' in FIG. 28A. The dielectric material 102 may electrically isolate subsequently formed adjacent conductive lines 106 and 108 (see below, FIGS. 29A-C) from each other, and the dielectric material 102 may further electrically isolate portions of the conductive features 272 in different memory array stacks from each other by covering sidewalls of the conductive features 272. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92 and may cover opposing sidewalls of the memory film 90 and the OS layer 92. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 29A:
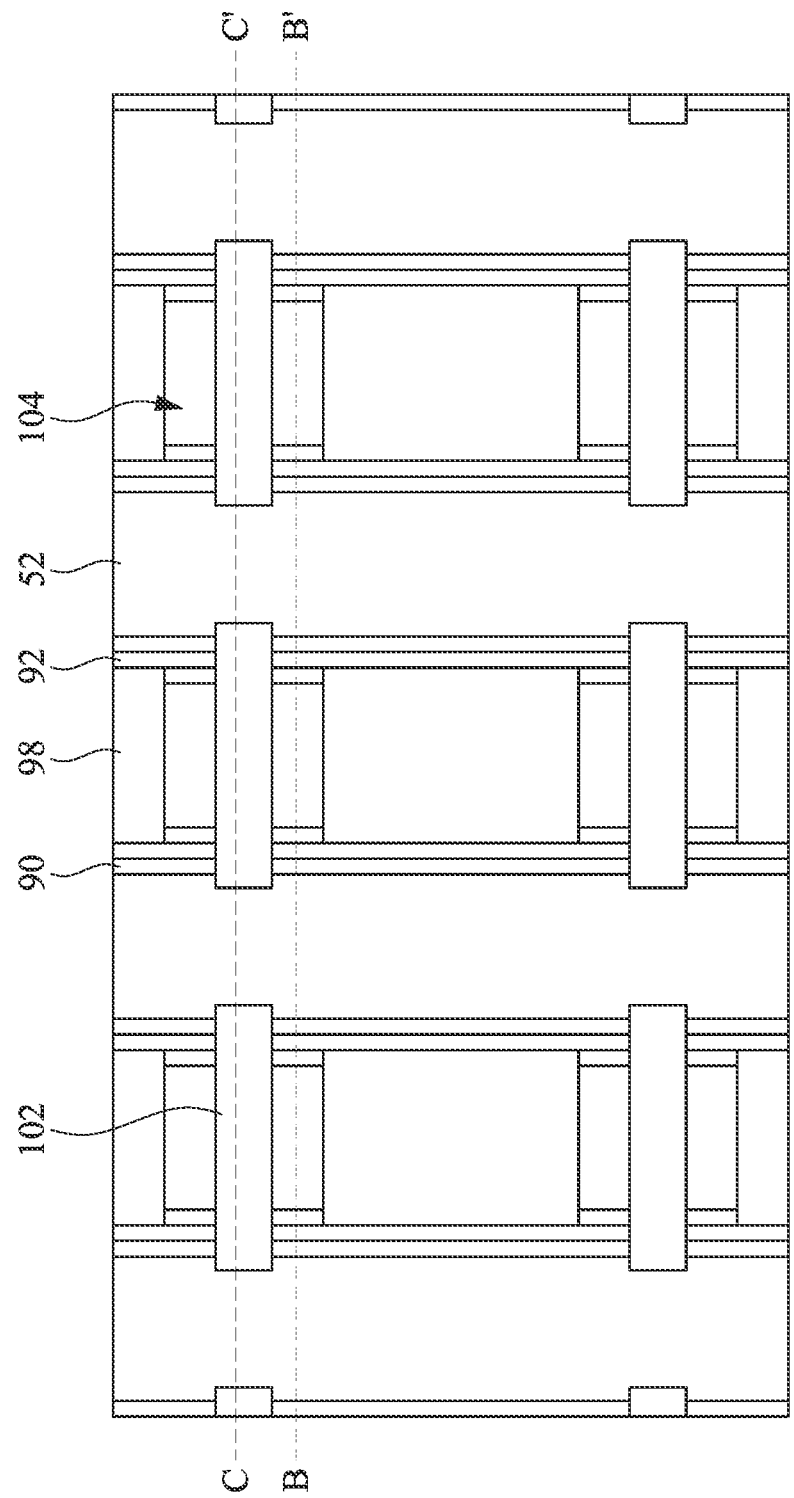
Figure 29B:
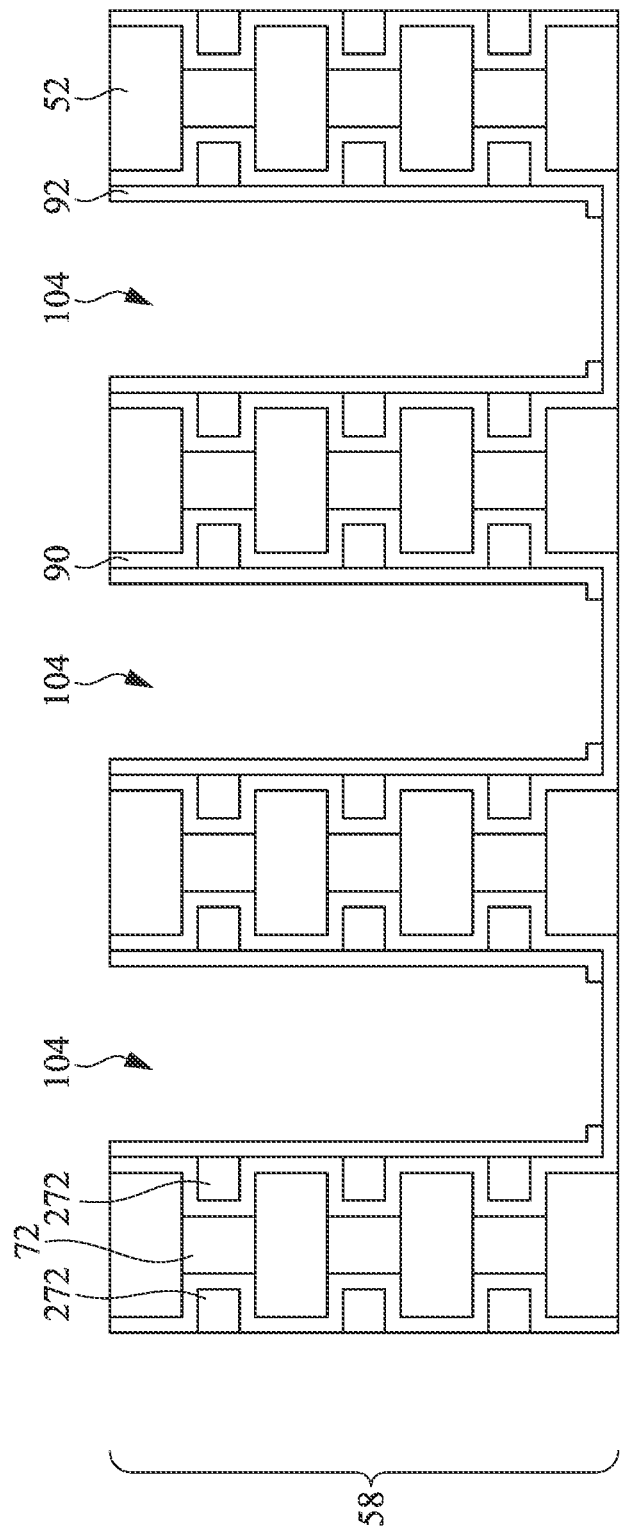
Figure 29C:
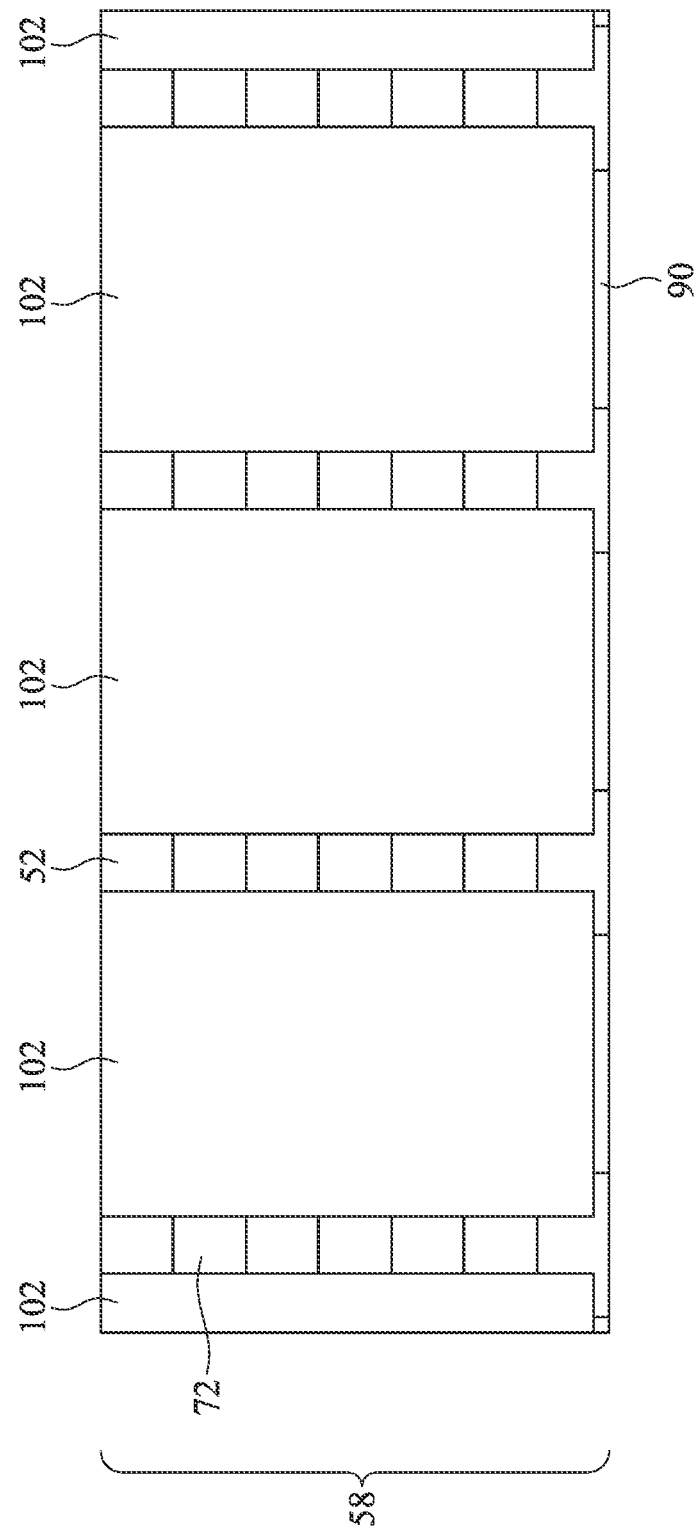

In FIGS. 29A, 29B, and 29C, trenches 104 are patterned for the conductive lines 106 and 108. FIG. 29B illustrates a cross-sectional view of line B-B' in FIG. 29A, and FIG. 29C illustrates a cross-sectional view of line C-C' in FIG. 29A. The trenches 104 are patterned by patterning the dielectric material 98 (including the dielectric material 98A and the dielectric material 98B) using a combination of photolithography and etching, for example.

For example, a photoresist (not illustrated) may be deposited over the multi-layer stack 58, the dielectric material 98, the dielectric material 102, the OS layer 92, and the memory film 90. The photoresist can be formed by using a spin-on technique, for example. The photoresist is patterned to define openings. Each of the openings may overlap a corresponding region of the dielectric material 102, and each of the openings may further partially expose two separate regions of the dielectric material 98. For example, each opening may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings may define a pattern of a conductive line 106 and an adjacent conductive line 108 that are separated by the dielectric material 102. The photoresists can be patterned using acceptable photolithography techniques. For example, the photoresist be exposed to light for patterning. After the exposure process, the photoresist may be developed to remove exposed or unexposed portions of the photoresist depending on whether a negative or positive resist is used, thereby defining a patterning of the form openings.

Subsequently, portions of the dielectric material 98 exposed by the openings may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings expose the dielectric material 102, the dielectric material 102 may not be significantly removed. A pattern of the trenches 104 may correspond to the conductive lines 106 and 108 (see below, FIGS. 30A and 30B). For example, a portion of the dielectric material 98 may remain between each pair of the trenches 104, and the dielectric material 102 may be disposed between adjacent pairs of the trenches 104. After the trenches 104 are patterned, the photoresist may be removed by ashing, for example.

Figure 30A:
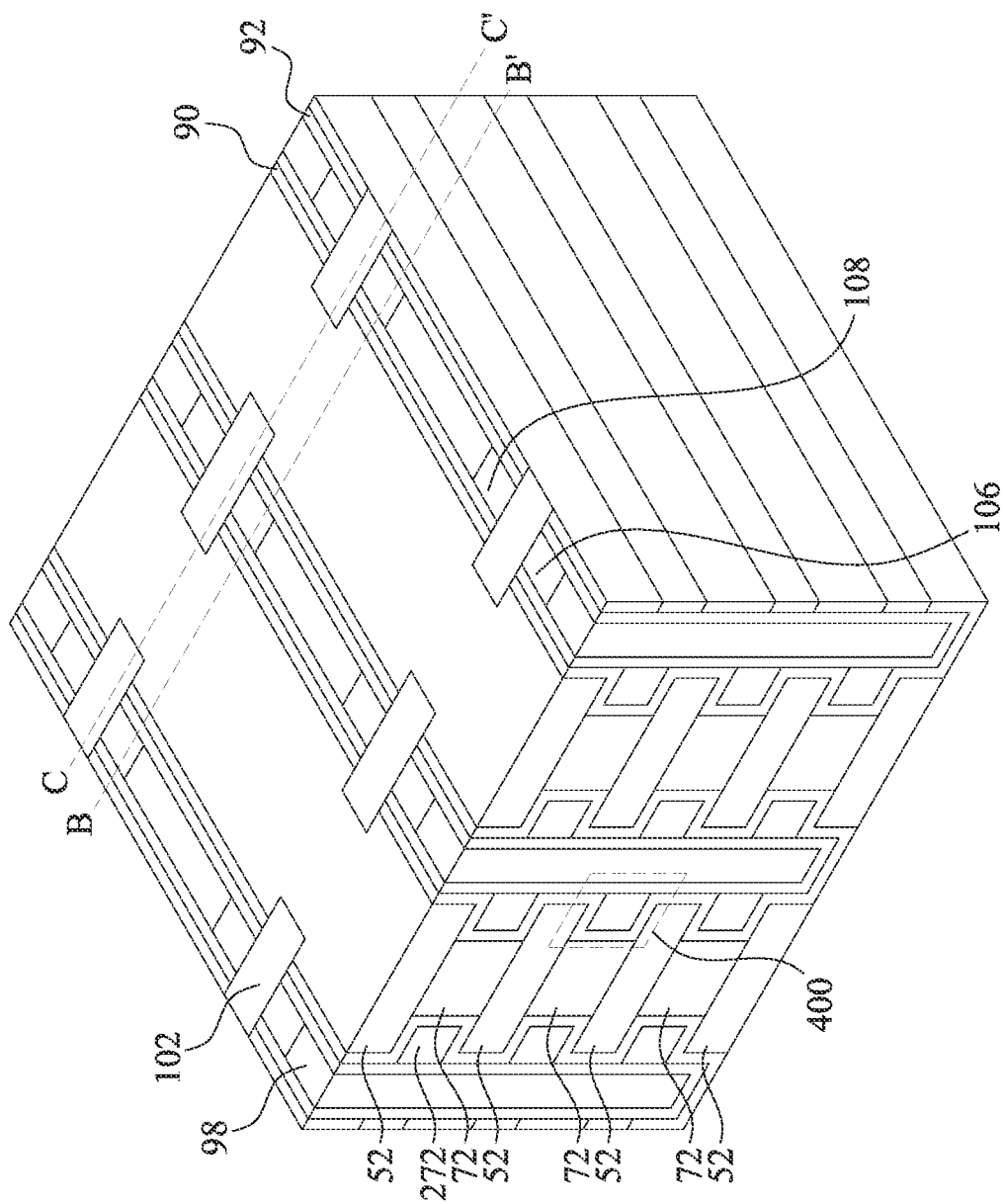
Figure 30B:
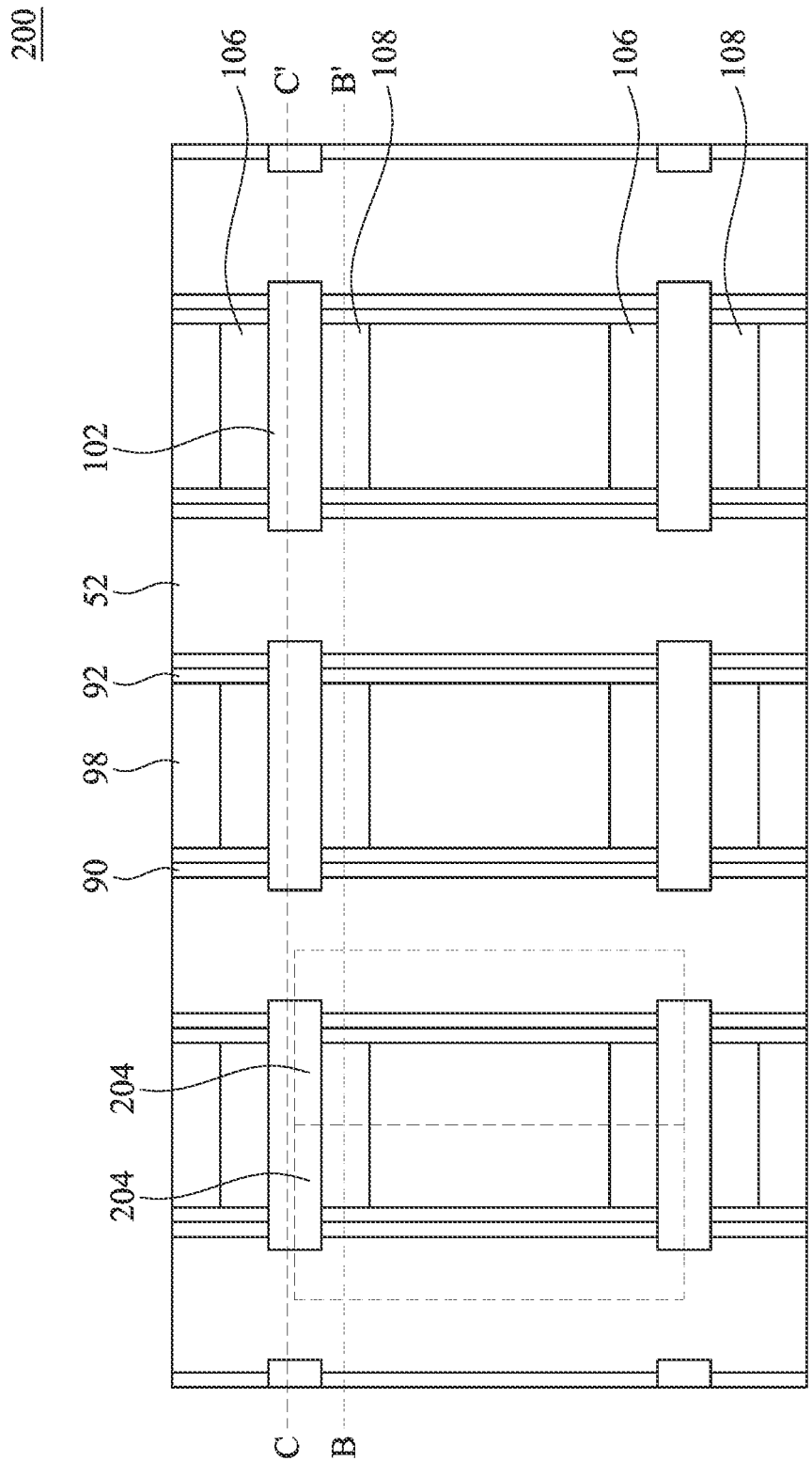
Figure 30C:
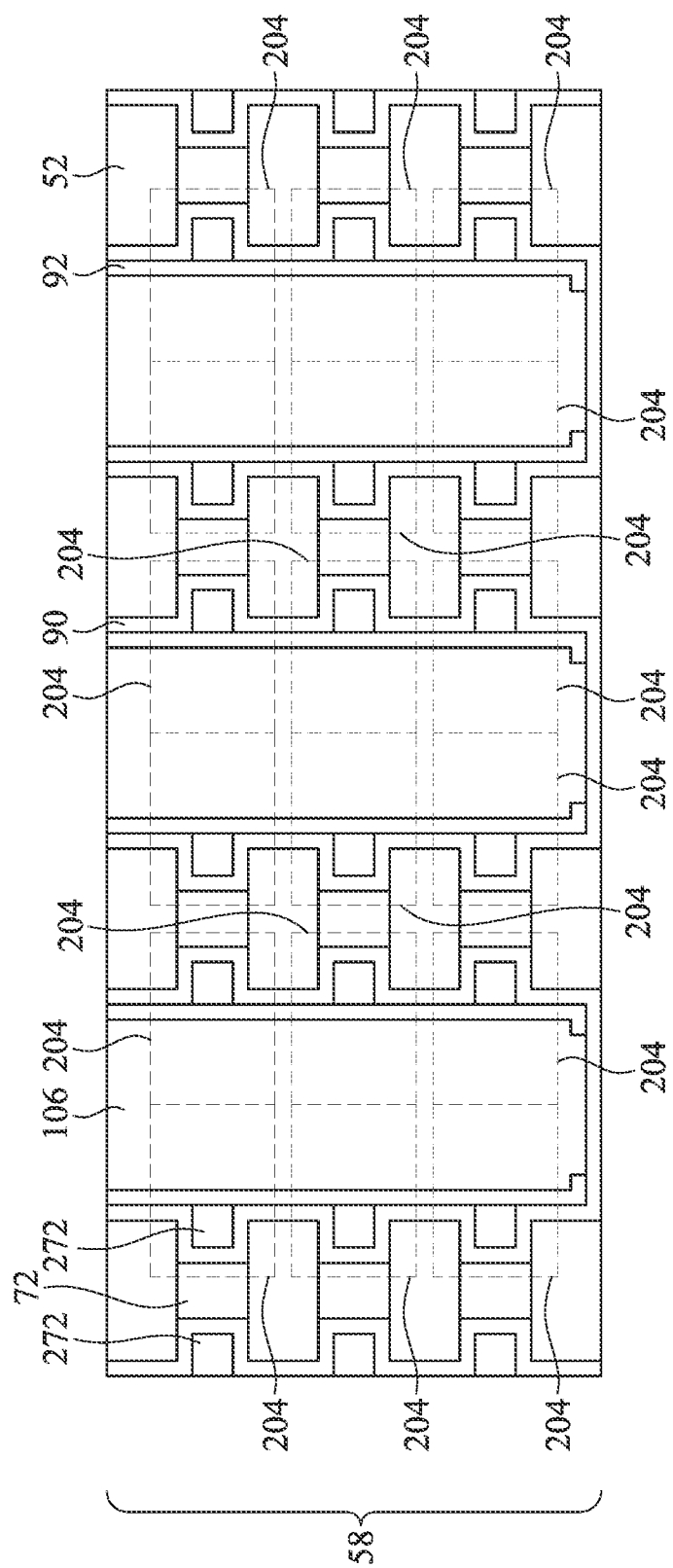
Figure 30D:
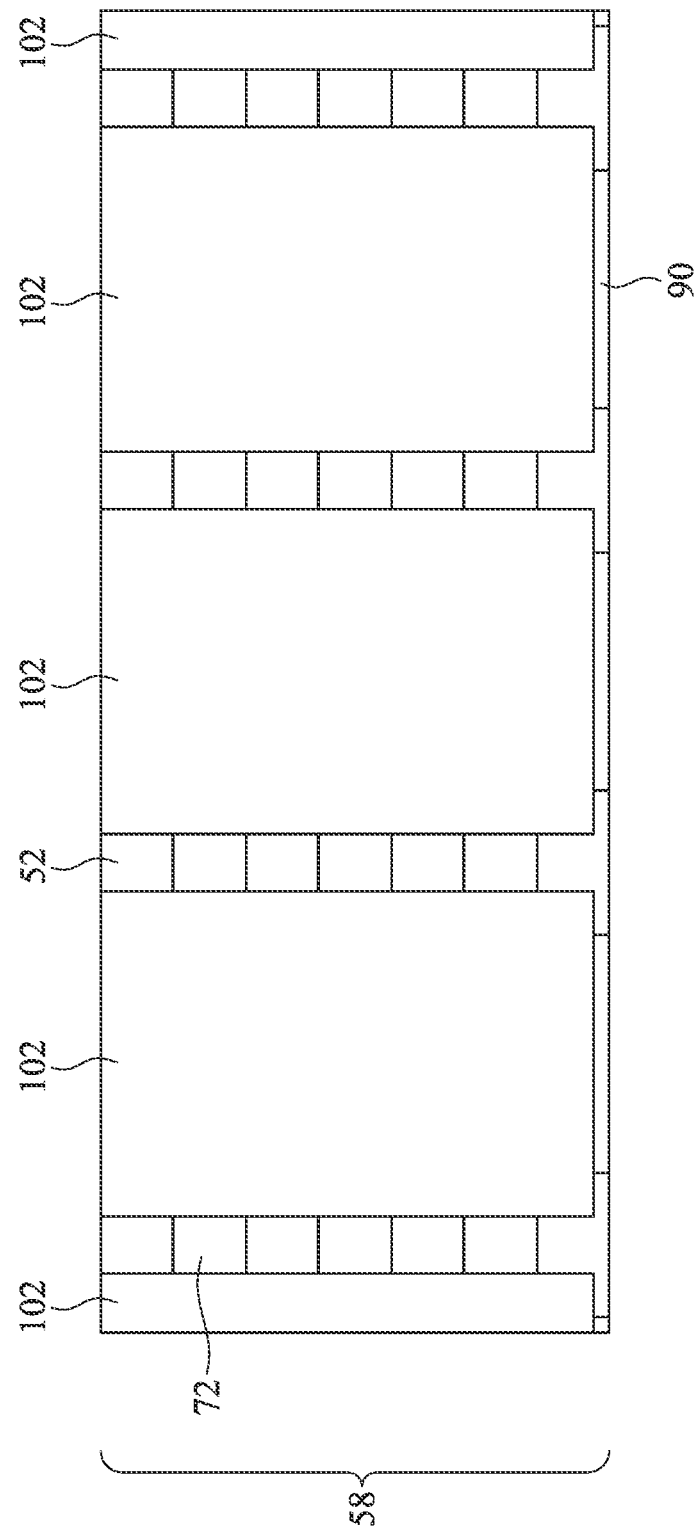

FIGS. 30A through 30E illustrate further intermediate steps of manufacturing the conductive lines 106 and 108 (e.g., source lines and bit lines) in the memory array 200. FIG. 30A illustrates a 3D view, FIG. 30B illustrates a top down view, FIG. 30C illustrates a corresponding cross-sectional view parallel to line B-B' of FIGS. 1A, 30A, and 30B, FIG. 30D illustrates a corresponding cross-sectional view parallel to line C-C' of FIGS. 1A, 30A, and 30B, and FIG. 30E illustrates a detailed cross-sectional view of region 400 illustrated in FIG. 30A.

In FIGS. 30A, 30B, and 30C the trenches 104 are filled with a conductive material to form the conductive lines 106 and 108. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multi-layer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 30C illustrates a cross-sectional view that only shows the conductive lines 106, a cross-sectional view of the conductive lines 108 may be similar.

Thus stacked TFTs 204 may be formed in the memory array 200. Each TFT 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns.

FIG. 30E illustrates a detailed cross-sectional view of region 400 illustrated in FIG. 30A, showing the conductive features 272 disposed between the memory film 90 and the OS layer 92. The conductive features 272 electrically connect the memory film 90 and the OS layer 92. In some embodiments, sidewalls of the conductive features 272 and the memory film 90 are covered by the OS layer 92 and the memory film 90 is interposed between the dielectric layers 52 and the OS layer 92. The conductive features 272 may form MFM capacitors in conjunction with the conductive lines 72 and the memory film 90 in embodiments where the memory film 90 comprises a ferroelectric material. The interface between the memory film 90 and the conductive features 272 may contain fewer defects than a corresponding interface between a ferroelectric memory film and an OS layer. Endurance of the TFTs 204 may be improved by the reduction of defects in the interface between the memory film 90 and the conductive features 272. Better charge screening for the memory film 90 may be provided by the conductive features 272, which may reduce the depolarization field and increase retention time of the TFTs 204.

Figure 30F:
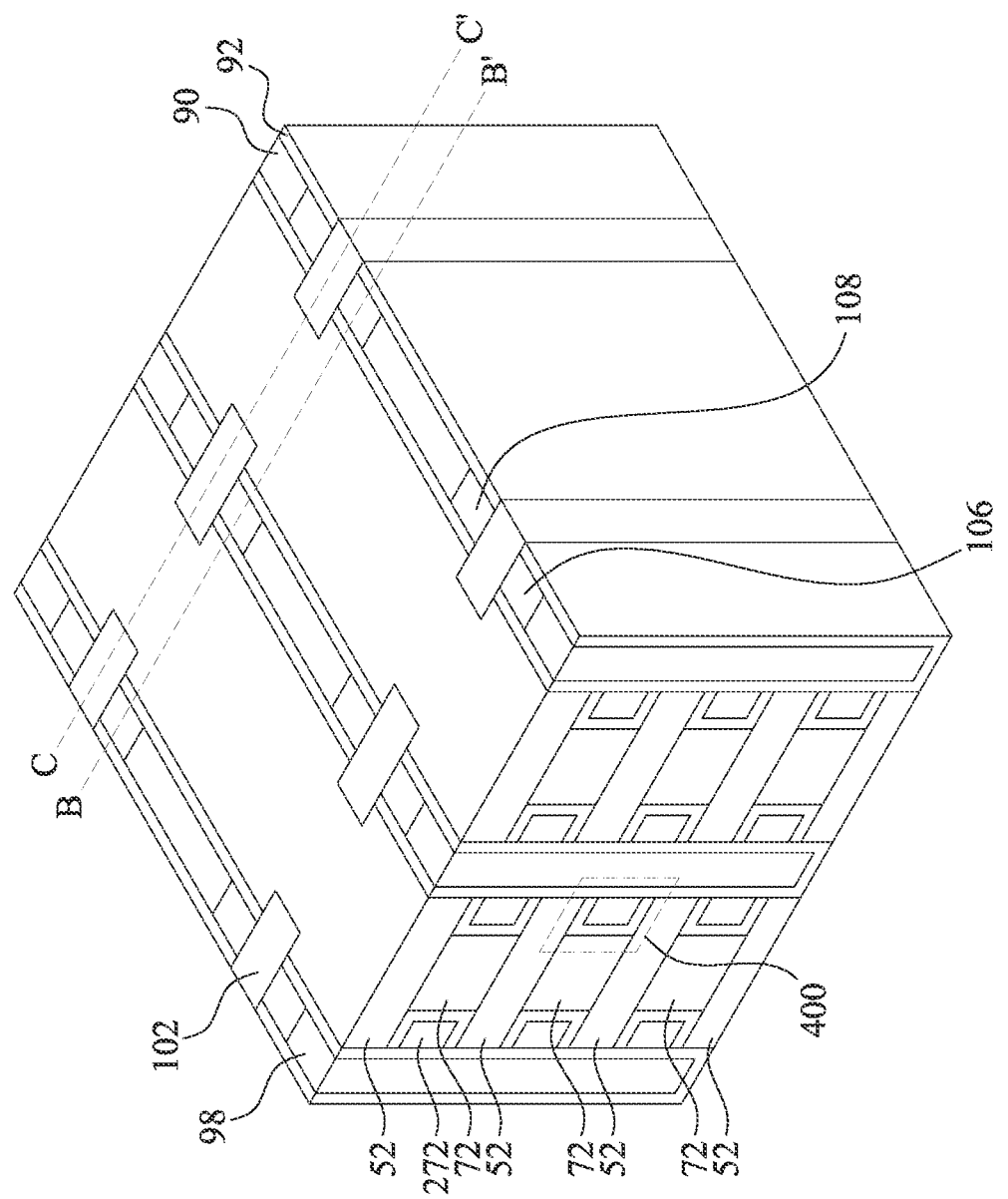
Figure 30G:
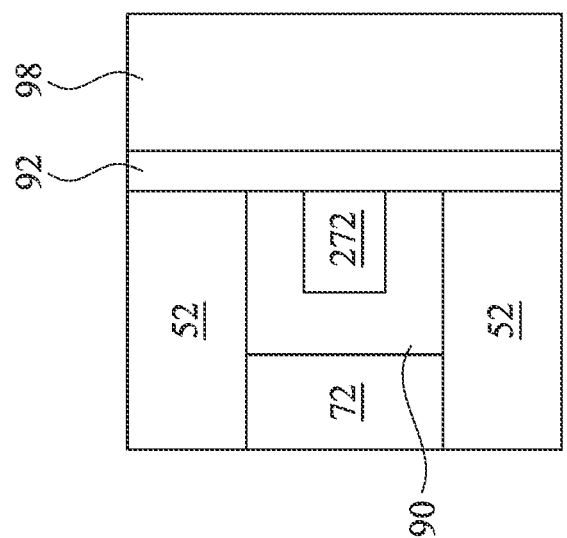

FIG. 30F illustrates a 3D view of a memory array 200 following from FIG. 21C and FIG. 30G illustrates a detailed cross-sectional view of region 400 illustrated in FIG. 30F, in accordance with some embodiments in which dummy areas of the memory film 90 along sidewalls of the dielectric layers 52 were removed. The removal of the dummy areas of the memory film 90 may decrease interference between TFTs 204 in adjacent layers. As illustrated in FIG. 30G, the OS layer 92 may cover sidewalls of the dielectric layers 52, the memory film 90, and the conductive features 272.

Figure 30H:
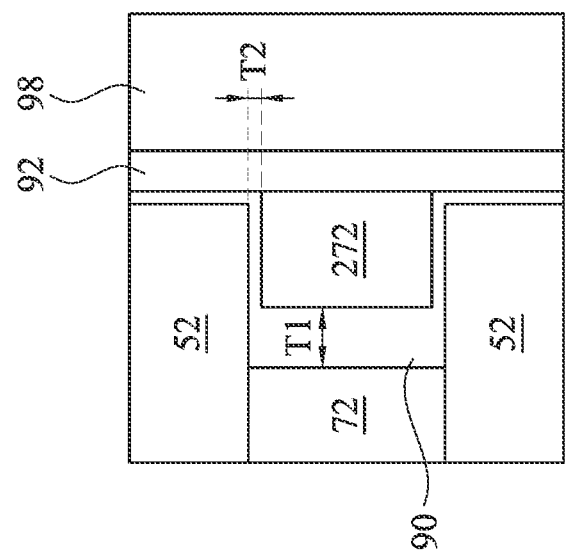
Figure 30I:
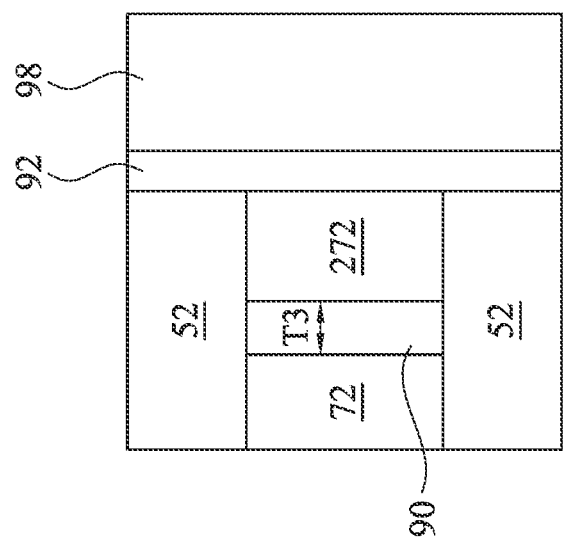

FIGS. 30H and 30I illustrate detailed cross-sectional view of region 400 illustrated in FIG. 30A following from FIGS. 21E and 21F, respectively, in accordance with some embodiments in which the memory film 90 has different thicknesses between the conductive lines 72 and the conductive features 272 and between the dielectric layers 52 and the conductive features 272. For example, FIG. 30H follows from FIG. 21E above and illustrates the memory film 90 having a first thickness T1 between the conductive lines 72 and the conductive features 272 and a second thickness T2 between the dielectric layers 52 and the conductive features 272, the first thickness T1 being greater than the second thickness T2.

FIG. 30I follows from FIG. 21F above and illustrates the memory film 90 having a third thickness T3 between the conductive lines 72 and the conductive features 272. In some embodiments in accordance with FIG. 30I, the conductive features 272 may physically contact the dielectric layers 52, and the OS layer 92 covers sidewalls of the conductive features 272 and the dielectric layers 52, and portions of the memory film 90 are surrounded by the conductive lines 72, the conductive features 272, and the dielectric layers 52 in a cross-sectional view.

Figure 31A:
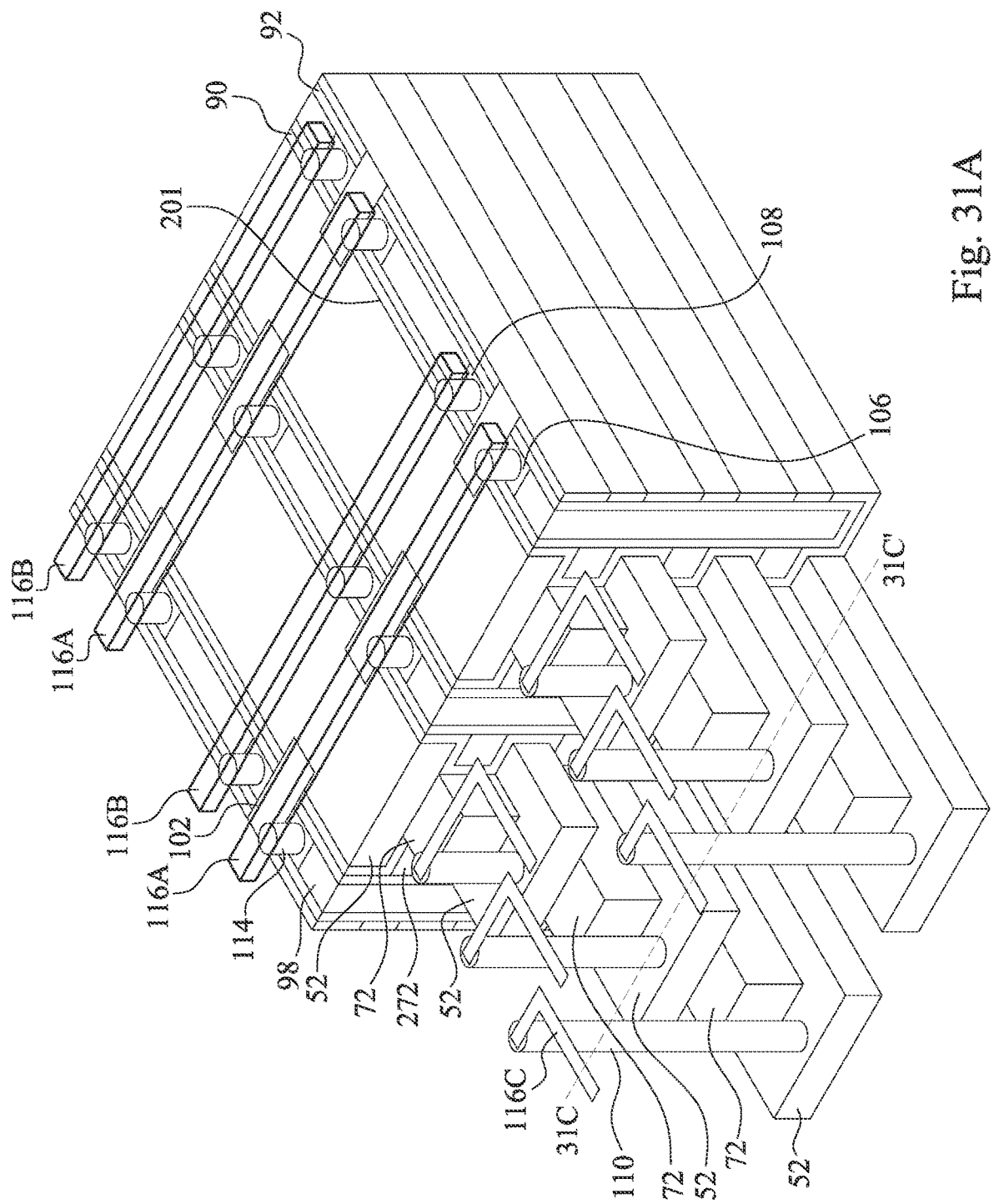
Figure 31B:
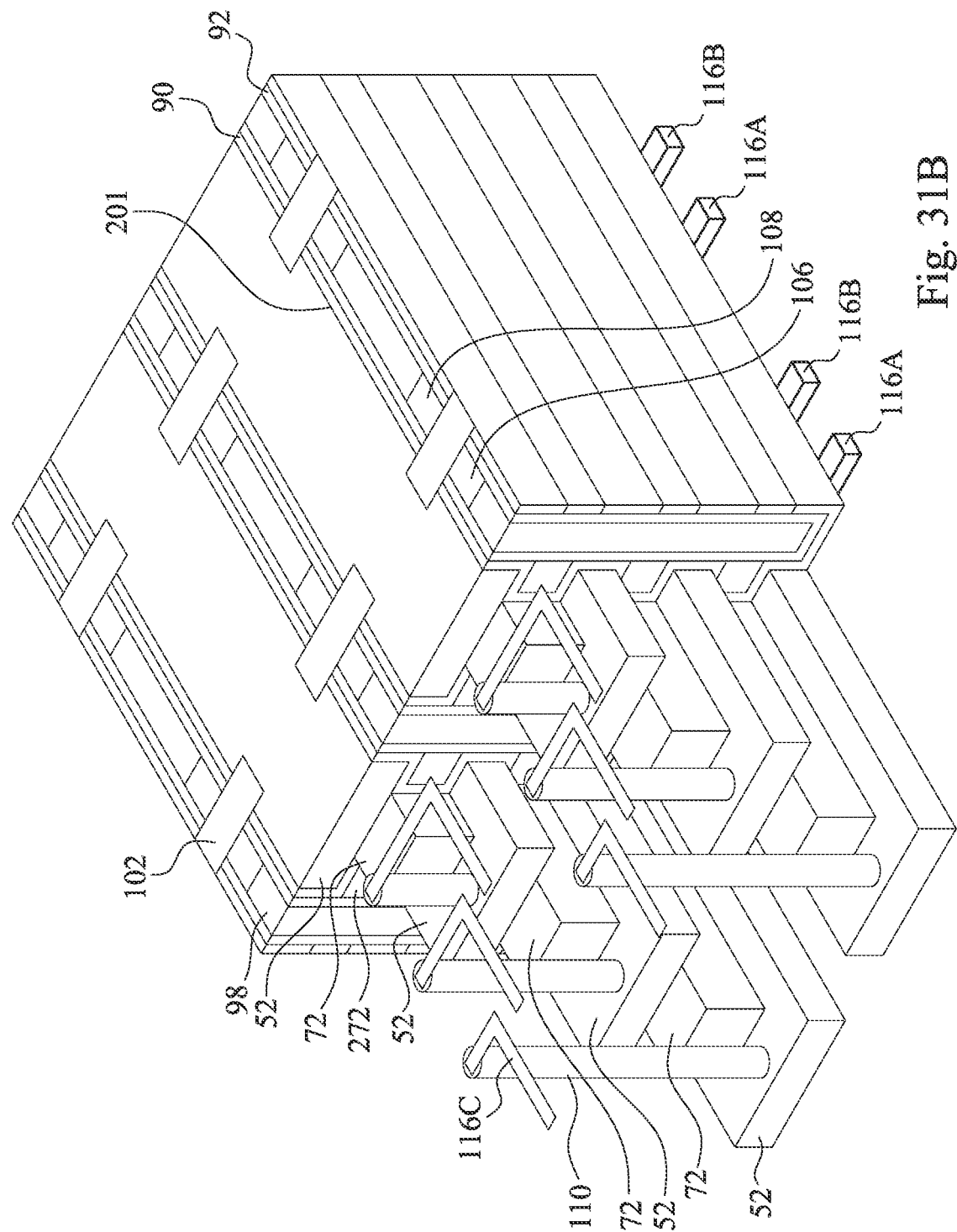
Figure 31C:
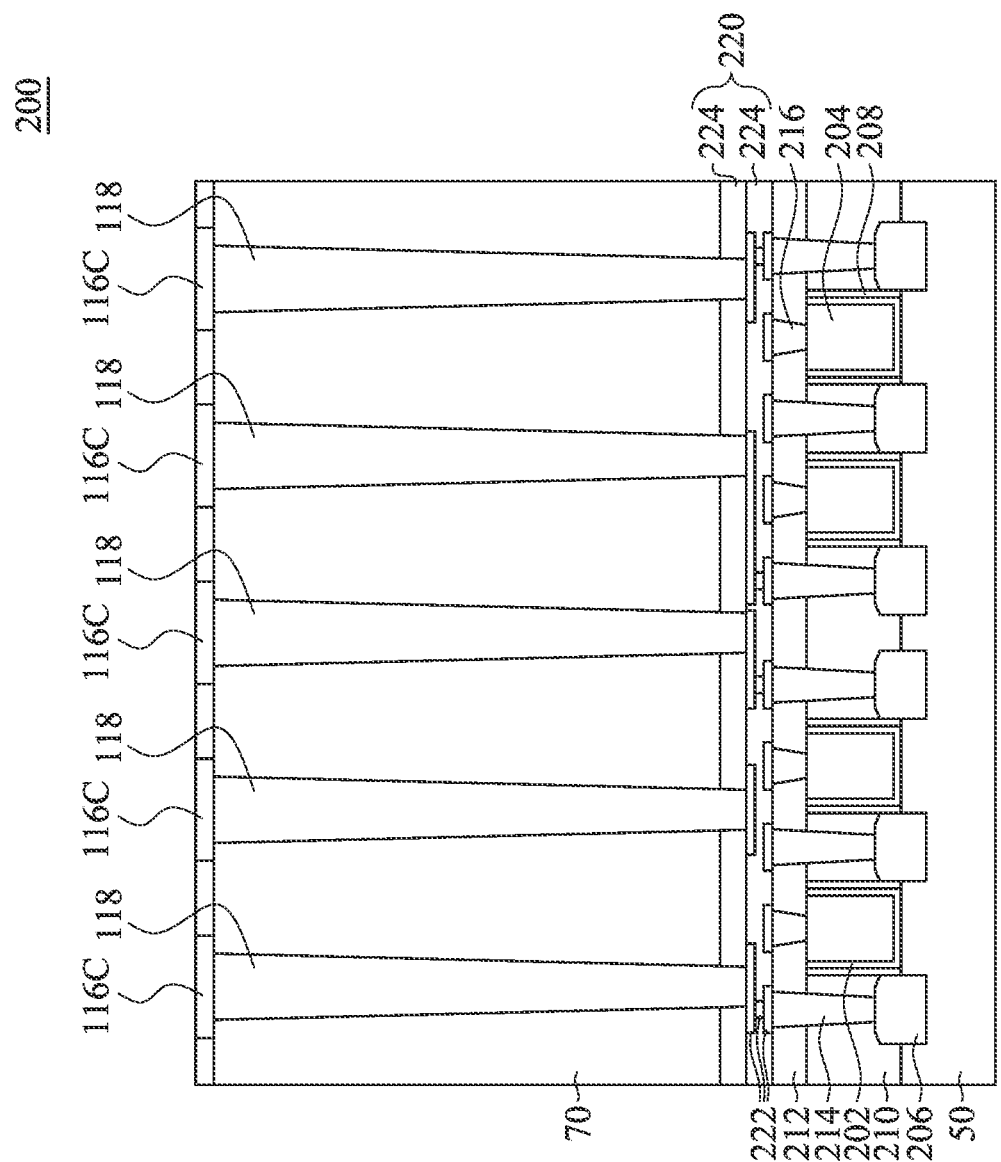
Figure 31D:
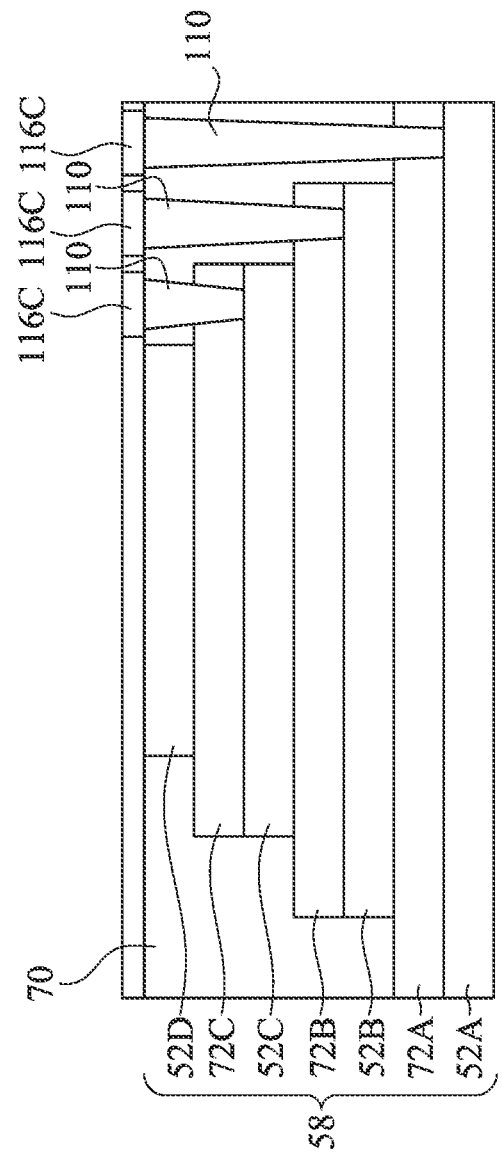

In FIGS. 31A, 31B, 31C, and 31D, contacts 110 are made to the conductive lines 72, the conductive lines 106, and the conductive lines 108. FIGS. 31A and 31B illustrate perspective views of embodiments of the memory array 200; FIG. 31C illustrates a cross-sectional view of the device and underlying substrate along the line 31C-31C' of FIG. 31A; and FIG. 31D illustrates a cross-sectional view of the device along line A-A' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective views of FIGS. 31A and 31B, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, in accordance with some embodiments, FIG. 31A illustrates conductive contacts 112 and 114 connecting top surfaces of the conductive lines 106 and 108 to conductive lines 116A and 116B located above the memory array 200. In accordance with other embodiments, FIG. 31B illustrates bottom surfaces of the conductive lines 106 and 108 connected to conductive lines 116A and 116B located below the memory array 200 by conductive contacts 112 and 114 (not illustrated). Additionally, conductive vias 118 may extend through the IMD 70 to electrically connect conductive lines 116C to the underlying circuitry of the interconnect structure 220 and the active devices on the substrate 50 as illustrated by FIG. 31C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Various embodiments provide a 3D memory array with vertically stacked memory cells. The memory cells each comprise a TFT with a conductive line, a memory film, an oxide semiconductor channel region, and a conductive feature between the memory film and the oxide semiconductor channel region. The conductive features between the channel regions and the memory film may be useful in forming Metal-Ferro-Metal (MFM) capacitors in conjunction with the conductive lines and the memory film. The interface between the memory film and the conductive features may have better quality due to containing fewer defects than an interface between a ferroelectric memory film and a semiconductor material. The reduction of defects in the interface between the memory film and the conductive features may improve the endurance of the TFTs. The conductive features may provide better charge screening for the memory film, which may reduce the depolarization field and increase retention time of the TFTs. Removal of dummy areas of the memory film may decrease interference between TFTs in adjacent layers.

In accordance with an embodiment, a memory cell includes: a thin film transistor over a semiconductor substrate, the thin film transistor including a memory film contacting a word line, an oxide semiconductor (OS) layer contacting a source line and a bit line, wherein the memory film is disposed between the OS layer and the word line, and a conductive feature interposed between the memory film and the OS layer; and a dielectric material covering sidewalls of the source line, the memory film, and the OS layer. In an embodiment, the memory film covers a top surface of the conductive feature. In an embodiment, the memory film further covers a first sidewall and a bottom surface of the conductive feature, and wherein a second sidewall of the conductive feature opposite the first sidewall is covered by the OS layer. In an embodiment, the memory film has a first thickness measured across a first portion of the memory film covering the top surface of the conductive feature, the memory film has a second thickness measured across a second portion of the memory film interposed between the conductive feature and the word line, and the first thickness is less than the second thickness. In an embodiment, the memory cell further includes a dielectric layer contacting the word line and the memory film. In an embodiment, the dielectric layer covers a surface of the conductive feature. In an embodiment, the OS layer covers a sidewall of the dielectric layer. In an embodiment, a top surface of the conductive feature contacts a bottom surface of the dielectric layer. In an embodiment, the dielectric material covers a sidewall of the conductive feature.

In accordance with another embodiment, a device includes: a semiconductor substrate; a first memory cell over the semiconductor substrate, the first memory cell including a first thin film transistor, wherein the first thin film transistor includes a gate electrode provided by a portion of a first word line, a first portion of a ferroelectric material, a first sidewall of the first portion of the ferroelectric material contacting the gate electrode, a first conductive feature on a second sidewall of the first portion of the ferroelectric material, the second sidewall being opposite the first sidewall, and an oxide semiconductor (OS) layer including a first channel region, the first channel region being on a sidewall of the first conductive feature; a source line, wherein a first portion of the source line provides a first source/drain electrode for the first thin film transistor; a bit line, wherein a first portion of the bit line provides a second source/drain electrode for the first thin film transistor; a first dielectric material extending across sidewalls of the bit line, the first portion of the ferroelectric material, and the OS layer; and a second memory cell over the first memory cell. In an embodiment, a second portion of the ferroelectric material physically contacts the first channel region. In an embodiment, the device further includes a second dielectric material interposed between the first memory cell and the second memory cell. In an embodiment, the second portion of the ferroelectric material is interposed between the OS layer and the second dielectric material. In an embodiment, the second dielectric material physically contacts the OS layer. In an embodiment, the first conductive feature physically contacts the second dielectric material. In an embodiment, the first conductive feature is surrounded by the ferroelectric material and the OS layer in a cross-section view.

In accordance with yet another embodiment, a method includes: forming a multi-layer stack on a semiconductor substrate, the multi-layer stack including alternating conductive layers and dielectric layers, wherein a first trench extends through the multi-layer stack; recessing the conductive layers from sidewalls of the dielectric layers to form first recesses connected to the first trench; depositing a memory film in the first trench and the first recesses, the memory film covering sidewalls of the conductive layers in the first recesses; forming conductive features, wherein forming the conductive features includes filling remaining portions of the first recesses with a conductive material; and depositing an oxide semiconductor (OS) layer over the conductive features and the memory film, the OS layer extending along the sidewalls and the bottom surface of the first trench. In an embodiment, forming the conductive features includes: depositing the conductive material over the memory film, the conductive material filling the remaining portions of the first recesses; and removing a portion of the conductive material along the memory film opposite sidewalls of the dielectric layers with an etch back. In an embodiment, the method further includes removing portions of the memory film along sidewalls of the dielectric layers. In an embodiment, the method further includes: forming a second trench through the conductive features and the dielectric layers; and depositing a dielectric material to fill the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
    a thin film transistor over a semiconductor substrate, the thin film transistor comprising:
        a memory film contacting a word line;
        an oxide semiconductor (OS) layer contacting a source line and a bit line, wherein the memory film is disposed between the OS layer and the word line, wherein the memory film is in direct contact with the OS layer; and
        a conductive feature interposed between the memory film and the OS layer; and
    a dielectric material covering sidewalls of the source line, the memory film, and the OS layer.

2. The memory cell of claim 1, wherein the memory film covers a top surface of the conductive feature.

3. The memory cell of claim 2, wherein the memory film further covers a first sidewall and a bottom surface of the conductive feature, and wherein a second sidewall of the conductive feature opposite the first sidewall is covered by the OS layer.

4. The memory cell of claim 2, wherein the memory film has a first thickness measured across a first portion of the memory film covering the top surface of the conductive feature, the memory film has a second thickness measured across a second portion of the memory film interposed between the conductive feature and the word line, and the first thickness is less than the second thickness.

5. The memory cell of claim 1, further comprising a dielectric layer contacting the word line and the memory film.

6. The memory cell of claim 5, wherein the dielectric layer covers a surface of the dielectric material.

7. The memory cell of claim 5, wherein the OS layer covers a sidewall of the dielectric layer.

8. The memory cell of claim 1, wherein the dielectric material covers a sidewall of the conductive feature.

9. A device comprising:
    a semiconductor substrate;
    a first memory cell over the semiconductor substrate, the first memory cell comprising a first thin film transistor, wherein the first thin film transistor comprises:
        a gate electrode provided by a portion of a first word line;
        a first portion of a ferroelectric material, a first sidewall of the first portion of the ferroelectric material contacting the gate electrode;
        a first conductive feature on a second sidewall of the first portion of the ferroelectric material, the second sidewall being opposite the first sidewall; and
        an oxide semiconductor (OS) layer comprising a first channel region, the first channel region being on a sidewall of the first conductive feature;
    a source line, wherein a first portion of the source line provides a first source/drain electrode for the first thin film transistor;
    a bit line, wherein a first portion of the bit line provides a second source/drain electrode for the first thin film transistor;
    a first dielectric material extending across sidewalls of the bit line, the first portion of the ferroelectric material, and the OS layer;
    a second memory cell over the first memory cell; and
    a second dielectric material interposed between the first memory cell and the second memory cell, wherein the first conductive feature is separated from the second dielectric material by the ferroelectric material.

10. The device of claim 9, wherein a second portion of the ferroelectric material directly contacts the first channel region.

11. The device of claim 10, wherein the second portion of the ferroelectric material is interposed between the OS layer and the second dielectric material.

12. The device of claim 9, wherein the second dielectric material directly contacts the OS layer.

13. The device of claim 9, wherein the gate electrode directly contacts the second dielectric material.

14. The device of claim 9, wherein the first conductive feature is surrounded by the ferroelectric material and the OS layer in a cross-section view.

15. A method comprising:
forming a multi-layer stack on a semiconductor substrate, the multi-layer stack comprising alternating conductive layers and dielectric layers, wherein a first trench extends through the multi-layer stack;
recessing the conductive layers from sidewalls of the dielectric layers to form first recesses connected to the first trench;
depositing a memory film in the first trench and the first recesses, the memory film covering sidewalls of the conductive layers in the first recesses;
forming conductive features, wherein forming the conductive features comprises filling remaining portions of the first recesses with a conductive material;
depositing an oxide semiconductor (OS) layer over the conductive features and the memory film, the OS layer extending along sidewalls and a bottom surface of the first trench; and
forming a second trench through the conductive features and the dielectric layers; and
depositing a dielectric material to fill the second trench.

16. The method of claim 15, wherein forming the conductive features comprises:
depositing the conductive material over the memory film, the conductive material filling the remaining portions of the first recesses; and
removing a portion of the conductive material along the memory film opposite sidewalls of the dielectric layers with an etch back.

17. The method of claim 16, further comprising removing portions of the memory film along sidewalls of the dielectric layers.

18. The memory cell of claim 5, wherein the dielectric layer is separated from the conductive feature by the memory film.

19. The device of claim 9, wherein the first conductive feature is separated from the gate electrode by a third portion of the ferroelectric material with a first thickness, wherein the first conductive feature is separated from the second dielectric material by a fourth portion of the ferroelectric material with a second thickness, and wherein the first thickness is larger than the second thickness.

20. The method of claim 15, wherein the dielectric layers are separated from the conductive features by the memory film.

* * * * *